(12) United States Patent
Cherian

(10) Patent No.: US 9,761,786 B2
(45) Date of Patent: Sep. 12, 2017

(54) PIEZO ELECTRIC EFFECT POWER

(76) Inventor: Gabe Cherian, Sun Valley, ID (US)

( * ) Notice: Subject to any disclaimer, the term of this patent is extended or adjusted under 35 U.S.C. 154(b) by 1228 days.

(21) Appl. No.: 13/297,252

(22) Filed: Nov. 15, 2011

(65) Prior Publication Data

US 2012/0286625 A1 Nov. 15, 2012

Related U.S. Application Data

(60) Provisional application No. 61/458,036, filed on Nov. 16, 2010.

(51) Int. Cl.
*H01L 41/113* (2006.01)
*H02N 2/18* (2006.01)

(52) U.S. Cl.
CPC .............. *H01L 41/113* (2013.01); *H02N 2/18* (2013.01); *H02N 2/181* (2013.01); *H02N 2/186* (2013.01)

(58) Field of Classification Search
CPC ............... H01L 41/113; H01L 41/1132; H01L 41/1134; H01L 41/1136; H01L 41/1138; H02N 2/18
USPC ......................................... 310/339
See application file for complete search history.

(56) References Cited

U.S. PATENT DOCUMENTS

| | | | |
|---|---|---|---|
| 2007/0145861 A1* | 6/2007 | Tanner ......................... | 310/339 |
| 2010/0141096 A1* | 6/2010 | Churchill et al. ............ | 310/339 |
| 2010/0164231 A1* | 7/2010 | Tsou ............................ | 310/339 |
| 2011/0156532 A1* | 6/2011 | Churchill et al. ............ | 310/339 |
| 2011/0278990 A1* | 11/2011 | Knowles et al. ............. | 310/339 |

* cited by examiner

*Primary Examiner* — Derek Rosenau

(57) ABSTRACT

A number of devices are described which can be used to generate electric power from the action of wind or other sources of vibration. The devices comprise Piezo electric materials, which are built into the devices in a way that can capture the generated electric power, and can conduct it to storage devices. Several embodiments are described.

21 Claims, 57 Drawing Sheets

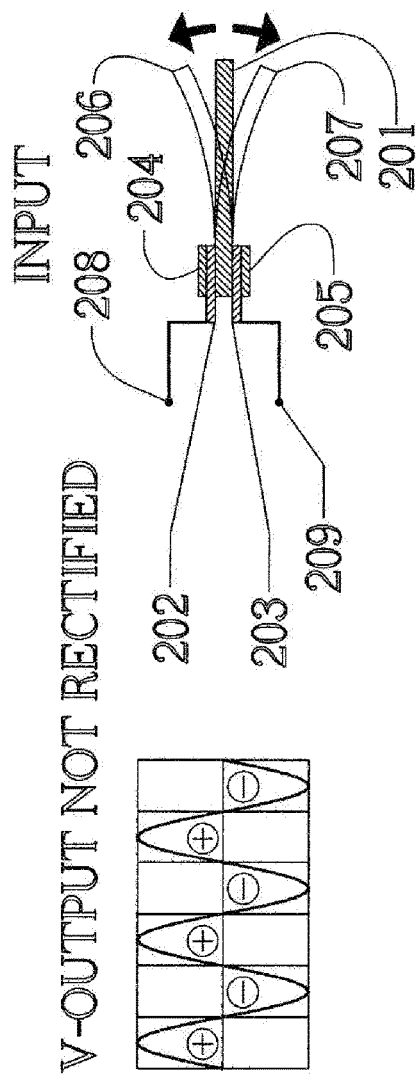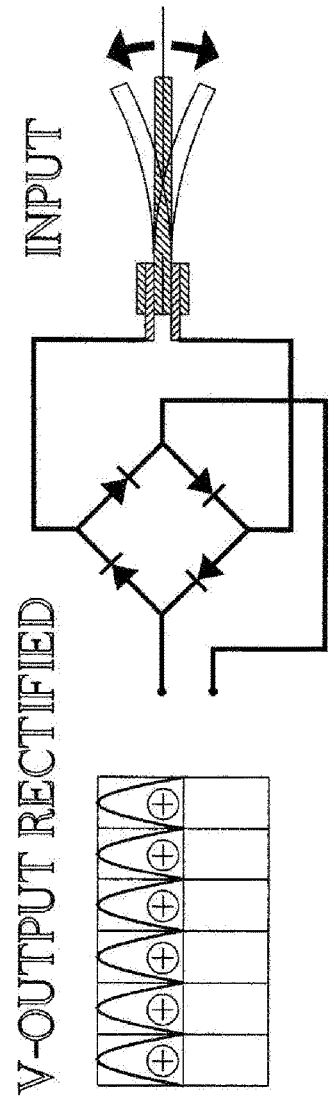

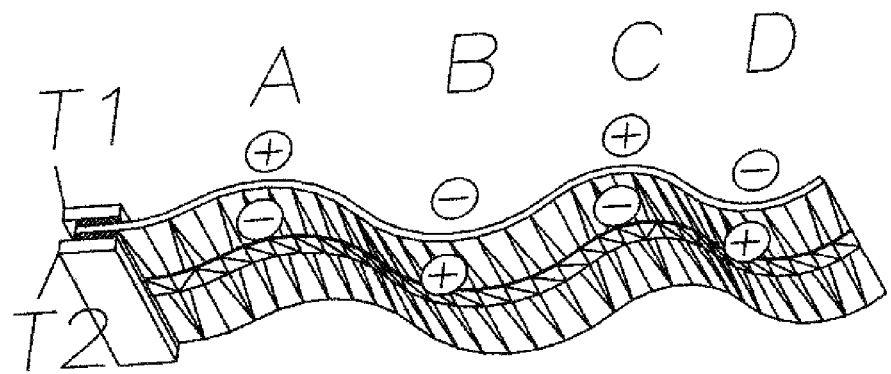
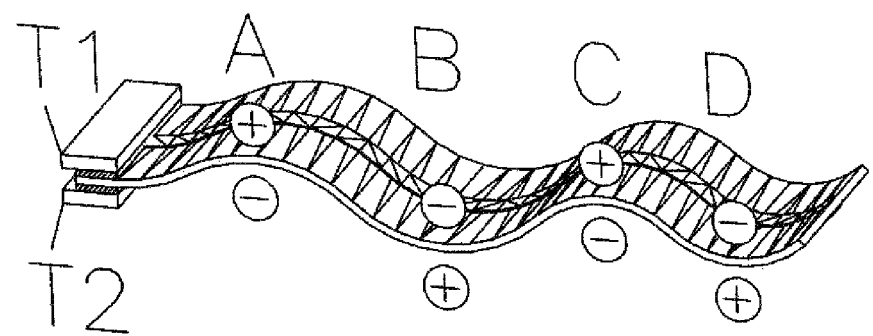
PRIOR ART - FIG. 3

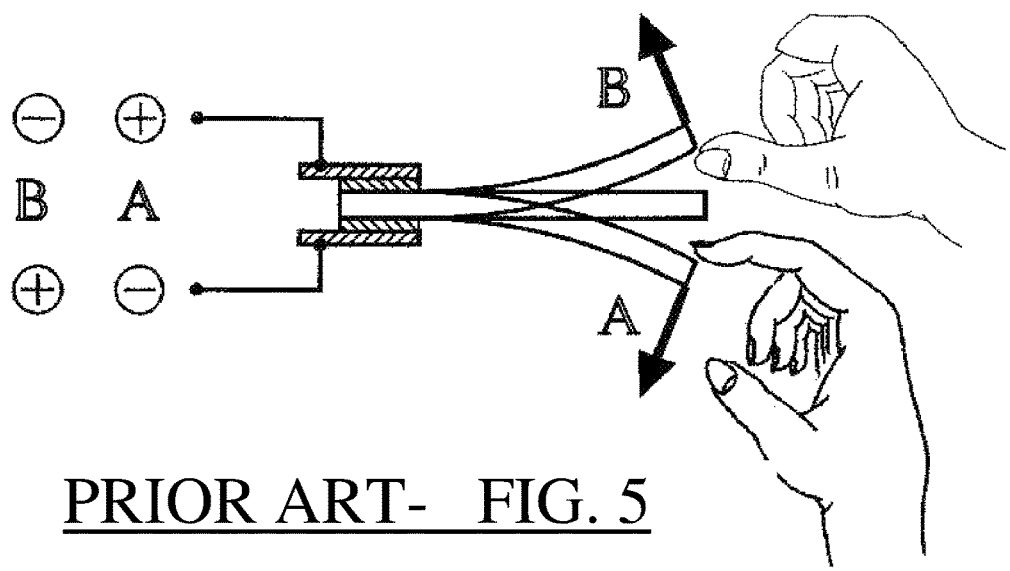
PRIOR ART- FIG. 5
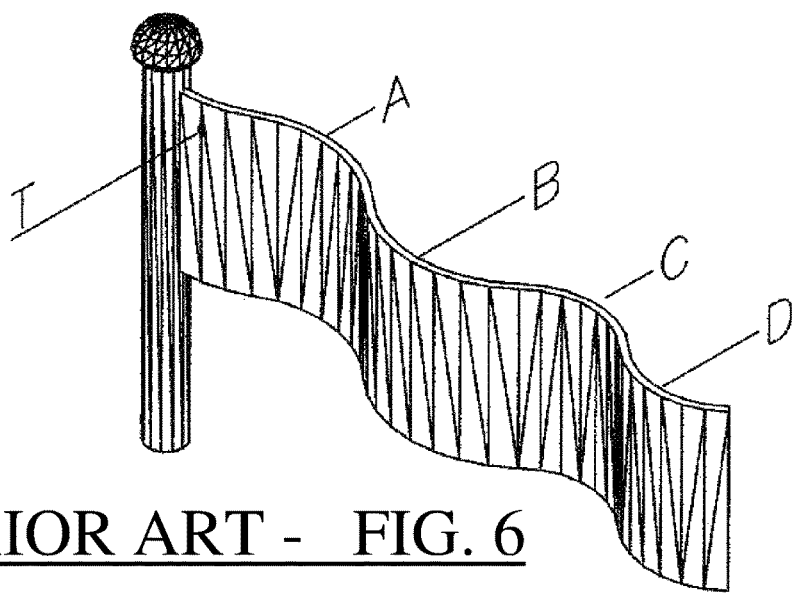
PRIOR ART - FIG. 6

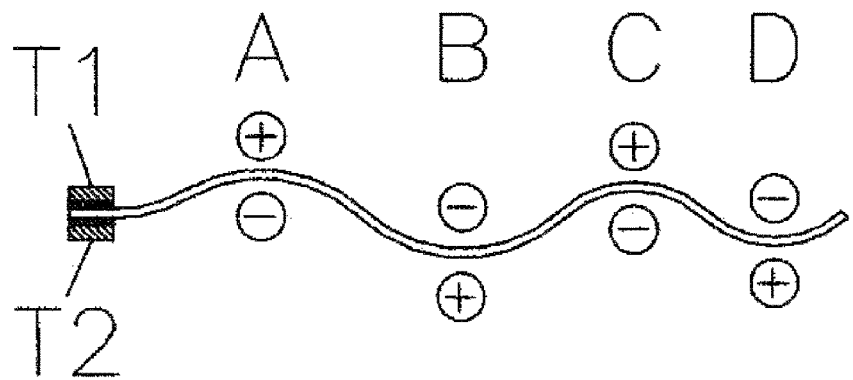
(PRIOR ART) - FIG. 7
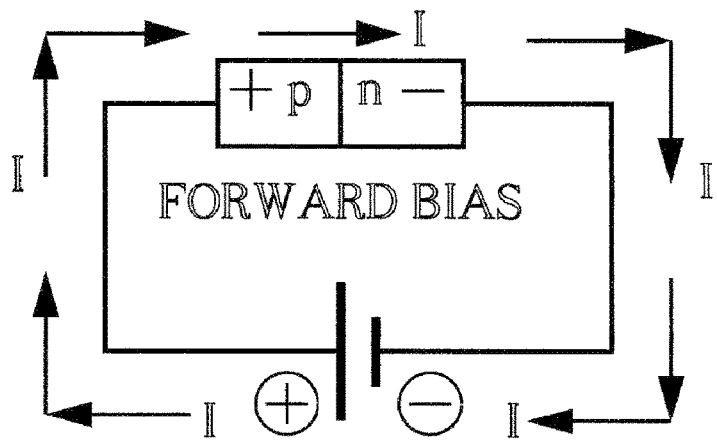
(PRIOR ART)
FIG. 8

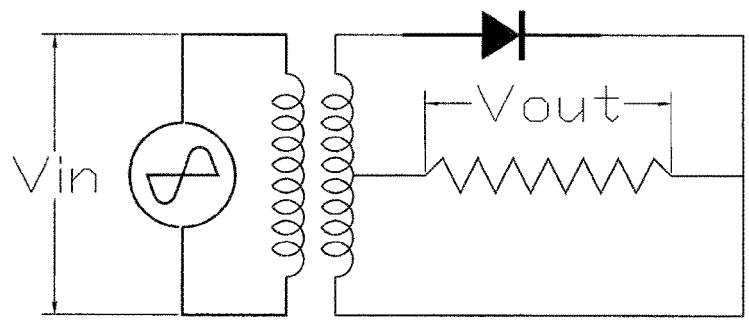
(PRIOR ART)
FIG. 11-A
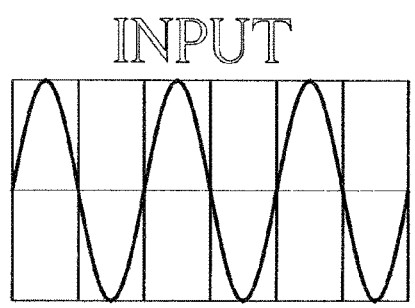
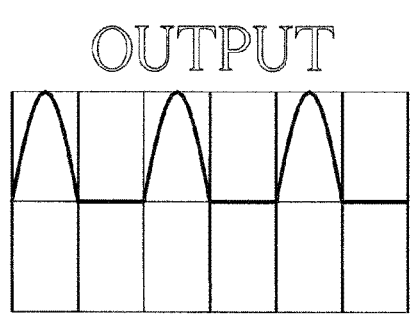
(PRIOR ART)
FIG. 11-B

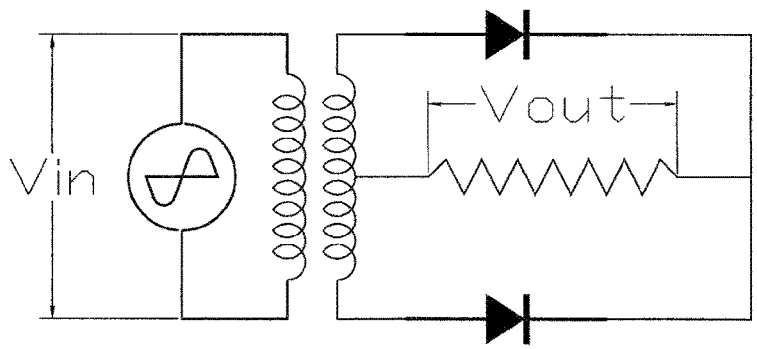
(PRIOR ART)
FIG. 12-A
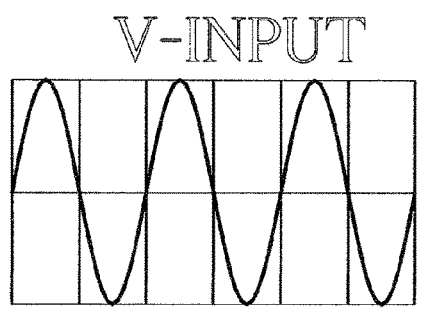
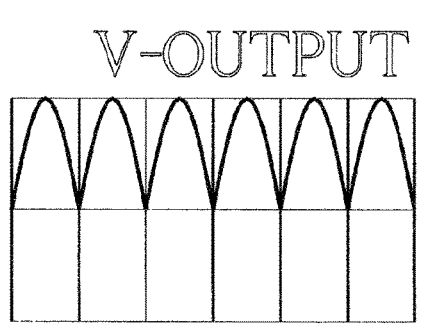
(PRIOR ART)
FIG. 12-B

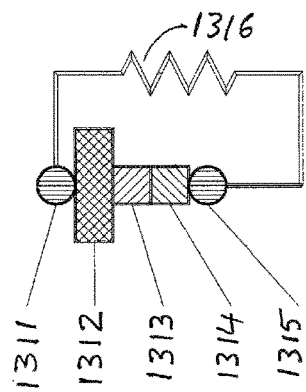
FIG. 13-A
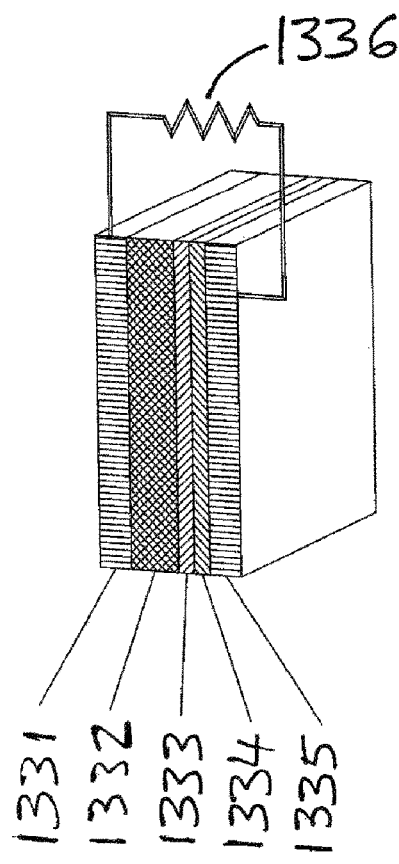
FIG. 13-B

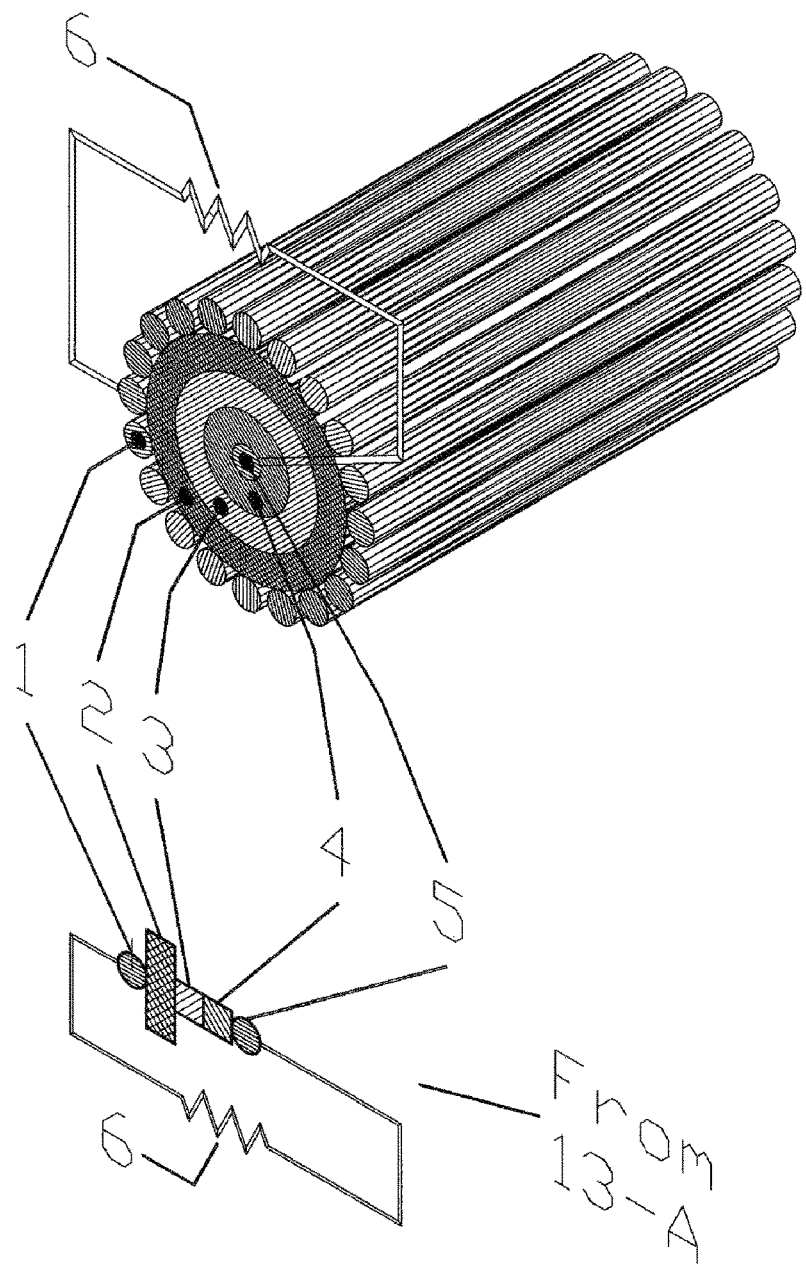
FIG. 13-C

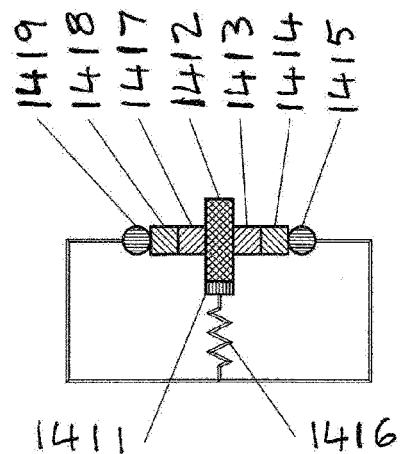
FIG. 14-A
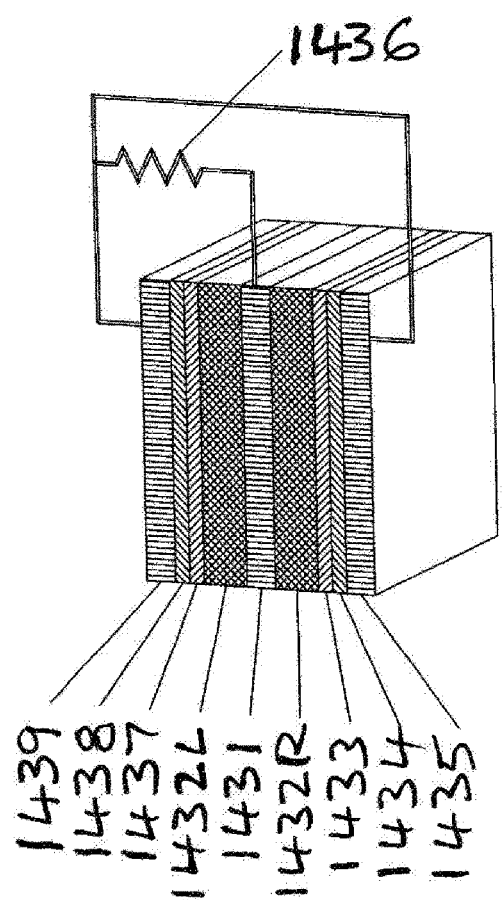
FIG. 14-B

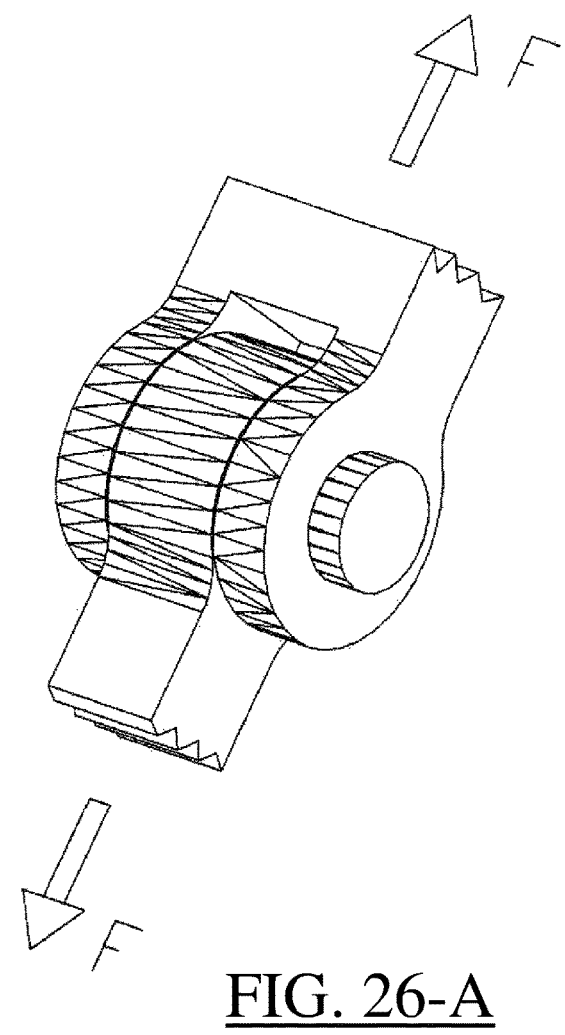
FIG. 26-A

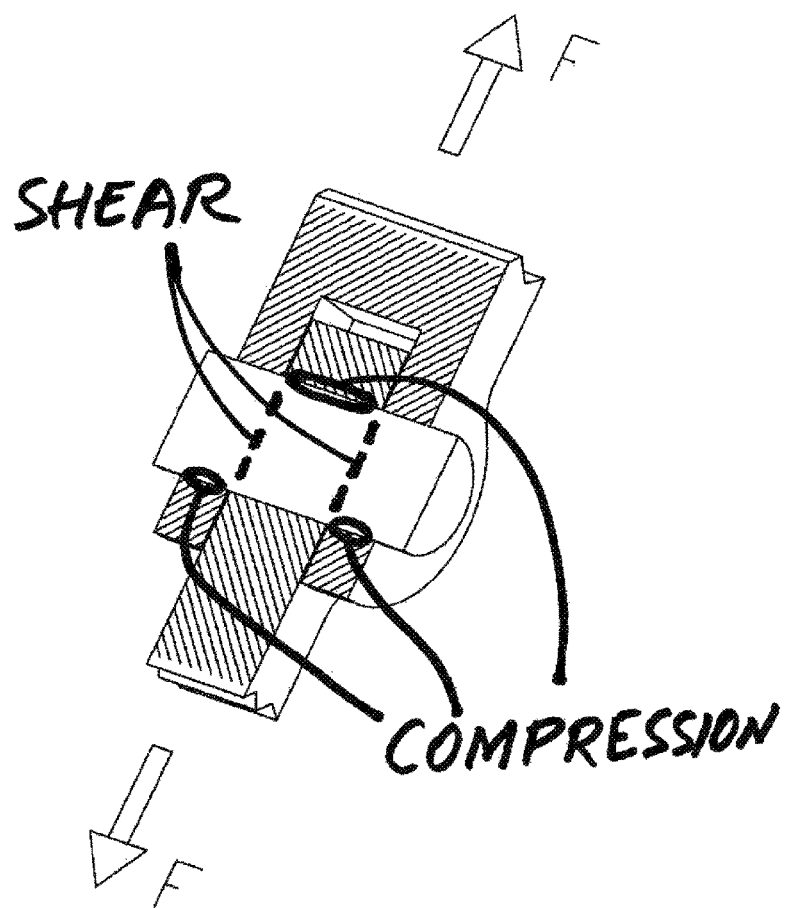
FIG. 26-B

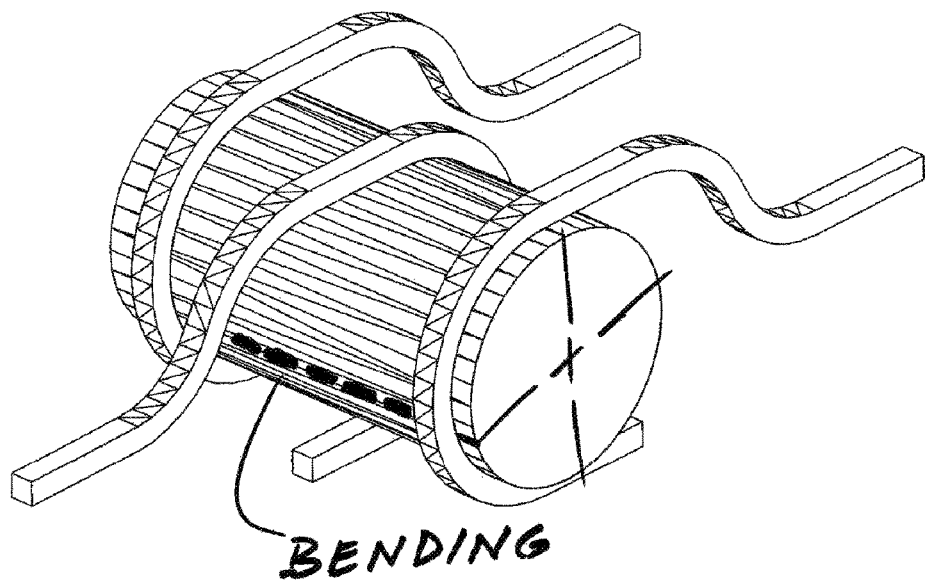
FIG. 26-C

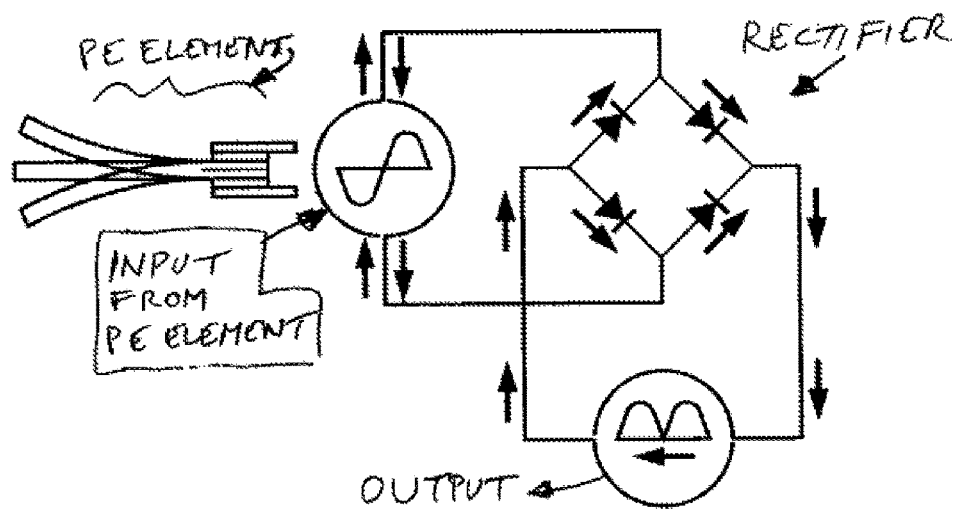
FIG. 30-A
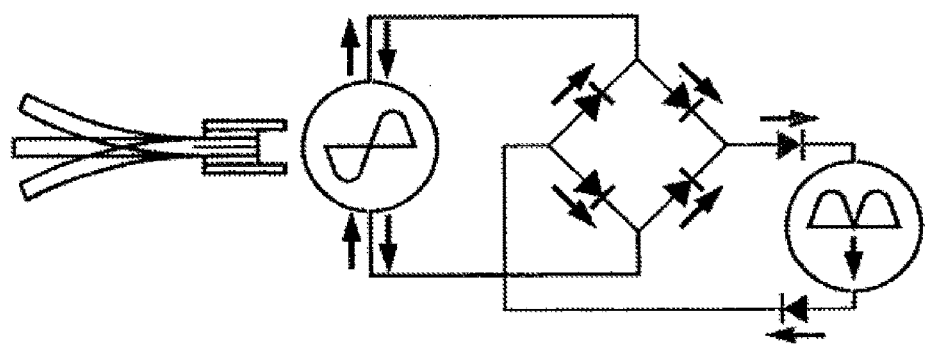
FIG. 30-B

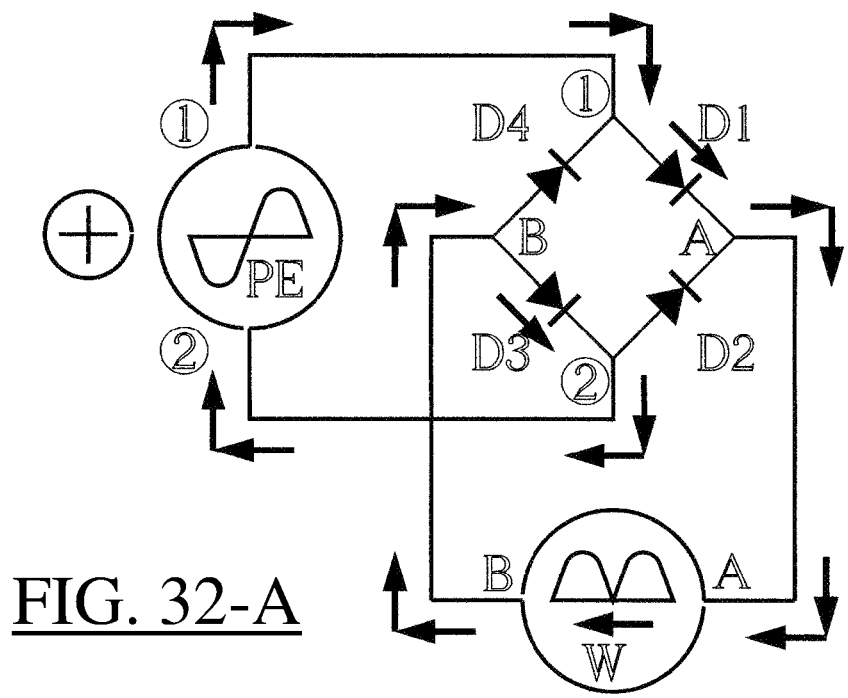
FIG. 32-A
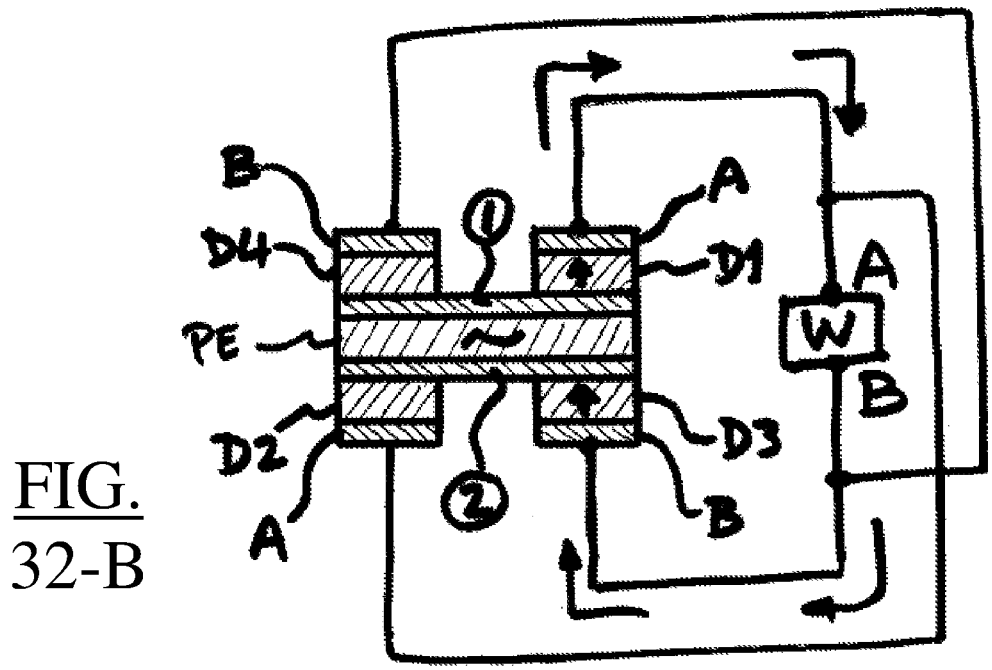
FIG. 32-B

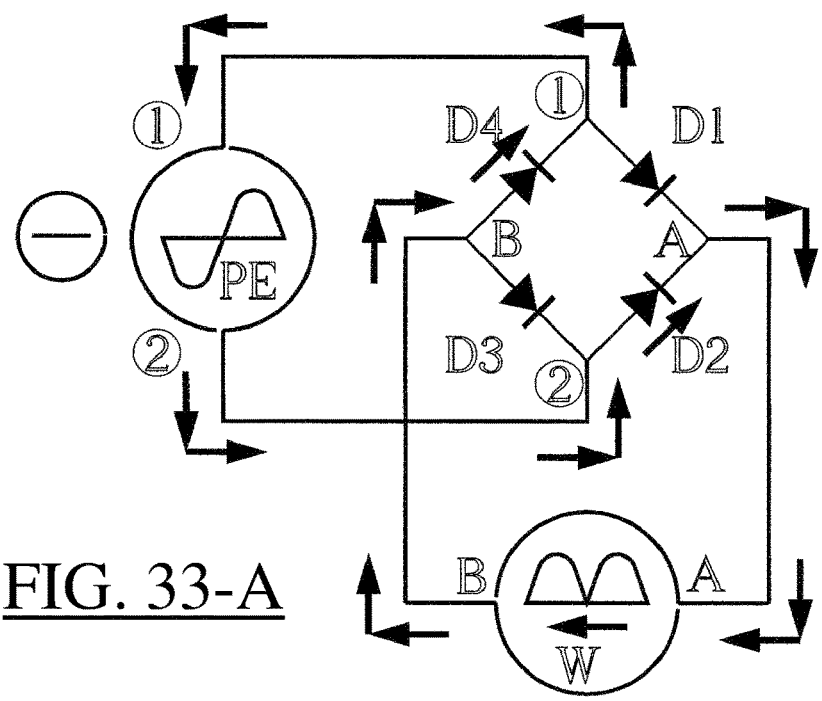
FIG. 33-A
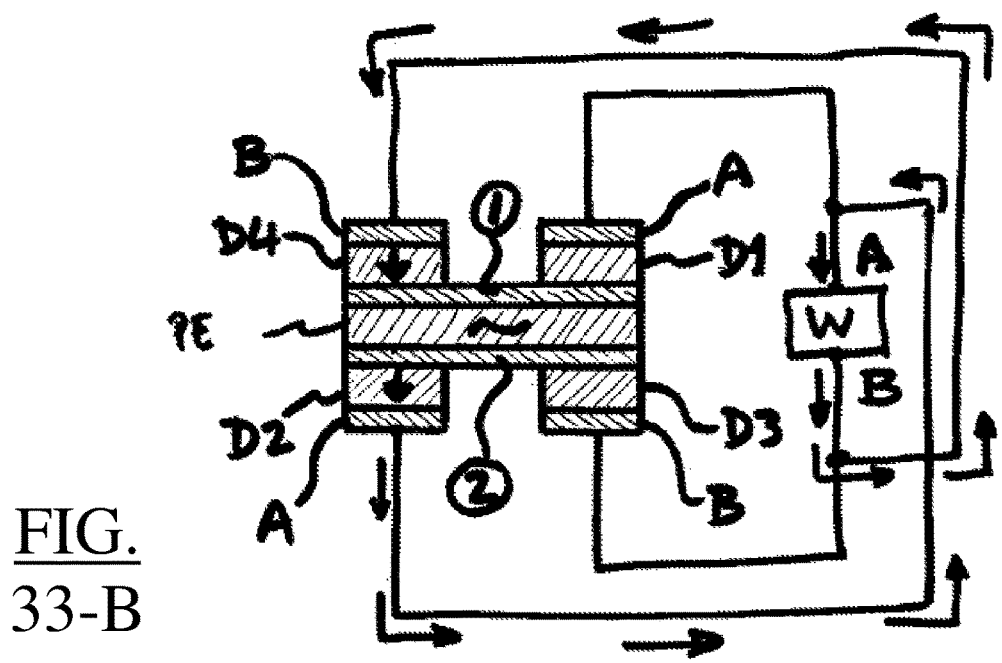
FIG. 33-B

COMBINATIONS 2-A & 2-B
COMB 2-A FIG. 44-A
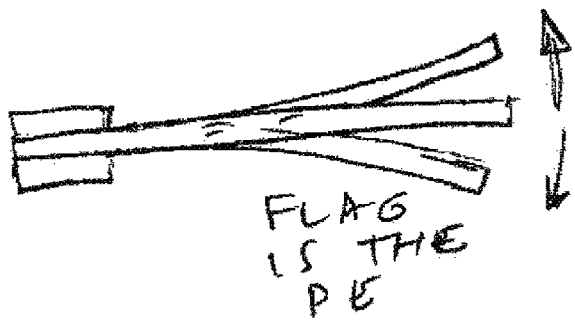
COMB 2-B FIG. 44-B
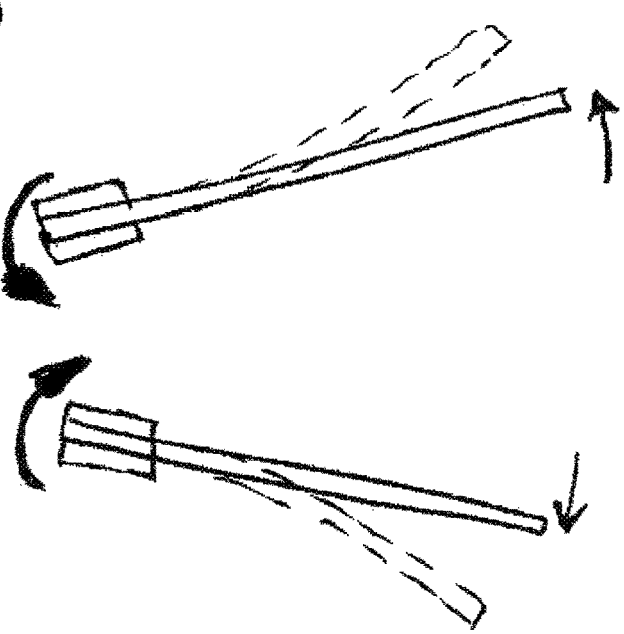

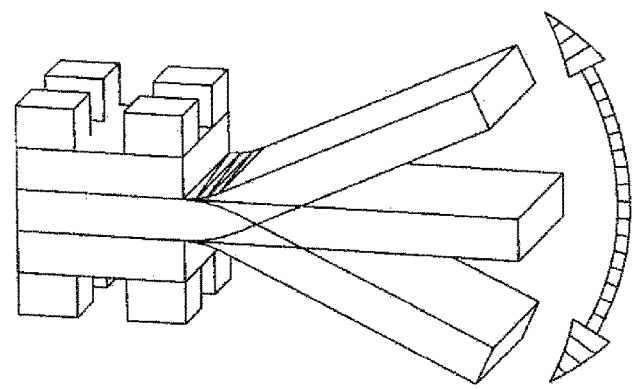
FIG. 45-A
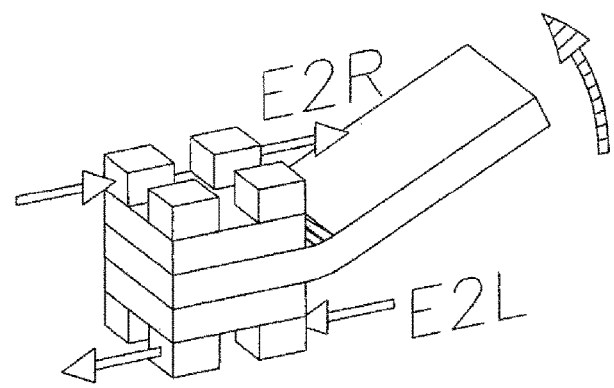
FIG. 45-B
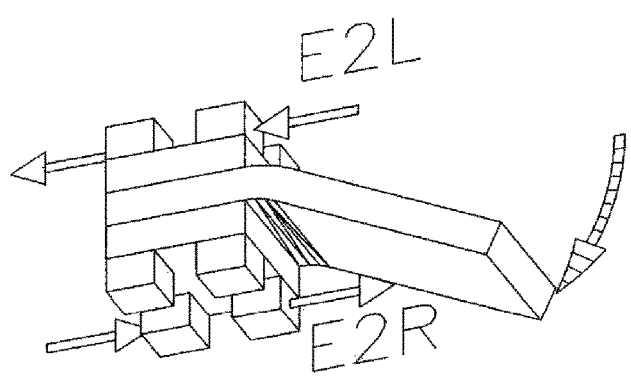
FIG. 45-C

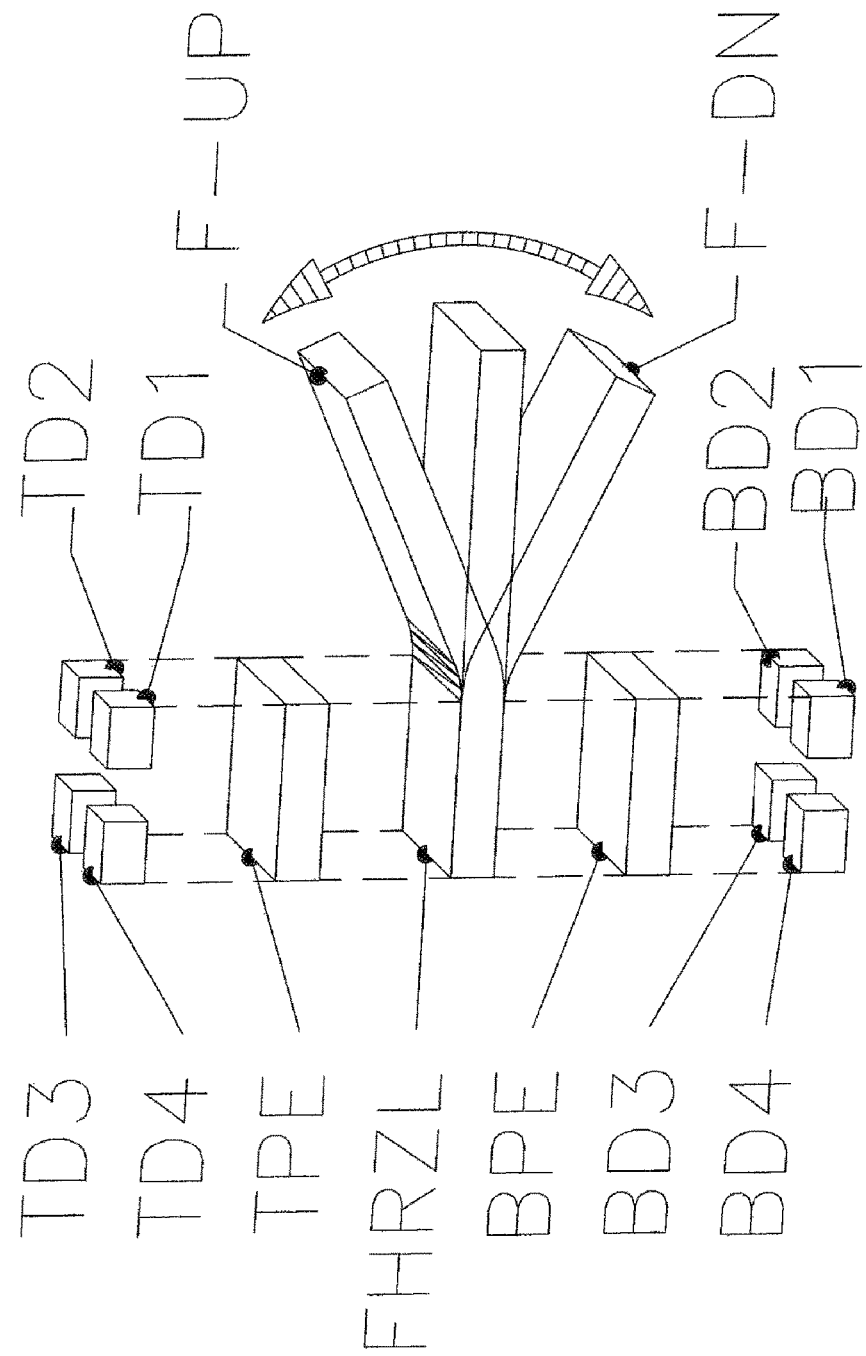
FIG. 45-D

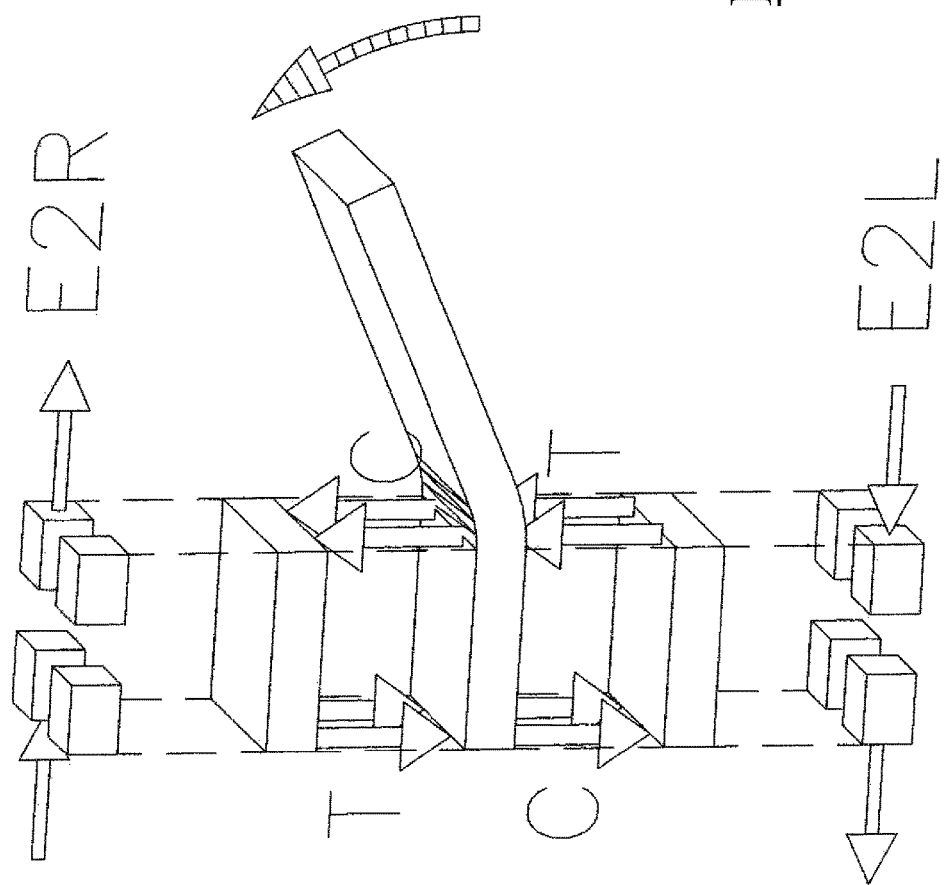
FIG. 45-E

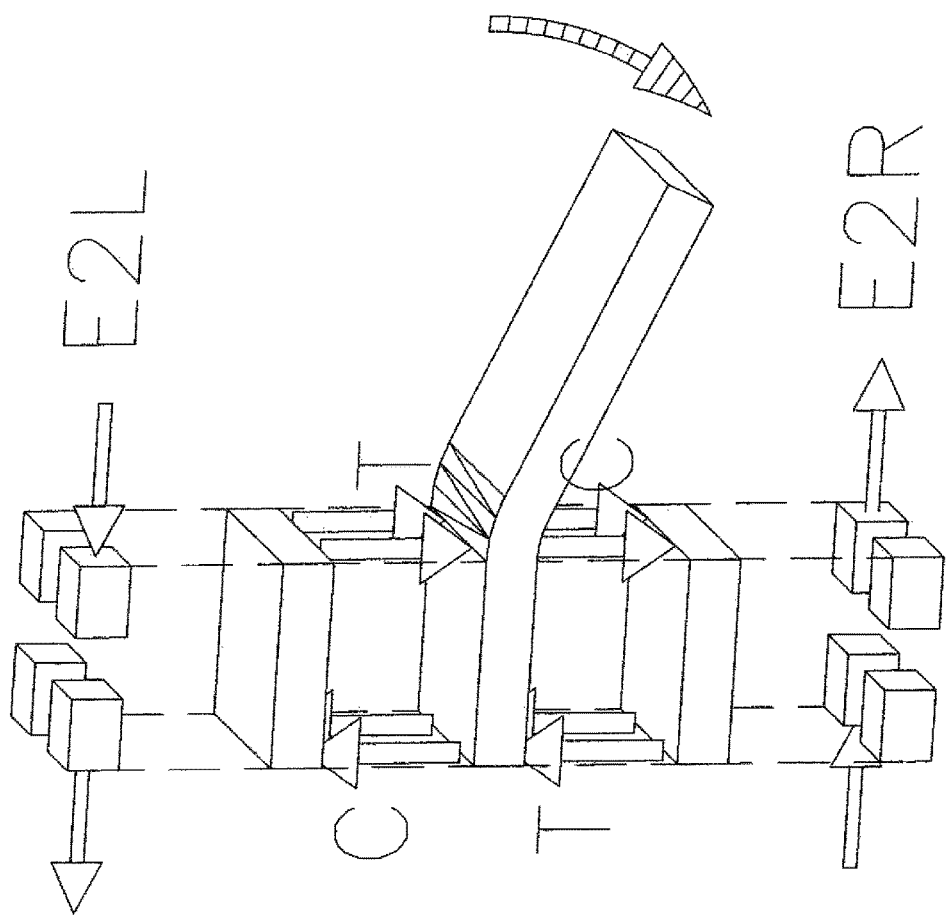
FIG. 45-F

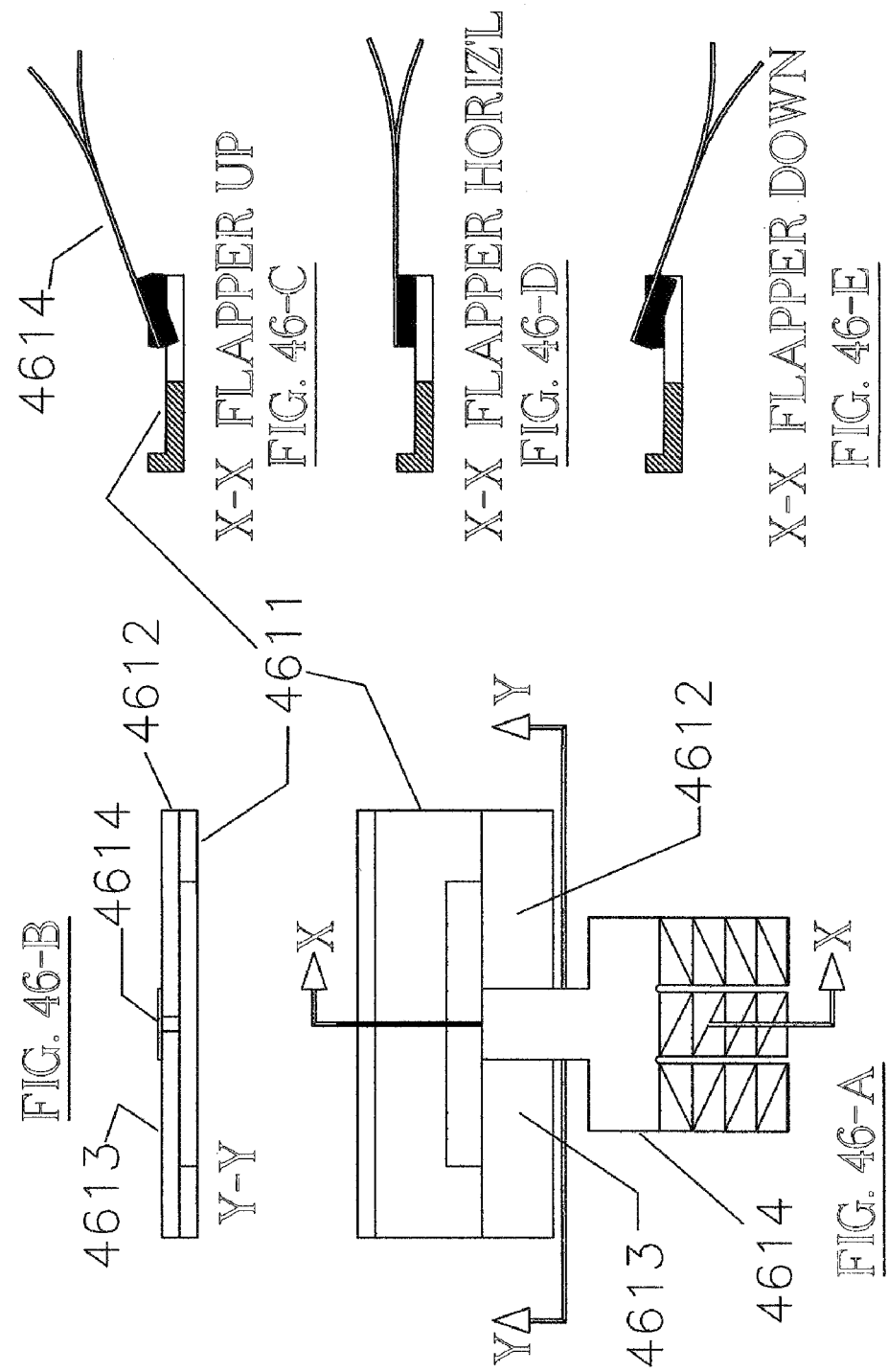

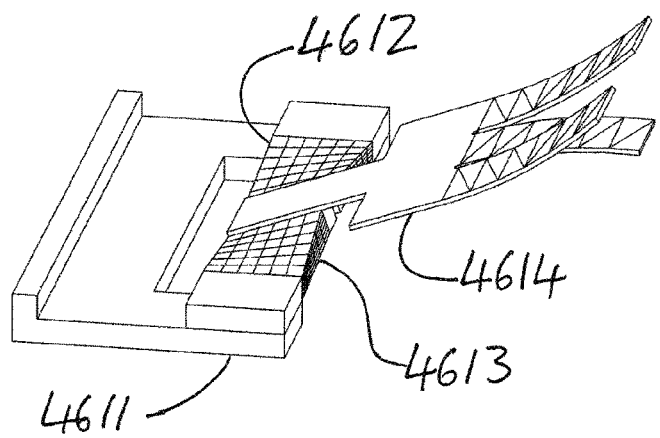
FIG. 46-F
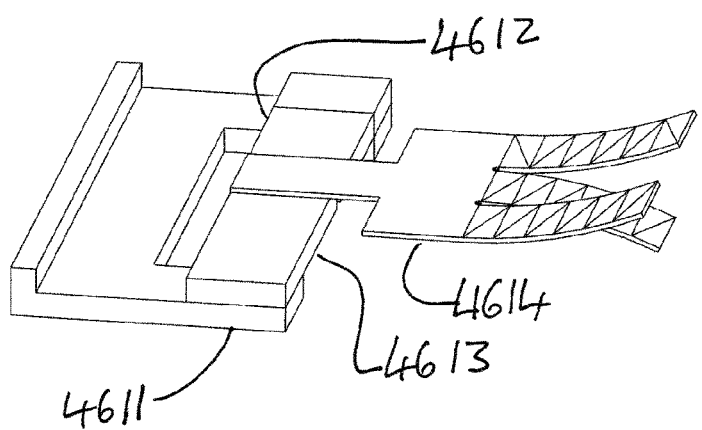
FIG. 46-G
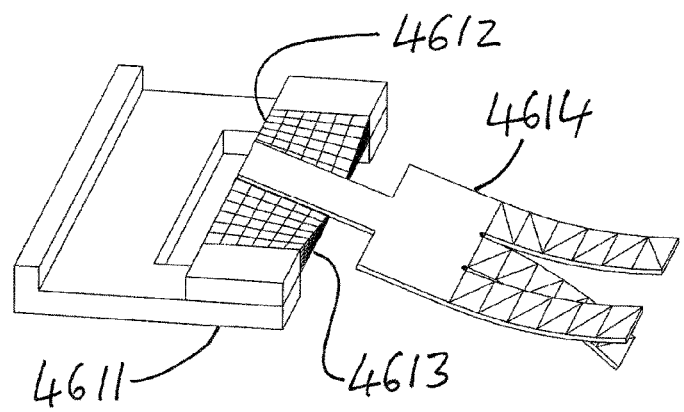
FIG. 46-H

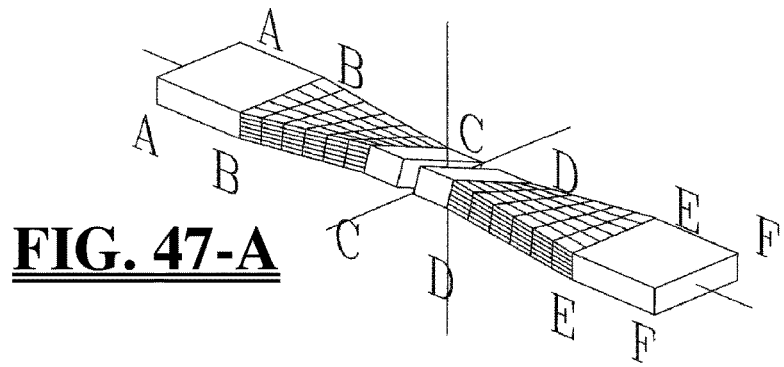
FIG. 47-A
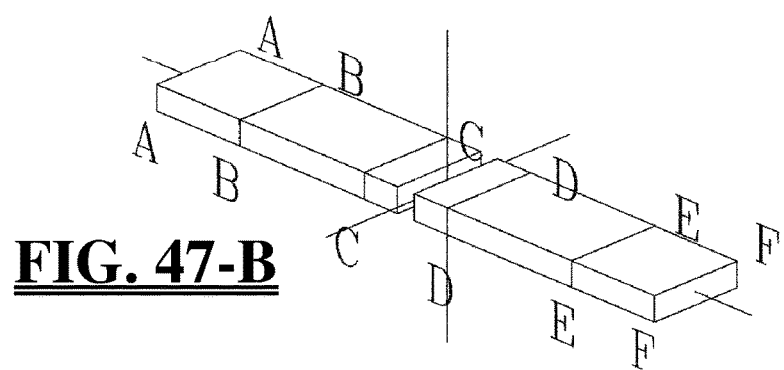
FIG. 47-B
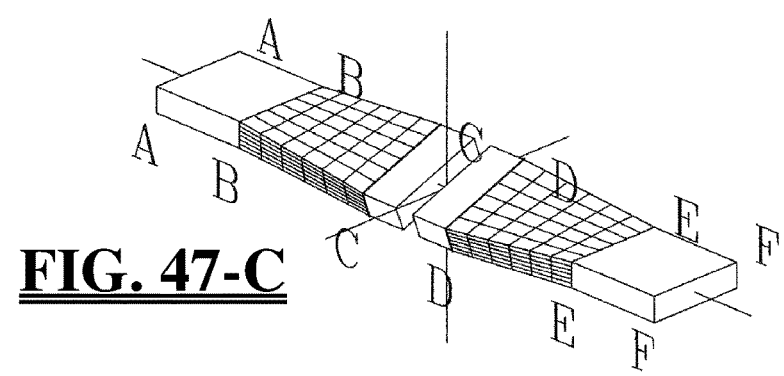
FIG. 47-C

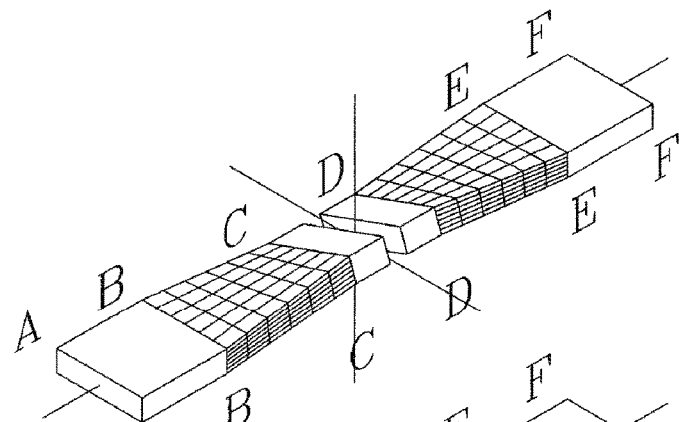
FIG. 48-A
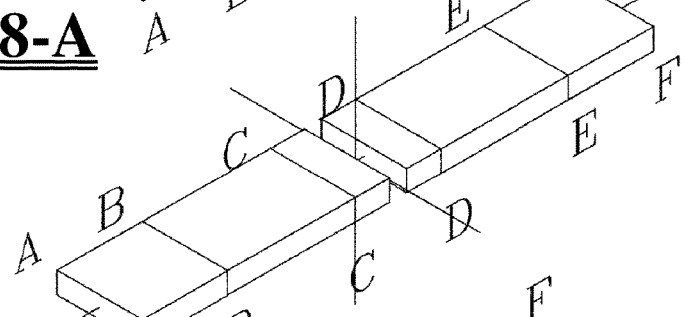
FIG. 48-B
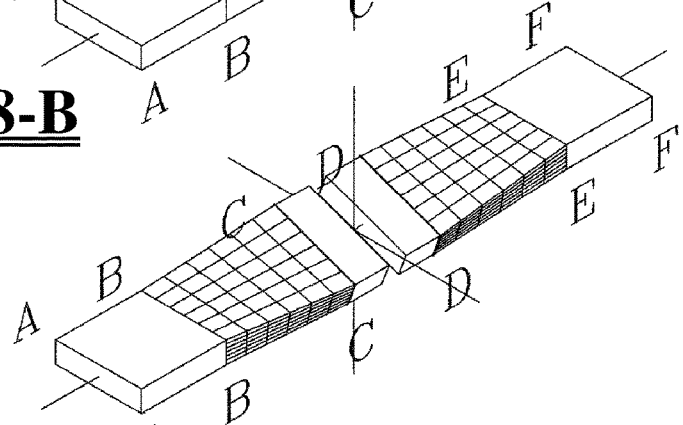
FIG. 48-C

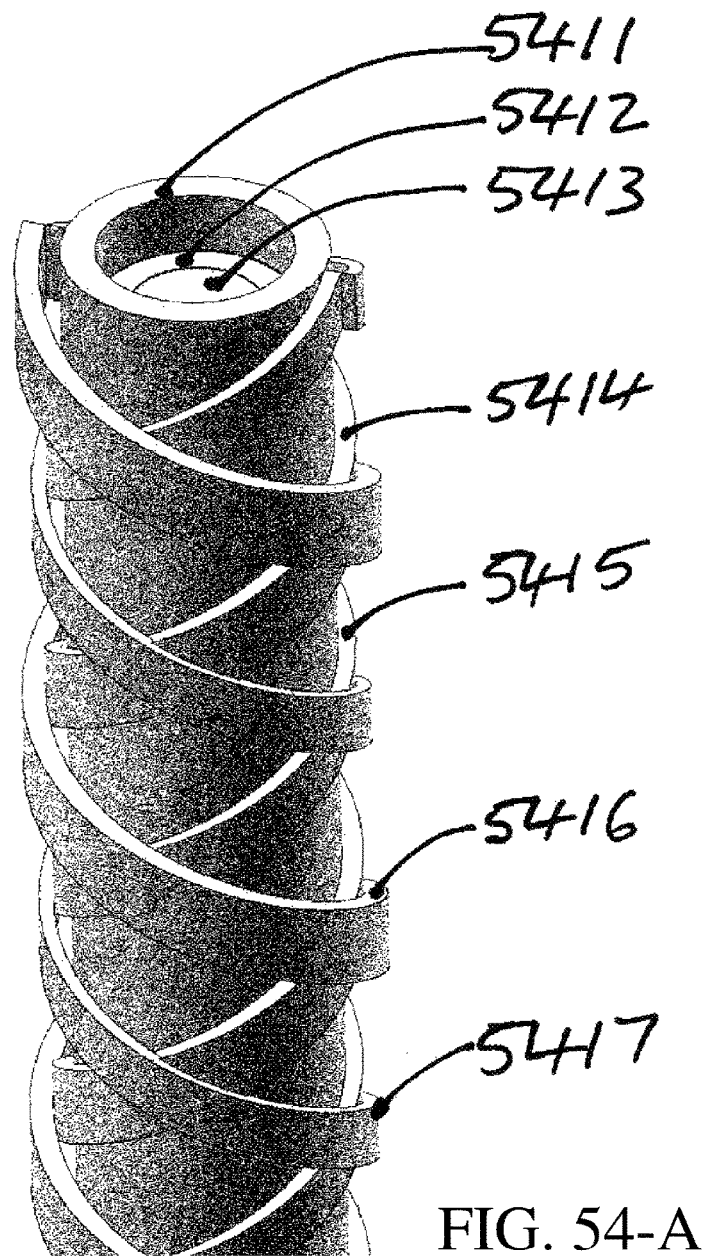
FIG. 54-A

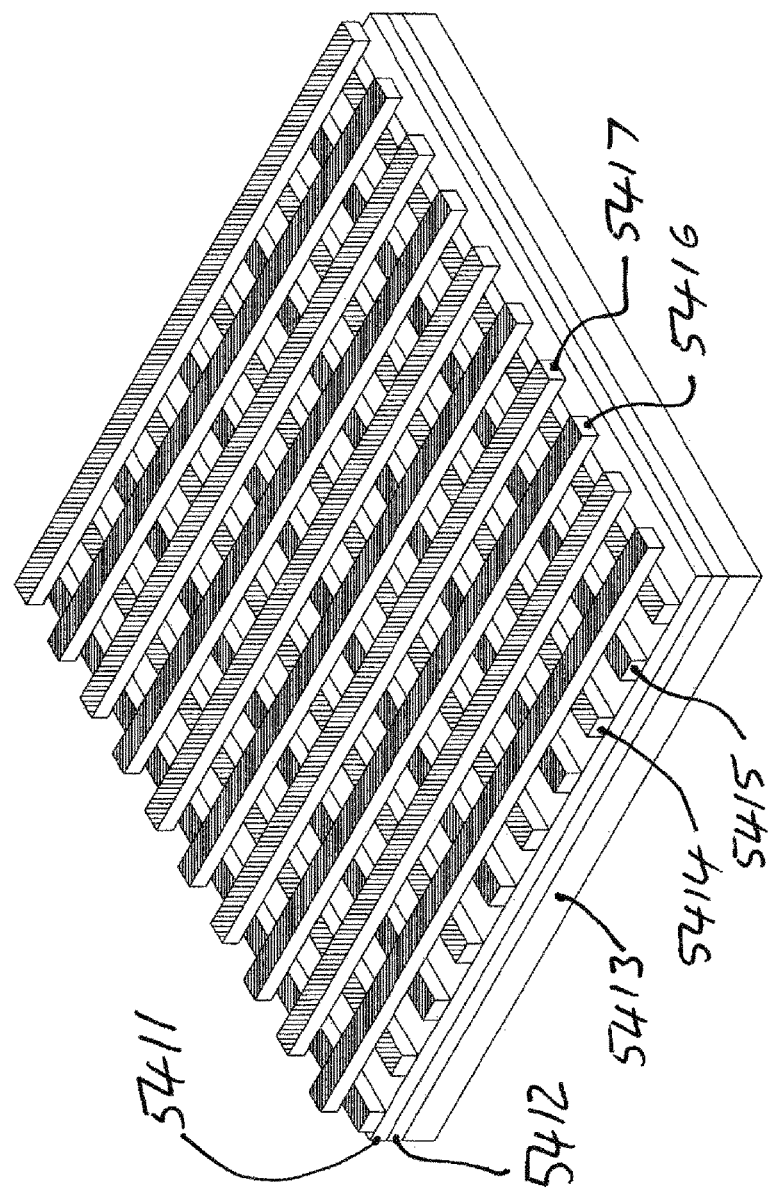
FIG. 54-B

US 9,761,786 B2

PIEZO ELECTRIC EFFECT POWER

CROSS-REFERENCE TO RELATED APPLICATIONS

This present application is based on Provisional Patent Application Ser. No. 61/458,036, filed Nov. 16, 2010, title "PEEP1 PIEZO ELECTRIC EFFECT POWER 1", which will be referred to as Ref1, AND this present application claims all the benefits of this Provisional Patent Application No. 61/458,036.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

1. NO COMPACT DISCS
2. The only text files submitted via the EFS-WEB are those that I have filed since the filing of the Provisional Patent Application mentioned under section (b) CROSS-REFERENCE TO RELATED APPLICATIONS, and the documents submitted with the present patent application.

STATEMENT REGARDING PRIOR DISCLOSURES BY THE INVENTOR OR A JOINT INVENTOR

Not Applicable.

BACKGROUND OF THE INVENTION

Field of the Invention

The country is spending a lot of money on petroleum products to generate the power needed to support our life style. In addition and as a result, we are also generating large amounts of CO2, Carbon Dioxide, using this petroleum energy source, thus contributing further towards global warming, as speculated by a lot of scientists. There is an intensive drive to get off petroleum energy sources as much as possible and to start using other/alternative sources of energy, first to reduce our dependency on foreign sources of energy and second, to reduce the carbon emissions. The purpose of this invention is to help in getting us closer to this goal.

Background Art

It is well known that a piezoelectric (PE) material or device can generate an electric charge or voltage and ultimately power, when it is mechanically stressed, as depicted in FIG. 1 or in FIG. 2-A or in FIG. 5 or in FIG. 21.

As shown in FIG. 1, if a piezoelectric cantilever beam 101, fixes in a support 102 is pushed down as in 103, an electric potential can be detected at points 104 and 105. FIG. 2-A shows more details. Here the piezoelectric cantilever beam 201 has two electric contacts 202 and 203 near its fixation end, where it is between that clamps 204 and 205. When the beam is pushed to positions 206 or 207, then we can detect the electrical potential at the terminals 208 and 209. These electrical potentials can be observed on a scope, roughly as illustrated in the graph at the left end of the FIG. 2-A. FIG. 2-B shows the potential, if a 4-diode, full bridge rectifier is attached between the piezoelectric beam and the scope.

And vice versa, such a PE material can move mechanically when an electrical power or charge is applied to it, as in the PE "fan" depicted in FIG. 4. For example, there are Piezoelectric (PE) speakers, which convert electrical input signals to sound, the sound being generated by a diaphragm of some sort, which is moved mechanically by the PE element in the speaker, where the PE element has converted the electrical input signal into a mechanical movement output. The reverse is also true. There are PE lighters, which act in the reverse way. When you strike a PE element inside the lighter, by some mechanical input like pushing on the release lever, the PE element generates an electric output, which creates the spark needed to light a fire for example. This PE lighter does generate electrical power as a result of applying a mechanical input onto its PE element.

There are a certain number of materials that have/exhibit this PE phenomenon. For example, solids made out of certain ceramic materials, or sheets made out of KYNAR, usually flexible if thin enough, which is a plastic material, exhibit such a PE phenomenon.

My invention here is to utilize this PE phenomenon and such materials, to generate electric power, by applying mechanical stress and/or movements on such materials, for example from wind, from waves in the ocean or similar water bodies, or from anything that could generate a mechanical stress and/or movements in a PE material.

Of course, there should also be a way to capture the electric power that would be generated by these materials as a result of these mechanical inputs, and to store the generated electric power, or to use it or consume it right away. I propose using means to direct the generated electric power at the right instances in appropriate directions, so that if there are two units of electric power, that are generated at the same time but are of opposite polarity, then these two units would not cancel out each other. For this purpose, I am proposing a number of alternatives, described here below.

A first alternative is to use semi-conductors, such as diodes and/or transistors, to separate the output charges and collect the similar charges at individual collectors, separately from the non-similar charges, so that they do not neutralize each other. In other words, collect all the Positive (+) charges at the Positive (+) collector or terminal, and collect all the Negative (−) charges at the Negative (−) collector or terminal.

A second alternative is to break down any large size PE generator and/or Collectors into smaller units or segments. The purpose is again to reduce the chance of having one polarity charge neutralizing the opposite polarity charge, mostly by separating the generating elements from each other as much as possible and/or by separating the collectors as well, for the same purpose. All these alternatives include at the same time, features to facilitate the manufacturing processes to create the various proposed embodiments.

FURTHER BACKGROUND ART

I propose that we could use either a "Bridge-" like electric circuit, as in FIG. 2-B, using "Diodes-" or "Transistors-" like devices, to capture the "instantaneous" electricity generated during the various stages of the imparted mechanical inputs. The danger is that if two adjacent PE elements are stressed or moved in opposite directions at the same time, and the electric power elements or charges generated by them are in opposite directions but are "electrically" connected, then these two charges would cancel each other out and would neutralize any usable output. So, we must find a way to separate these charges from each other and capture the benefits of each of them separately and then "add" any similar charges appropriately together, to get the benefit of applying the mechanical inputs to the PE element(s).

Most mechanical inputs can be evaluated as either producing a compression force or stress, or a tension force or stress, being applied on to the PE element. These forces or stresses can be constant or continuous, i.e. steady or hardly changing, or they can be changing either in a repeated fashion, e.g. like a wave form, or can be just individual impulses at a steady repeating manner or at some irregular intervals. Even if the applied forces or stresses create a bending situation, the end effect can still be presented or broken down as either compression or tension on the PE elements. In any case, the generated electric power should be captured instantaneously, so that one part of the generated power or charges would not negate or cancel out any of the other parts of the generated power or charges.

Let's say that in the set-up shown in FIG. 2-A, that if we apply a downward push on the free end or tip of the cantilever, such that this downward push would generate a negative charge at the terminals at the fixed end of the cantilever, then an upward pull would generate a positive charge at the same terminals. And let's say that we keep applying these push and pull actions repeatedly. Then by using the four-element bridge as in FIG. 2-B, we would convert all the pulses in one direction and the electric power can then be stored in a storage device, like a battery cell for example.

To maximize the utilization of the phenomena, we would like to capture the electricity generated "locally" along any spot/surface of the material, so that we don't negate a positive charge coming from one spot/surface by a negative charge coming from an adjacent spot/surface of the material, as in FIG. 3. So, we prepare the Kynar strip with layers of "semi-conductor" material feeding the charges in one direction only to the "full conductive" longitudinal conductor, as shown, for example, in FIG. 34, which will be described in due time later down below.

Kynar is one of the plastic materials that exhibit PE Effect (PEE). We should be able to tap this phenomenon to generate electric power. Any other material that exhibit similar PE phenomenon can be used as well.

At a trade show, a company was exhibiting a "FAN", made more or less a shown in FIG. 4. An electrical power was applied at the two terminals, which were attached to one fixed end of a strip of Kynar, as shown. When the A/C power was applied, the free end of the strip started to move up and down, thus moving the air in its vicinity, and acting somewhat like a fan, an air moving fan.

Well, I am proposing to do exactly the opposite or the reverse of this fan.

It is known that Piezo Electric Effect or PEE is reversible. That means that if you apply an electric signal to a PE element, you get a mechanical movement, and on the other hand, if you apply a reverse mechanical movement, e.g. by applying a force to the PE element, you get a reverse action, i.e. we get an electric signal output (power). (See FIG. 21).

I propose to do just that. The reverse action.

In FIG. 5, if I hold the free tip of the (PE) Kynar strip and push it up and down with my fingers, then the theory says that the strip, being made of a Piezo Electric material, would generate an electrical voltage at the terminals. If I push the strip upwards, the voltage will have one polarity, and when I reverse and push the strip downwards, the voltage will also reverse and will have the opposite polarity.

This can be demonstrated, if such a strip with electrodes/terminals as shown is wired to a voltmeter or an oscilloscope. Then if the strip is tapped by finger or by a pencil or the like, then the signal on the scope would show an oscillation, almost like an AC electrical current signal, but the magnitude of the signal would decrease as the mechanical vibration of the strip fades away until the mechanical vibration or motion stops totally, at which time the electrical signal on the scope would stop as well.

So what I propose is to take advantage of this phenomenon to generate electricity and electrical power.

I would use such materials, any material that exhibits the PE Effect, and expose it to any means that will move it in a way that it will generate the "reverse" electrical output, and then use that output, as an electric power generated from the PE element. Lately, this kind of action is frequently referred to as "ENERGY HARVESTING".

One of the possible moving/movement sources is "WIND". If I use the Kynar strip or sheet as a "FLAG" and hold it in the wind, it will flutter and move back and forth. See FIGS. 3, 6, 7, 27, etc. I can then provide electrodes on this Kynar sheet, such that the electrical output from it can be tapped out and used as electric power in any of the various applications of electrical power. The movement of a flag in the wind is not very uniform and the electricity generated by it would also not be very uniform. But it still is electric power. If we convert it to some other useful form of electricity or power, or harness it by some clever ways, and then use it as needed, then it will be more convenient to use.

We could convert it to DC, by some kind of "RECTIFYING" processes, for example, by using DIODES, whether a single diode, or a pair of diodes or by a "4-diode bridge", see FIGS. 2-B, 29, etc., or the like. We could also store this rectified power in batteries or any appropriate storage devices, e.g. capacitors, and then use that power, tapping it from these batteries, as needed and when needed. If we prefer, then we can "convert" or "invert" the DC power to an AC power, as needed.

Now let's look again at the PE Effect of a strip of Kynar. Let's go back to FIG. 5, and let us compare that movement or deformation of the strip against the deformation of a flag, which is illustrated in FIGS. 6 and 7.

In FIG. 5, when we push downwards on the strip, all the fibers at the upper layers of the strip are stressed under tension, and all the fibers in the lower layers of the strip are stressed under compression. Thus if we assume that the compression stress creates NEGATIVE charges, then all the lower layers will create NEGATIVE charges. And conversely in this case, all the upper layers under the opposite kind of stress, namely tension, will create the opposite kind of charges, namely POSITIVE charges. What I am saying here is that, compression creates (−), (N) and tension creates (+), (P) charges. This may not be the exact polarity of the charges generated in true life, but be it as it may, it is the convention that I will continue using in my present specification. Just to be consistent. So, if I push down, as in Condition A in this FIG. 5, all the positive charges will go to the UPPER terminal, while all the negative charges will go to the LOWER terminal. In this configuration, no one charge from one side of the strip will negate any charges at the opposite side of the strip.

Now let's analyze what happens in the flag shown in FIGS. 6 and 7, using the same convention mentioned above. FIG. 7 represents the material of the flag, shown in FIG. 6. If we assume that the deformation at point "A", in FIG. 7, will give us a positive (+) charge at the top/upper side of the material and a negative (−) charge at the bottom/lower side of the sheet, then the deformation at point "B" will give us charges of opposite signs at the corresponding sides of the sheet. In other words, at point B, we would get (−) charges at the top of the sheet and (+) charges at the bottom of the sheet. If these two charges travel along the surface of the sheet and we try to collect them at the terminals at points T1 and T2 and assuming that they will both arrive there at roughly the same time, in reality, maybe at a fraction of a second one after the other, then they will cancel each other out, and we will end up with ZERO charge at the Terminals T1 and T2.

Also, the charge at the mid-point between points A and B will be ZERO, because we would have zero deformation at that point.

If we look at the timing of these two charges, we can assume that the (+) charge at A will reach the terminal point T1 first, and a short time later, the (−) charge from point B will arrive to the terminal point T1 and will cancel out the (+) charge that came earlier from point A and the end result is that there will be no useable charge at terminal point T1 anymore.

So, at the top terminal T1, the positive charges generated at the top layers at A will be cancelled out by the negative charges generated at the top layers at B. So, there will be no residual charge accumulated, hence no power, at the top terminal T1. Similarly, at the bottom terminal T2, the negative charges generated at the bottom layers at A will be cancelled out by the positive charges generated at the bottom layers at B. So again, there will be no residual charge accumulated at T2, hence no power, at the bottom terminal T2 either. So, we will end up practically with zero charge at both terminals 'T1' and "T2". Any other charges that may be generated at other points, such as point "C" or "D" in FIG. 7 will again have the same fate and ultimately there will still be hardly any residual power for us to use. So, we would end up with practically ZERO charge and ZERO power at the terminals "T1" and "T2".

So, to overcome this problem and to end up with any useful power, we need to have a clever way to separate these charges and to collect all the (+) ones together and bring them to the (+) terminal, and to collect all the (−) charges together and bring them to the (−) terminal. And we should prevent them from prematurely cancelling each other out. If we do that, then the magnitude of the charge will be considerably larger and we would have something more substantial, useful, useable output, because the charges would not have cancelled out each other, i.e. would not have neutralized themselves, as in the previous/above case, when we allowed them to intermingle.

How do we do this? Here it is further down below. This is the key/novel point of this invention.

But let us first take a brief excursion into the electronics behavior of Diodes and Transistors.

FIG. 8 shows a standard diode, wired to be in a "FORWARD BIASING" condition. Current will flow from the "p" side to the "n" side of the diode. We will use the "conventional" flow direction, not the "electron" flow direction. The "p" and the "n" sides of the diode are "doped" with certain appropriate dopants to impart to them the proper "p" and "n" characteristics, as already known in the prior art of manufacturing diodes.

This can be represented schematically as shown in FIG. 9, showing the "Forward Bias" condition.

FIG. 10 on the other hand shows the "REVERSE BIAS" condition, since we have reversed the polarity of the battery cell or the power source, as seen in the figure. In this case, NO current flows through the circuit, because the diode does not allow any current to flow through it in this reverse bias condition. Of course if the voltage exceeds a certain limit, then the diode will break down. This danger has to be kept in mind, so as not to overload and burn the diodes. The diode size and characteristics have to be designed and selected properly. Again, all this is already known in the "prior art".

Next, let's look at the rectifier circuits in FIGS. 11-A and 11-B and FIGS. 12-A and 12-B FIGS. 11-A and 11-B show a half-wave rectifier, while FIGS. 12-A and 12-B show a full-wave rectifier. Both have in common, the fact that the source voltage is alternating from (+) to (−) and back, while the output is all in the same one direction. Again, all this is already known in the Prior Art.

Next, I will show how we can arrive to something comparable.

DEFINITIONS AND ABBREVIATIONS

More definitions may appear throughout the specification text, when appropriate.
(N) or (n) or (−) Negatively doped semi-conductor material
(P) or (p) or (+) Positively doped semi-conductor material
1T Conductor
2B Conductor
ABE Bus Bar (−)
ABS Bus Bar (−)
AC Alternative Current
ATE Bus Bar Out
ATS Bus Bar IN
BBE Bus Bar (+)
BBS Bus Bar (−)
BD1, 2, 3, 4 Bottom diodes 1, 2, 3 and 4.
BPE Bottom Piezo-Electric Element
BTE Bus Bar IN
BTS Bus Bar IN
C Compressive force C
D1 Diode
D2 Diode
D3 Diode
D4 Diode
E2L Energy to the Left
E2R Energy to the Right
EP Electric Power.
F-DN Flapper in the Downward position
F-UP Flapper in the Upward position
FHRZL Flapper in the Horizontal position
Full Conductor An electrically conductive material, which conducts electricity in any direction, regardless of the polarity of the electricity. Copper is a good example.
LB Level Branch, e.g. First Level Branch, Second Level Branch, etc.
MO Module Outline
One-Way Valve An electric circuit that allows the flow of the electric current in only one direction, similar to a one-way valve used in hydraulic applications.
PE Piezoelectric
PE material A material that exhibits the PE phenomenon
PEE PE Effect or PE Element, depending on the text content.
PEEP Piezo Electric Effect Power
PES Piezo Electric Sheet Semi-Conductor A material that conducts electricity in one direction only
T Tensile forces or stresses
T1, T2 Terminals
TD1, 2, 3, 4 Top Diodes #1, 2, 3 and 4
TPE Top Piezo-Electric Element
W Load, electric
wrt with respect to

BRIEF DESCRIPTION OF THE DRAWINGS

| FIG. # | The Figure shows: |
|---|---|
| 1 | Cantilever piezo beam generates Electric Power |
| 2-A | Same, plus Sinusoidal Positive and Negative Output |
| 2-B | Same, plus 4-diode bridge rectifier and All Positive Output |
| 3 | Waving Flag generates positive and negative charges on its surfaces |
| 4 | Piezo Electric Fan |
| 5 | The reverse of the Fan. |
| 6 | Waving flag on a pole and its hills and valleys |
| 7 | The electric charges on the waving flag surfaces |
| 8 | Current flow in a Forward Biased Semiconductor |
| 9 | Current flow in a Forward Bias Diode |
| 10 | No current flow in a Reverse Bias Diode |
| 11-A and 11-B | Half Wave Rectifier |
| 12-A and 12-B | Full Wave Rectifier |
| 13-A | Half Wave PE generating element - Physical Schematic |
| 13-B | Flat Half Wave PE generating element - 3D View |
| 13-C | Circular Half Wave PE generating element - 3D View |
| 14-A | Full Wave PE generating element - Physical Schematic |
| 14-B | Flat Full Wave PE generating element - 3D View |
| 15 | Cable-Like Full Wave PE generating element - 3D View |
| 16 | Flex Center Conductor in a Flat Full Wave PE generating element - 3D View |
| 17 | Rollers to create Transverse Cracks |
| 18 | Rollers to create Longitudinal Cracks |
| 19 | Various PE generating gadgets, nets, tie-downs, supports, etc |
| 20 | More PE generating gadgets, nets, tie-downs, supports, etc |
| 21 | Piezo Electric crystal, with Input and Output |
| 22 | Piezo Electric Road Sensing & Energy Harvesting Element |
| 23 | Piezo Electric Road Energy Harvesting System |
| 24 | Portable Piezo Electric Corrugated Road Energy Harvesting System |
| 25 | Converting Tension to Compression |
| 26-A, 26-B, and 26-C | Converting Tension to Shear, or Compression or Bending |
| 27 | Almost Similar to FIGS. 3, 6 and 7, but detailing the individual charge sources and the resulting energy flows. |
| 28 | PEEP TREE, overview, general scheme |
| 29 | 4-DIODE BRIDGE RECTIFIER, almost Similar to FIG. 2-B. |
| 30-A | Almost Similar to FIG. 29, except that the input is a PEEP Leaf. Also the output wiring is at 90 degrees wrt to the direction of the Leaf wiring. |
| 30-B | Almost Similar to FIG. 30-A, except that the output wiring is shown in line with or parallel to the PEEP Leaf wiring. |
| 31 | PEEP LEAF Basic Module with the major basic components or parts. |
| 32-A | Schematic Flow Diagram of the arrangement shown in FIG. 30-A, when the Generated Charge is Positive and Flowing Upwards as shown. |
| 32-B | Physical Cross-Section of the arrangement in FIG. 32-A, showing the physical components of the arrangement, and the current flows through the components. Again, this is for the case when the generated charge is Positive and flowing upwards as shown in FIG. 32-A. |
| 33-A | Schematic Flow Diagram in the arrangement shown in FIG. similar to the one shown in FIG. 32-A, but when the Generated Charge is Negative and Flowing Downwards as shown here. |
| 33-B | Physical Cross-Section of the arrangement in FIG. 33-A, showing the physical components of the arrangement, and the current flows through the components. This is for the case when the generated charge is Negative and flowing downwards as shown in FIG. 33-A. |
| 34 | 3D view of the basic PEEP Module, Active Flag |
| 35 | Basic PEEP LEAF, with 2 Diodes, to act as One-Way Valves, and 1 Capacitor |
| 36 | Basic PEEP LEAF, connected to a storage battery, with several One-Way Valves and Capacitors |
| 37 | First Level PEEP Branch with 5 Leaves, Connected to a storage device, with one-way valves and capacitors |
| 38 | Two First Level PEEP Branches with 5 Leaves each, one at top and one at bottom of the storage device. |
| 39 | Five First Level PEEP Branches with 5 Leaves each, all at the top of the storage device, and connected to the storage device by a Second Level Branch. |
| 40 | As in FIG. 39, but duplicated at the bottom like at the top of the storage device, and again connected to the storage device by a Second Level Branch. |
| 41 | Similar to FIG. 40, but physically looks slightly different, i.e. both at the top of the storage device, although electrically identical to FIG. 40 |
| 42 | Three groups of First and Second Level Branches, all three of them feeding into the same storage device. |
| 43 | Combination 2: Passive Flag, and some details of the components. |
| 44-A | Combination 2-A: Passive Flag, with Fixed End |
| 44-B | Combination 2-B: Passive Flag. with twisting End |
| 45-A | Combination 2-A, Cantilever PEEP Beam, showing its possible range of motion. |
| 45-B | Combination 2-A, Cantilever PEEP Beam UP, showing the resulting direction of energy flow. |
| 45-C | Combination 2-A, Cantilever PEEP Beam DOWN, again showing the resulting reverse direction of energy flow. Reverse direction compared to FIG. 45-B. |
| 45-D | Exploded view of Combination 2-A, showing the nomenclature of the individual parts |
| 45-E | Internal forces/stresses, exerted by the flapper on the PE elements, and the resulting Energy Flow, when the flapper is in the Upward position. |
| 45-F | Same as in FIG. 45-E, but when the flapper is in the Downward position. |
| 46-A | Combination 2-B, Top view, showing the TWISTING PEE setup. |
| 46-B | Combination 2-B, Front View of the setup shown in FIG. 46-A. |
| 46-C | Combination 2-B, Cross-Sectional Side View, when the Flapper is Up |
| 46-D | Combination 2-B, Cross-Sectional Side View, when the Flapper is Horizontal, Central position. |
| 46-E | Combination 2-B, Cross-Sectional Side View, when the Flapper is Down |
| 46-F, 46-G and 46-H | Combination 2-B, Same as FIGS. 46-C, -D, and -E, but in 3D views. |
| 47-A, 47-B and 47-C | 3D views of the TWISTING PEEP Element of FIG. 46, as seen from one viewpoint. |
| 48-A, 48-B and 48-C | Same as 47-A, 47-B and 47-C, but from a different viewpoint. |
| 49 | Bifurcated flag to increase vibration or flutter, several different views. |
| 50 | Many PEEP Leaves, constructed out of one PE Sheet, showing the details and nomenclature of the various parts |
| 51-A, 51-B and 51-C | Same as FIG. 50, but showing a quasi exploded views, illustrating a method of constructing same. |
| 52 | PEEP Leaves on a Carrying Frame Structure, general view. |
| 53 | Close-up view of a part of FIG. 52 |
| 54-A | Construction of a PEEP harvester, in the shape of a Cable. |
| 54-B | Similar construction of a PEEP harvester, but in a flat configuration |

DETAILED DESCRIPTION OF THE INVENTION

Figure 1:
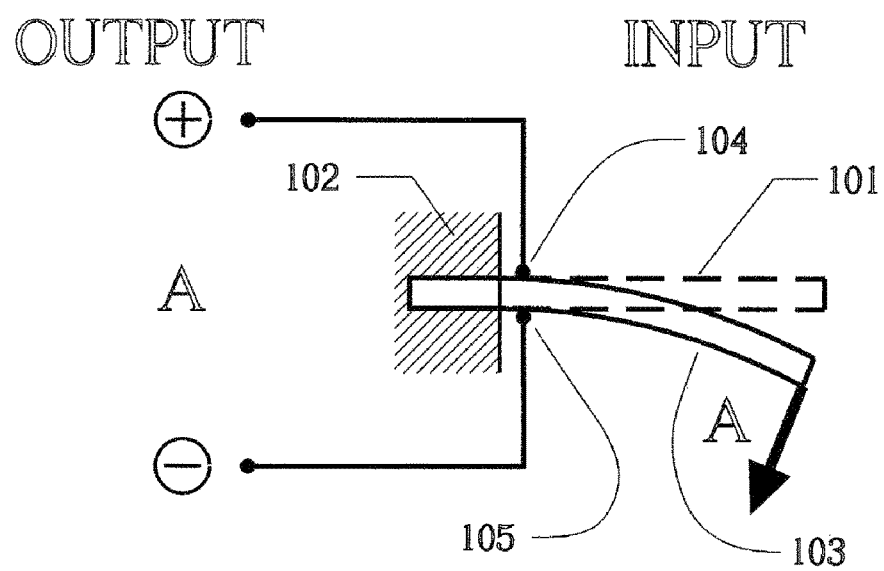
Figure 4:
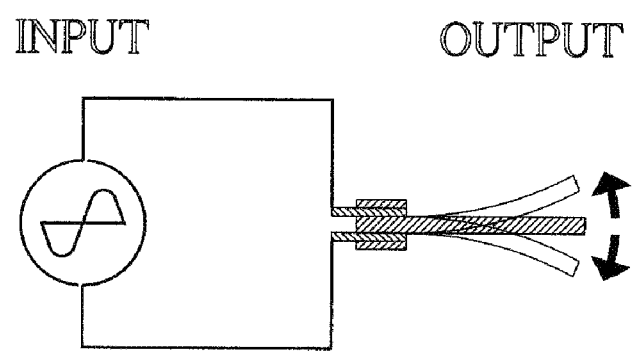
Figure 9:
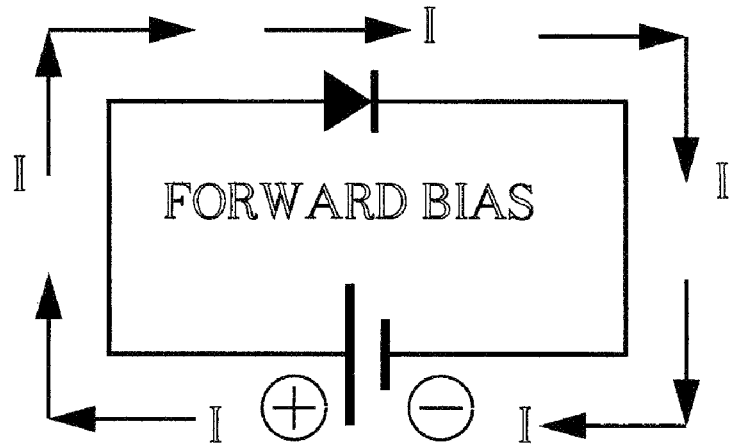
Figure 10:
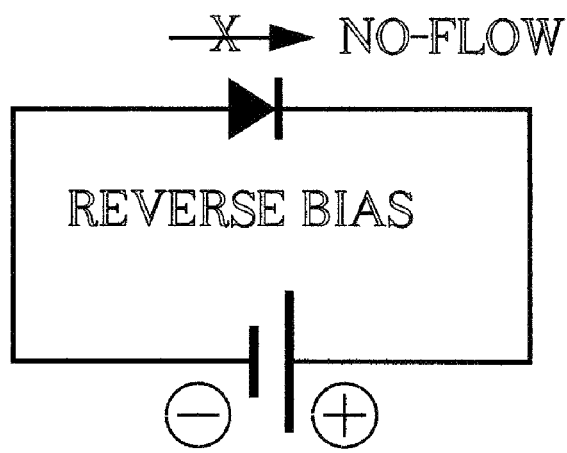

Embodiments Group #1—Using Rectifier Circuits with PE rods, strips or sheets.

Embodiment

FIG. 13-A show the basic raw arrangement of the raw concepts, arranged in series, to simulate the arrangement shown in FIG. 11-A. FIG. 13-B shows a more manufacturable arrangement, to accomplish the same end purpose and goal.

Please note the reference numbers of the various components in these two figures. They end up with similar last digit for any component that has a similar function. For example, the reference number of the PEE in FIG. 13-A end up with xxx2, and the comparable PEE in FIG. 13-B ends up with xxx2 as well. I will try to follow this approach for as long as possibly practical to do so.

FIG. 13 shows two (2) embodiments according to this invention, FIGS. 13-A, 13-B and 13-C, which result in an "electrical" configuration comparable to the circuit shown in FIG. 11-A hence giving a HALF-WAVE output shown in FIG. 11-B The PEE material 1312 or 1332 has the conducting terminal 1311 or 1331 on one side, namely the Left Hand Side (LHS) in this figure, and the p-n semi-conductor 1313, 1314 or 1333, 1334 on the other side, namely the Right Hand Side (RHS) in this figure, which then has another full conductor 1315 or 1335 on the farther side RHS beyond. So, the currents will flow from the PEE material 1312 or 1332 to the p-n material 1313,1314 or 1333, 1334 and then to the surrounding full conductors 1315 or 1335 and 1311 or 1331, and through the load 1316 or 1336, but not in the reverse direction. Hence, Half-Wave flow condition. The same applies to both configurations, i.e. the flat "sheet" configuration, FIG. B, as well as the round "cable" configuration, FIG. C.

NOTE: FIG. 13-C shows the cable configuration. In order to avoid too much clutter in the drawing, I am showing only the last digit of the reference characters of the various components. For example, reference character 1 in FIG. 13-C correlates with items 1311 or 1331 in FIGS. 13-A and 13-B. Similarly, reference character 2 FIG. 13-C correlates with 1312 and 1332 in FIGS. 13-A and 13-B, etc.

I have shown the rest of the correlations in the following table.

Similarly, with FIG. 15, as will be seen further down below. The same following table shows also the correlations between the reference characters of FIG. 15 with respect to those in FIGS. 14-A and 14-B.

Figure 15:
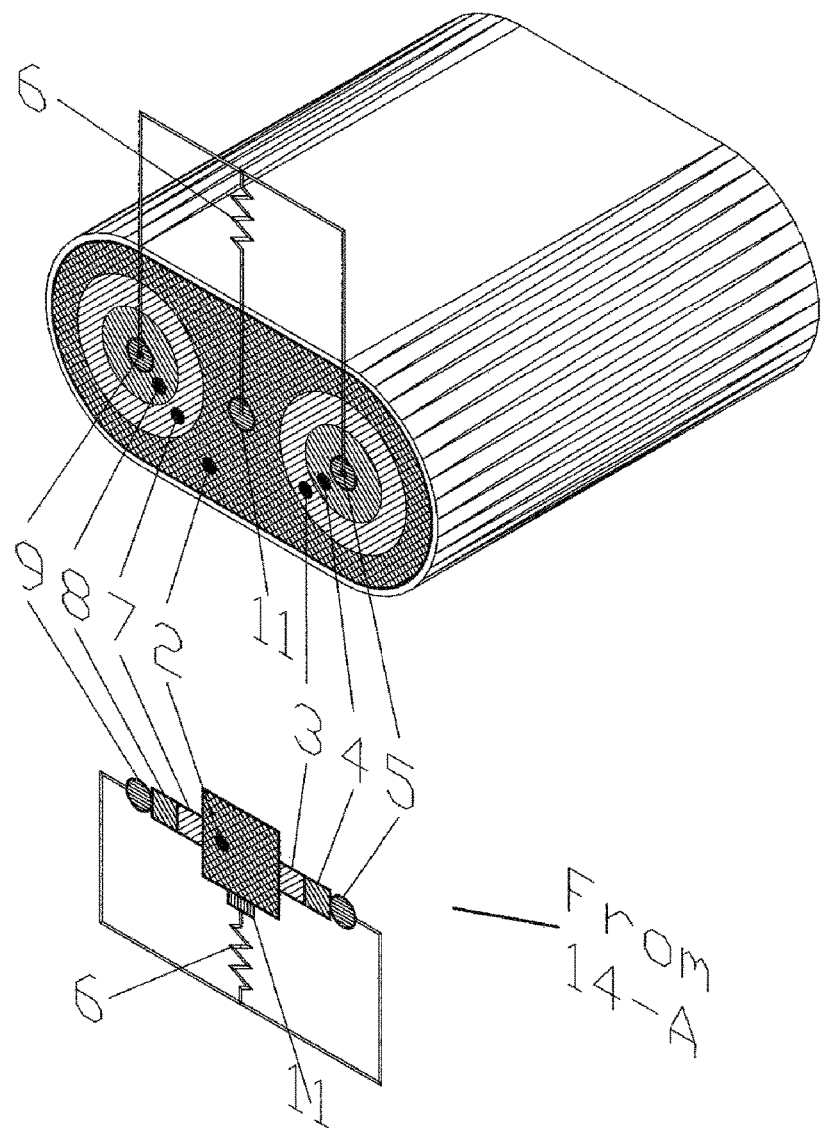

| EQUIVALENT PARTS FOR FIG. 13-C | ABBREVIATED REFERENCE CHARACTER | EQUIVALENT PARTS FOR FIG. 15 |
| --- | --- | --- |
| 1311, 1331 | 1 | |
| 1312, 1332 | 2 | 14312, 1432R, 1432L |
| 1313, 1333 | 3 | 1413, 1433 |
| 1314, 1334 | 4 | 1414, 1434 |
| 1315, 1335 | 5 | 1415, 1435 |
| 1316, 1336 | 6 | 1416, 1436 |
| | 7 | 1417, 1437 |
| | 8 | 1418, 1438 |
| | 9 | 1419, 1439 |
| | 11 | 1411, 1411 |

Embodiment

FIGS. 14-A and 14-B show an embodiment which result in an "electrical" configuration comparable to the FULL-WAVE output configuration, shown in FIGS. 12-A and 12-B.

We can easily visualize that the right hand side half of the flat sheet, including the centre conductor, is similar to the flat sheet configuration shown in FIGS. 13-A and 13-B. The current will flow from the centre conductor 1411 or 1431 to the "right" outermost conductor 1415 or 1435, i.e. in a left to right direction, i.e. from the PEE material, 1412 in FIG. 14-A, or 1432R in FIG. 14-B, to the doped semi-conductor 1414 or 1434, to the doped semi-conductor 1415 or 1435, to the right full conductor 1415 or 1435, and finally to the Load 1416 or 1436. Now, if we add to the left of this, a similar composite structure, but in a "mirror image" configuration, except that the p-n semi-conductor 1417, 1418 or 1437, 1438 will be in the same direction as the p-n semi-conductor 1413, 1414 or 1433, 1434 in the right hand half, then the current could flow again from left to right, whenever the stresses dictate this flow direction, i.e. the current now would flow from the "left" outermost conductor 1419 or 1439 to the centre conductor 1411 or 1431. Hence, Full-Wave rectification. This will be electrically comparable and equivalent to the condition shown in FIG. 12-A. Note that in FIG. 14-B, I have split the PEE in two separate parts, the first part 1432R is on the right hand side of the common conductor 1431, and the second part 1432L is on the left hand side of the common conductor 1431.

Embodiment

FIG. 15 provides an embodiment that looks like a "TV CABLE" or "FLAT WIRE", similar to the well known "TV CABLE", which could have the well-known "dog bone" cross-section. This embodiment is the "cable version" counterpart of the FLAT SHEET version shown in FIG. 14 and provides a "FULL WAVE" output configuration as well. The lower figure, below the cable, is a duplicate of FIG. 14-A.

In all the above figures, as well as the other figures in this specification, the cross-sectional area of the conductors and other components should be calculated and designed to accommodate the expected current flows. This is standard prior art practice.

Embodiment

Figure 16:
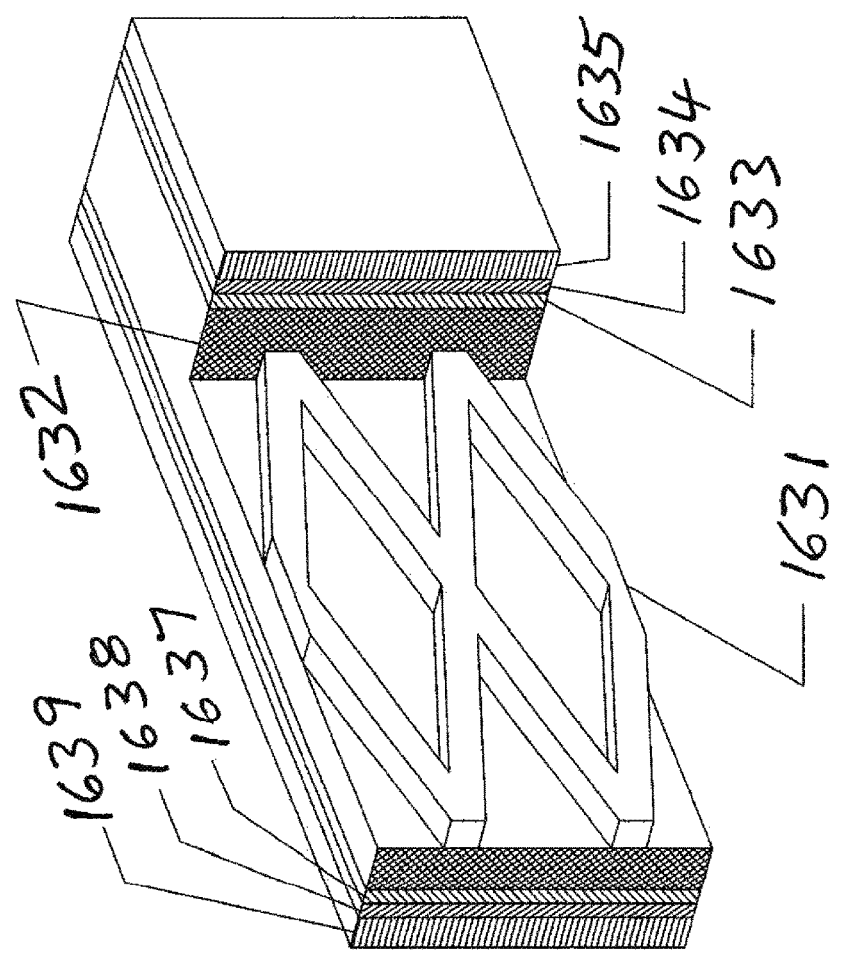

FIG. 16 shows one way to impart more "FLEXIBILITY" to the embodiment shown in FIG. 14. The centre conductor 1631 is shown to be made like an expanded sheet metal, to make it easier to flex, bend, stretch or contract.

A similar approach can be used to increase the flexibility of any of the other layers shown in the above constructions. However, there should be at least one layer or component, which will be kept in a shape, that will ensure the strength and integrity of the device, so that it would not fail or break down and fall apart, if exposed to high forces exerted on the device. This could be referred to as the "back-bone" of the whole structure. This back-bone element can be made of a high strength material and could be located at one side of the cross-section and of course would extend through the whole length of the device. It could also be made out of what is known as Super Elastic material. This applies especially to the embodiments in the shape of cables or ropes to hold down posts and the like. See further down below. See for example, FIGS. 13-C, 15 and 52.

Note that the semi-conductors 1633, 1634 and 1637, 1638 and the other components, i.e. the PEE 1632, the full conductors 1635 and 1639, in all the above can preferably be made of a continuous material for ease of manufacturing. For example, they can be in the shape of continuous sheets which would be laminated together, say in a hatch mode or a continuous, reel to reel process.

In some cases, certain number of these layers can be either vapor deposited, extruded, laminated, etc., one on top of the other. All these methods are well known in the prior art.

Figure 17:
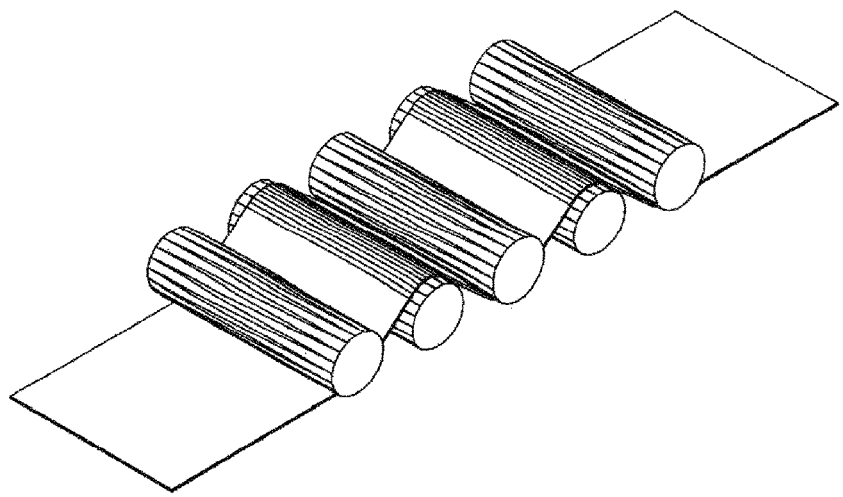
Figure 18:
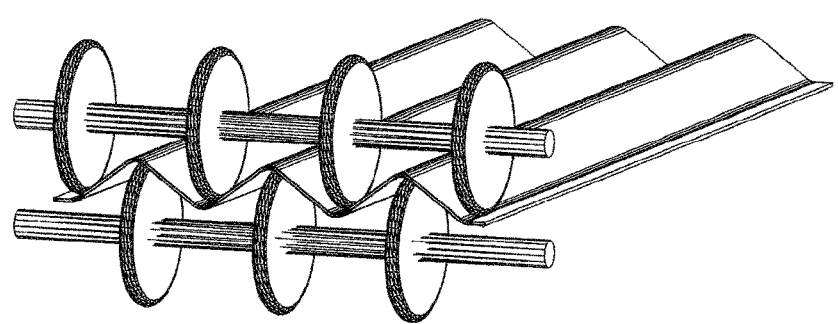

Another or an additional way to allow us to capture individual electrical charges, is to break the structure of the conductors, and especially the semi-conductor layers, into smaller segments, so that each individual segment would capture/harvest the individual charges generated by the smaller areas of the PE element or the PE sheet adjacent to them. In order to achieve this purpose, I propose a number of alternatives: One alternative is shown in FIG. 17. A second alternative is shown in FIG. 18. A third alternative would be a "combination of both alternative two and three together, let's say in tandem. Other alternatives include individual discrete semi-conductors mounted/disposed on the flexible Kynar and any other flexible electronics materials. Alternative One: As is shown in FIG. 17. Here we could run the composite structure, as shown in FIGS. 13-B, 13-C, 14-B, 15 and 16, across and between a set of rollers as in FIG. 17, so that the deposited or applied layers of semi-conductors would break into smaller segments, mostly in a direction parallel to the axis of the rollers. These could be cracks or indentations, so as to create some separations in the semi-conductor material to at least create strips or sections or islands of semi-conductor material.

We would refer to these as "Transverse" cracks. We would run some experiments to determine and select the optimum sizes/diameters of the rollers, the spacing between the rollers, and the relational position of the rollers with respect to each other, both in the vertical and the horizontal direction and to see the effect on these selections on the segment size of the semi-conductors. The selection would also be dependent on the characteristics of the semi-conductor material, e.g. its rigidity, brittleness, thickness, dryness, etc. In other words, we will try to break or at least crack the layers of p-n diode material, to create smaller, isolates "islands" and preferably at least electrically separate them from each other, so that they would conduct only in one direction, normal to the surface of the sheet, but not from one island to the other islands adjacent to it.

Alternative Two: As is shown in FIG. 18. Here, we try to crack the deposited or applied layer(s) of P-N diode, in the "Longitudinal" direction.

Alternative Three: We would run the sheets both as in Alternative One above as well as in Alternative Two above, to ensure that we get even smaller islands, which would be cracked and/or separated both in the "Transverse" as well as in the "Longitudinal" directions.

Embodiments Group #3—Using Flat Sheets, Across the Wind

Figure 19:
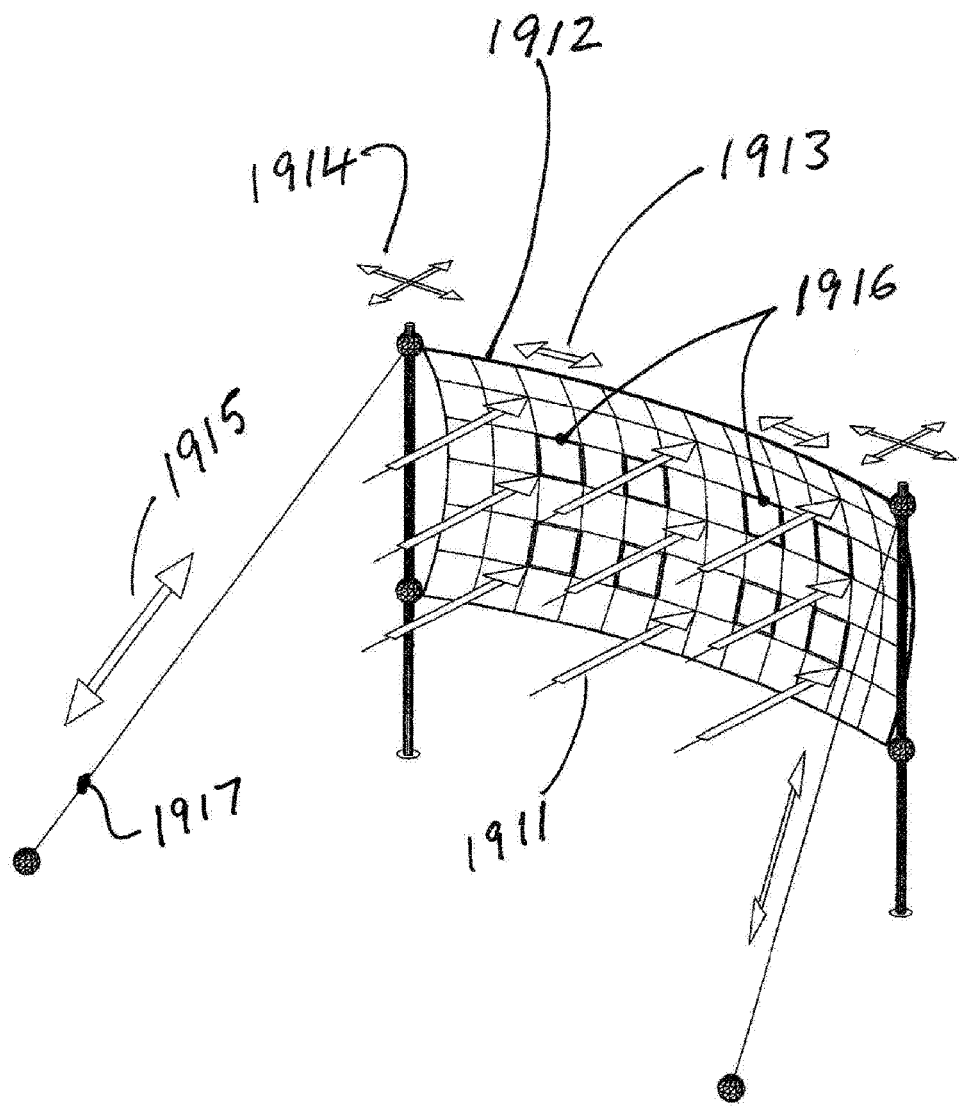
Figure 20:
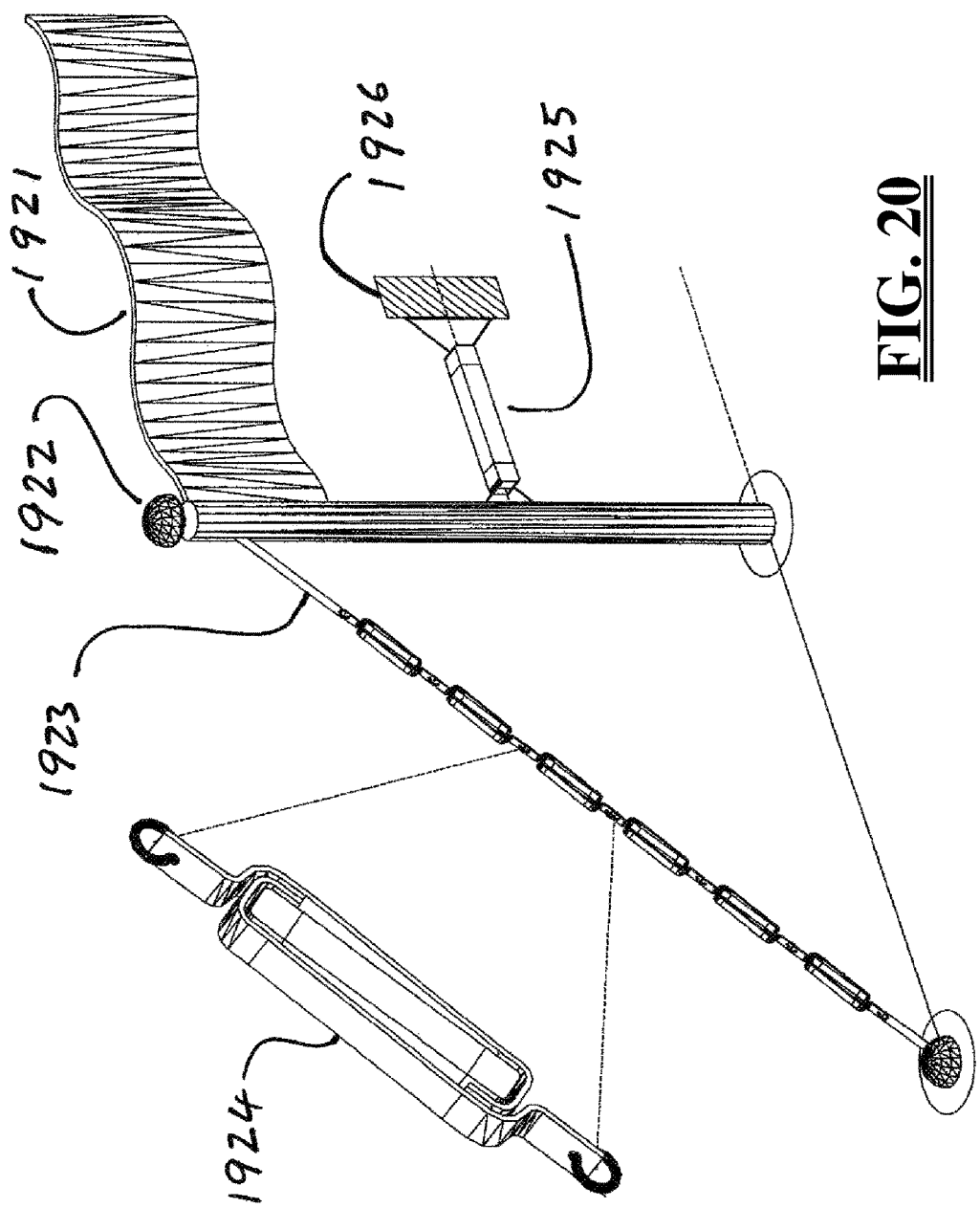

FIGS. 19 and 20 show two things. One, the PE material composite sheet 1912 is in the shape of a sheet hung or spread in a direction, at some angle or ideally perpendicular to the direction of the wind or fluid 1911 that will try to move or shake the sheet. The sheet will have a similar construction or cross section as in FIG. 13-B, 14-B or 16. It is mounted say between two vertical posts, in the path of the wind. If the wind moves the sheet, it will stress the sheet and create some stresses in it, in the direction of the arrows 1913, then the PE elements, built in the sheet, will be activated, and will generate the expected electricity, which will then be rectified as explained above, and the resultant DC current/power will be diverted to an appropriate storage device or used immediately for any proper usage, e.g. to heat water, or to light an electric bulb or the like.

Another possibility is to use cables, 1917, with similar construction or cross section as in FIG. 13-C or 15. When the sheet 1912 is shaken by the wind, it will be stressed in the direction of the arrows 1913, which will induce the posts to be shaken in the direction of the arrows 1914, thus the cable 1917 will be shaken and stressed in the direction of the arrows 1915, thus the cables 1917 would be generating some desirable energy. The whole idea is to get the wind to "shake" the sheet and create the resulting electric power. We could create some "apertures" 1916 in the sheet, to increase the turbulence of the wind going through, thus creating more vibrations in the (sheet) material 1912 and consequently more electricity. We can have "box" shapes, like the "box kites" or similar shapes with contraption that could "multiply" the shaking effect of the wind, thus multiplying the amount of generated power. Such kite constructions are also known in the prior art.

Embodiments Group #4—Using individual PE elements, along the "Tie-Down" cables, holding a structure across the wind force or the like.

FIG. 20 shows some additional features that can be incorporated in the arrangement shown in FIG. 19, or can be used independently.

In FIG. 2, we see a tie-down cable 1923 holding/supporting the vertical post, which in turn is holding the flapping cloth or flag 1921. This tie-down cable is shown pulling the post toward the left hand side of the figure. This tie-down cable can be instrumented so as to have one or more PE Element in line or in tandem with the cable as shown in FIG. 20. An example of a PE Element 1924 here is a PE Element that can be activated under compression, e.g. a ceramic kind of PE element.

Another such a PE element is shown in FIG. 20, to the right side of the post. It is part #1925. It is shown, being located between the post 1922 and a wall 1926, which is on the farther right side of the figure. Again the PE element in this case is being activated under compression. This approach can be used also with any structure exposed to such movements. Examples include tall buildings, skyscrapers, trees, as well as the 2 posts in FIG. 19, which are moved as per arrows 1914, and the like. Also floats on top of bodies of water, where the float would be equivalent to the moving post 1922 and the fixed anchor say at the bottom of the sea would be equivalent to 1926.

Figure 21:
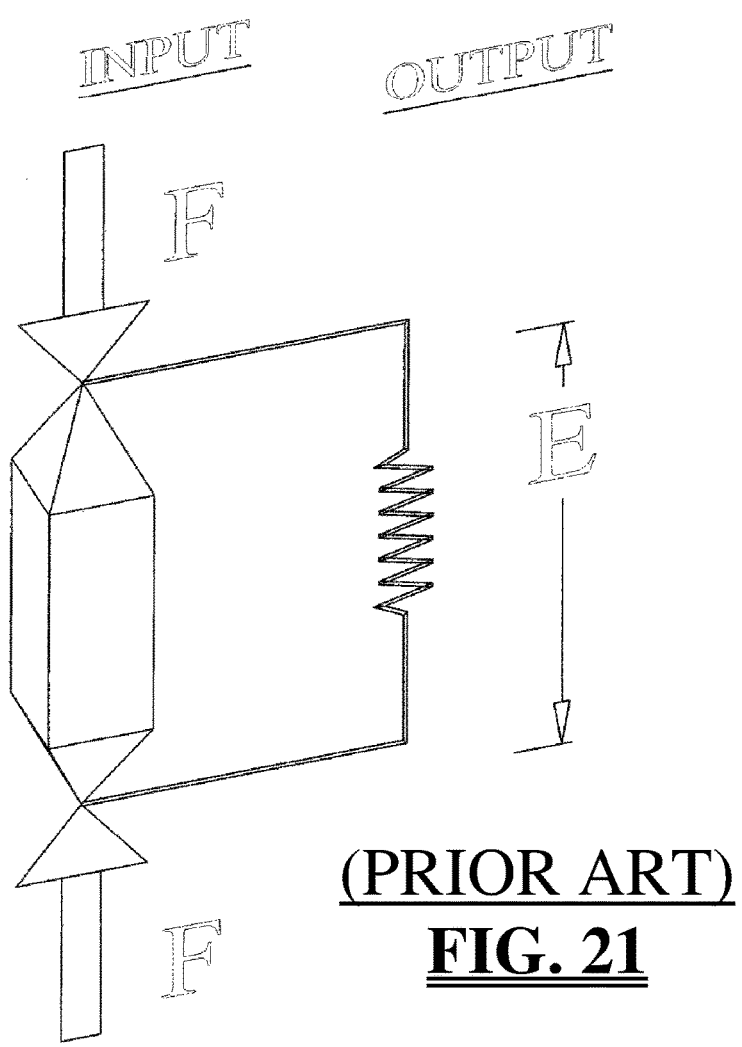

FIG. 21 just shows the basic principle of PE Elements being under a compression load F, which then created an electric potential, E, between the two ends of the PE element.

Embodiment—Power from Roads

Figure 22:
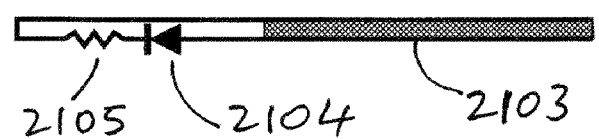
Figure 23:
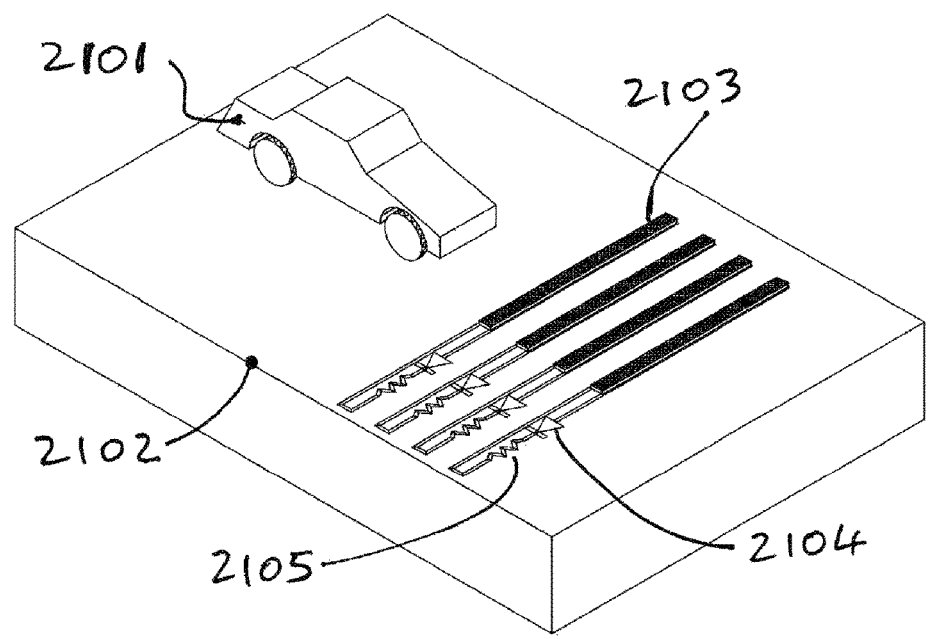

FIGS. 22 and 23 illustrate another embodiment. They show how we can generate electric power as a result of cars driving over a road pavement, which has been provided with Piezo Electric material.

FIG. 22 shows the sensor, or rather the energy harvester, and its major components, while FIG. 23 shows the general usage setup.

Here, in FIG. 23, we show a stretch 2102 of a road, which has been instrumented as per present invention. When a vehicle 2101 drives on such a road, and hits the PEEs 2103, the PEEs will generate an electric power, which could be transferred through proper conductors and diodes 2104 and the like, to a load 2105. The generated electric power can then be either stored in battery cells or capacitors, or can be utilized right away, say to turn on a blinking traffic light ahead of the vehicle, at an upcoming traffic intersection or the like.

Figure 24:
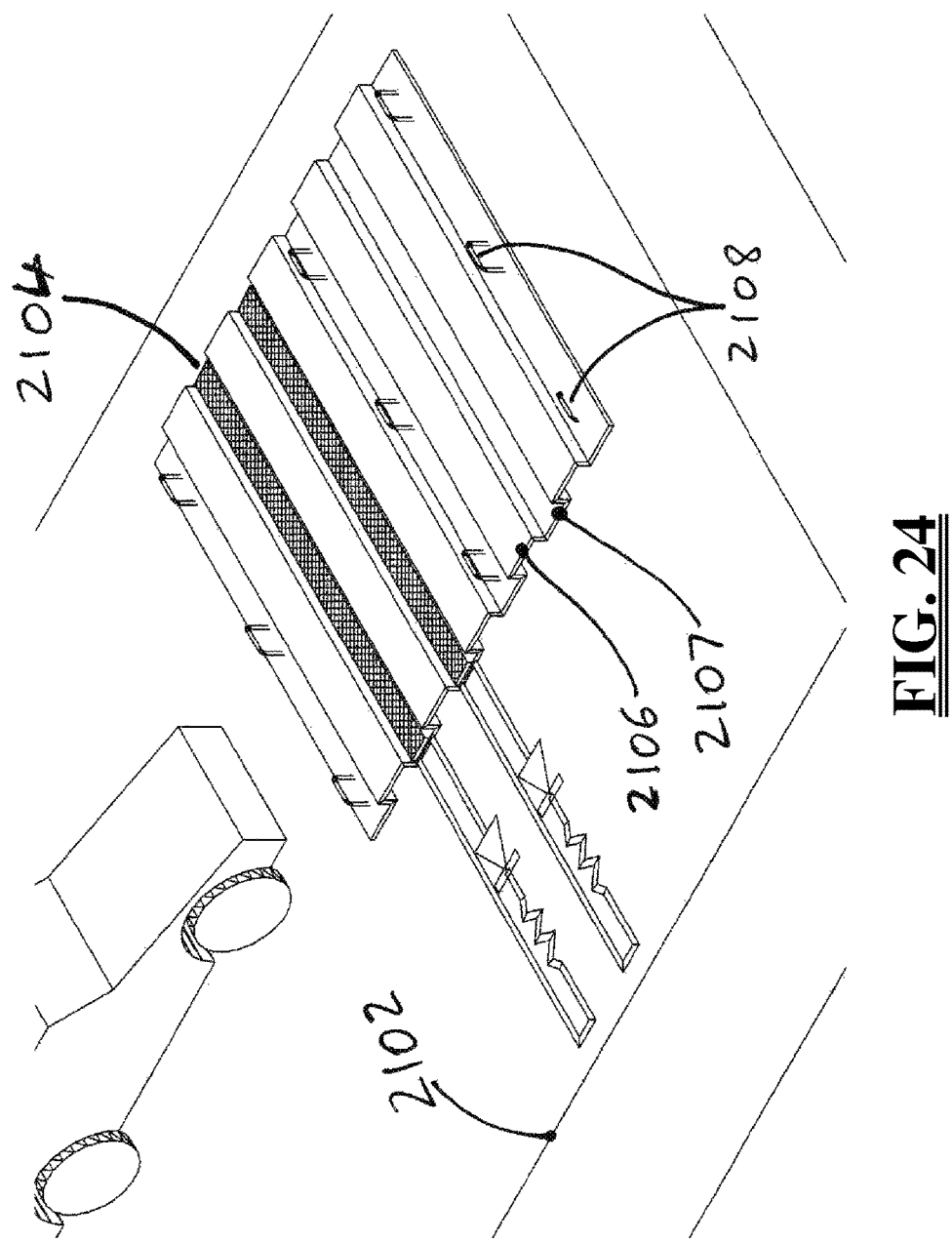

FIG. 24 shows a way to create a corrugated surface 2106, 2107, which can be placed at certain location of a road, and which can be utilized to generate electricity at the same time.

For example, we have an intersection near where I live, where the road approaching the intersection has been provided with grooves 2107 across the road, to create vibrations in the car and in turn to alert the drivers of the approaching intersection. There are 4 or 5 groups of such grooves, placed at various distances between each grove and between each group of grooves.

These grooves have been carved out of the pavement. The pavement can be made of concrete or asphalt, and carving out these grooves can be difficult and costly.

I propose to use some sheet metal 2106, 2107 and form it with a machine, like the ones used to form rain gutters or the like. Then these sections of corrugated sheet metal can be placed on the road surface and nailed down or stapled down 2108. If necessary, we can use a stapling gun, to drive special nails 2108 into the concrete pavement, like the guns used in building construction.

Now, we can apply PE elements 2104 to the corrugated sheet metal and utilize the energy of the vehicles that will be driving over them to generate electric power, in a way similar to what I am describing in the present patent application, or equivalent.

Embodiment

Back to FIGS. 19 and 20.

FIG. 19 shows the material 1912 between the two posts as a solid sheet of PE material, with the exception of the apertures 1916. However, we can easily visualize that this material 1912 can be replaced by a net, like say a volley ball game net or a tennis game net. The net can have wide strings to catch the wind, or the whole net can be of a material, like canvas, dense and solid, which would bring us back to the original material 1912 in FIG. 19. The net will be stressed in different directions, mostly where the fibers would be under tension. The fibers or strings can be instrumented, to generate electric power when exposed to this tension. A possibility is to make the fibers as shown in FIGS. 13-16, or just as films as in FIG. 13-B, 14-B or 16, or as any of the other Figs in this application, or as any other construction in the prior art.

Another difference in FIG. 20 is that I am showing a lot of PE Elements 1924 on the tie-down cables 1923. We are not limited to using only one such a PE element.

We can place them one behind or after the other, like in a chain, as shown. Each one of these PE elements 1924 will feel the same pull on it, as the pull that will be exerted on each and every one in the "CHAIN". Each one could be instrumented and the generated electric power can be collected, either in series or in parallel, down to a collecting or storage device, or to be utilized right on the spot.

Figure 25:
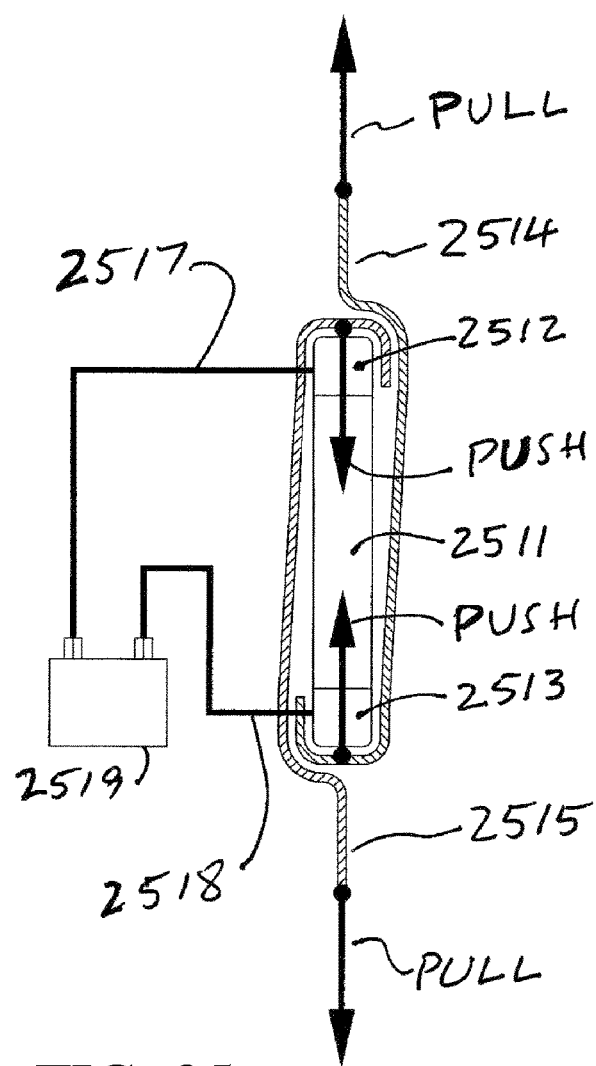

FIG. 25 shows a detail, as to how to convert a PULL FORCE on the cable, to a PUSH or COMPRESSION force on the PE Element. This system is a simple trick that has been used in the prior art extensively. For example, some storm doors that are mounted in front of outdoor doors have a safety feature, where if the door is pulled open by a strong wind, a chain is provided to stop the door and to prevent it from getting damaged. The chain usually has a spring arrangement to dampen the sudden force of opening the door. The spring in the chain is a compression spring, but because it is mounted in a contraption similar to the ones shown in FIG. 25, it gets actuated as if is under tension.

Here is one way this would be built. A PEE 2511 with its two end conductors 2512 and 2513 are captured between the two hooks 2514 and 2515, as shown in FIG. 25. When a pull force, PULL, PULL, is applied at the end of each one of these two hooks, the PEE and its two end conductors will be compressed, as illustrated in FIG. 25, by the two arrows, PUSH, PUSH. The two end conductors will then conduct any electrical charges, generated by the PEE 2511, via the two conductors 2517 and 2518 to a storage device 2519.

Of course, we can place the PEEs under tension, and we should expect them to generate electric power the same way. But, my feeling is that the PEEs would last longer, i.e. would have a longer operating life, if the PEEs are stressed under compression, instead of tension.

FIGS. 26-A, 26-B and 26-C illustrate the effect of tension or pull, applied on a clevis or similar contraptions, and how it can create compression, shear and/or bending in the individual components. We can visualize that we could take advantage of this phenomenon, to create energy, by instrumenting the components as per present invention.

Figure 27:
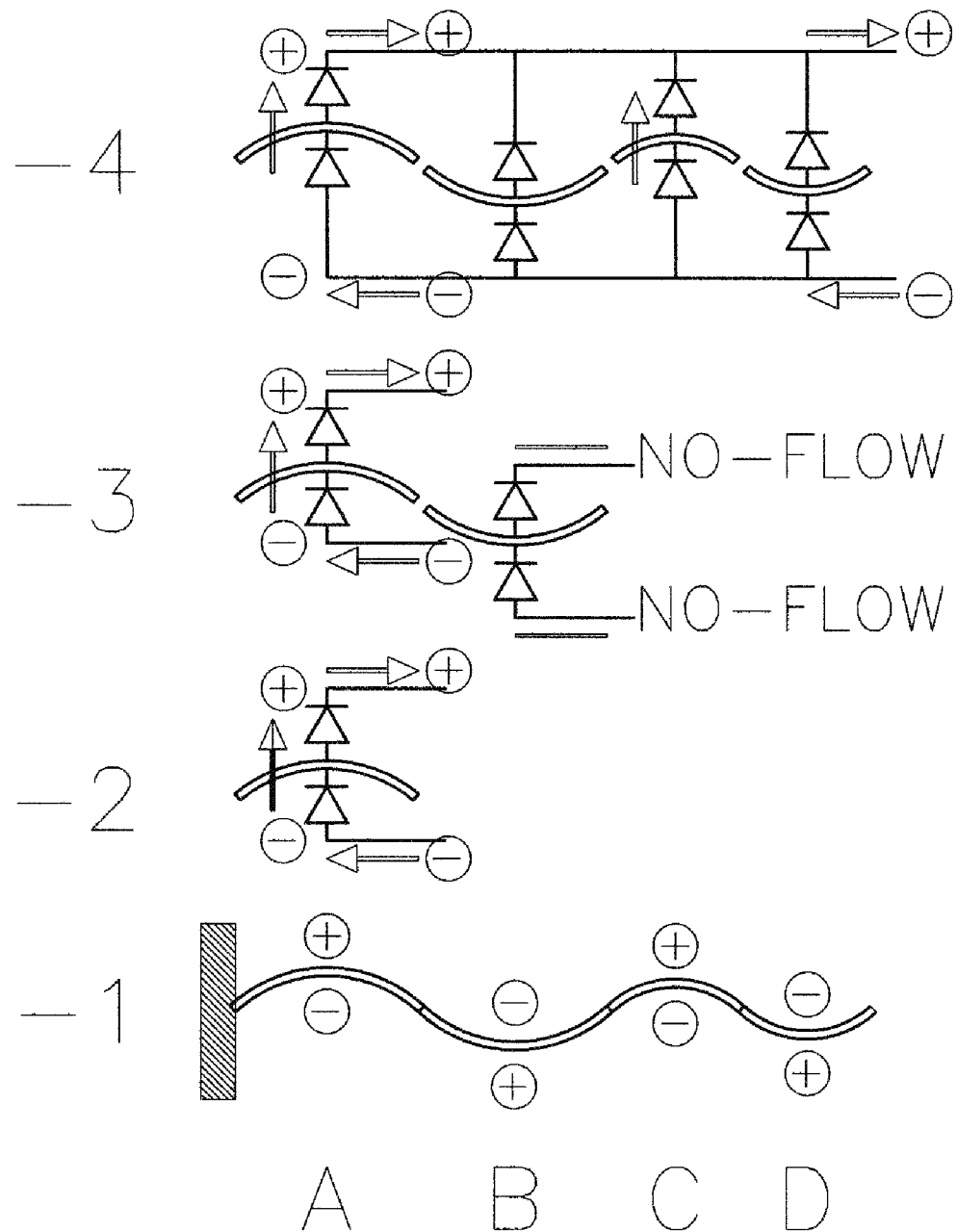

FIG. 27 just re-iterates, reinforces and elaborates on what was covered in FIGS. 3, 6 and 7.

Embodiment—Peep Tree

Figure 28:
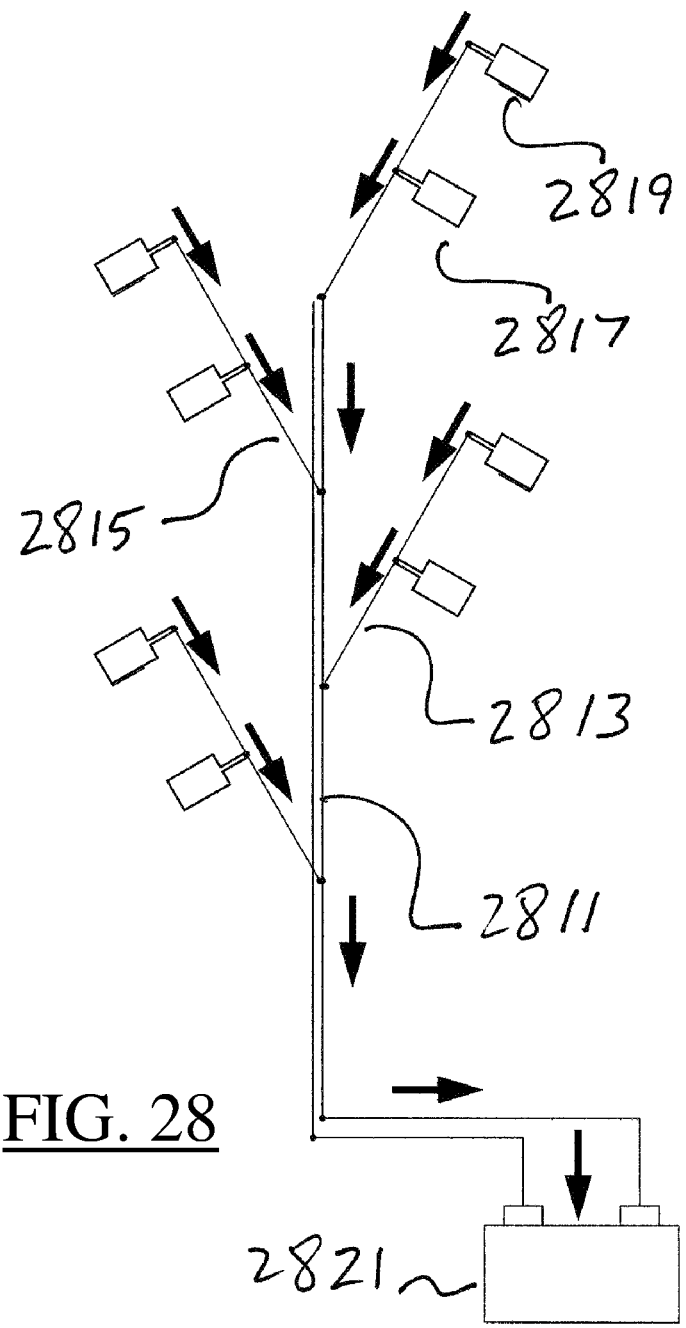

FIG. 28 is what I would like to call the PEEP TREE. The main trunk 2811 will carry one or more branches 2813 and 2815 and each branch will carry one or more leaves 2817 and 2819.

Each leaf will be a device that will generate electric power, utilizing the Piezo Electric Effect Power (PEEP) and the generated electric power will be conducted to a storage device 2821.

I will explain how to get there.

Figure 29:
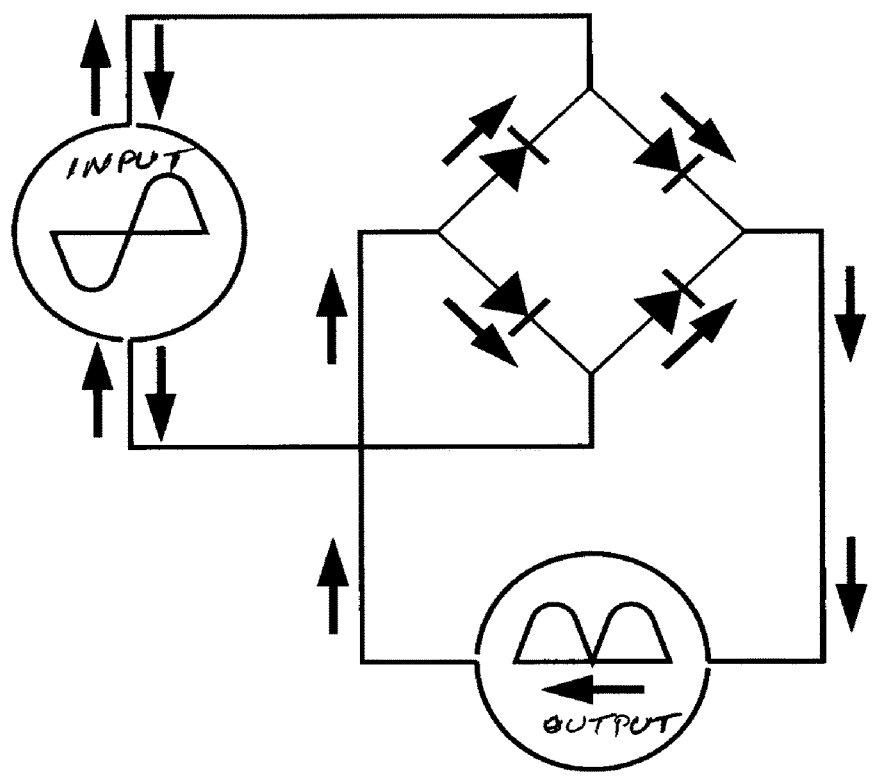

FIG. 29 starts back at the beginning, at the Four Diode Bridge Rectifier. It shows that if we have an input that changes polarity form (+) positive to (−) negative, we can by using the 4-diode bridge rectifier, we get an output that has always the same polarity (Prior Art). It is practically a duplicate of FIG. 2-B.

FIG. 30, Fig A, shows that the input in this case is a PE Element. I will call this the PEEP LEAF. FIG. 30, FIG. B, is identical to FIG. 30-A, except that I have drawn the output circuit in line with the input circuit. This is just to lead into the next figures.

Figure 31:
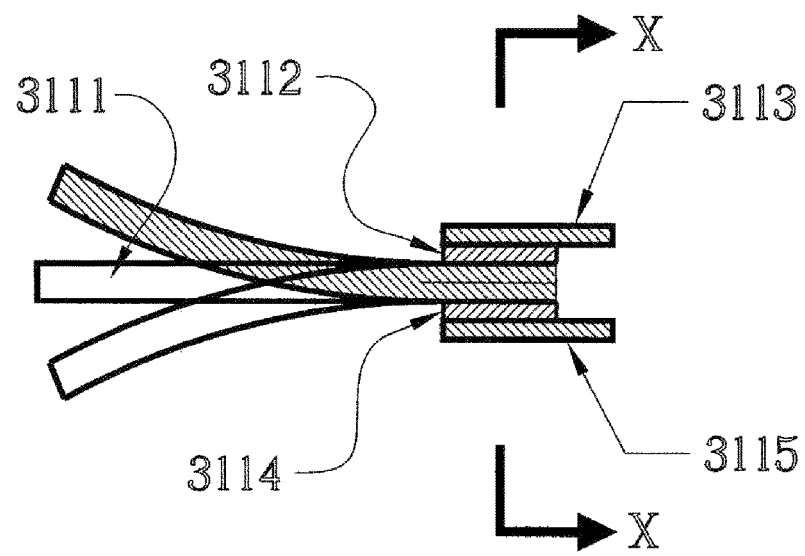

FIG. 31 shows some details of the PEEP LEAF. Part 3111 is the flapping element. I will refer to it occasionally as the flag or the flapper. Part 3112 is an interconnecting element, and part 3113 is a conductor to get whatever power/charges that get generated, to the outside world. Part 3114 is almost similar to part 3112 and part 3115 is almost similar to part 3113. All these parts will be held in place by some clamps and/or mechanical fixation means, with proper electrical insulation in between. Not shown. This is standard practice well known in the Prior Art.

We have a few versions or variations, of all these parts in FIG. 31, i.e. parts 3111 through 3115. These variations will depend on the function that we want out of the device, as they will be described here below.

A—Part 3111 can be an active PEE material or it can be a simple passive material.

B— Parts 3112 and 3114 can be either a passive conductor, or a semi-conductive material, or it can be a PEE material, or a multi-layer made of all these materials listed here.

C— Parts 3113 and 3115 can be either a simple conductor, or a multi-layer made of a semi-conducting material together with a regular conductive material.

In the next pages, I will explain and describe some of the different variations and combinations, that can be created, based on FIG. 31.

Combination 1—Active Flag

See FIGS. 32, 33,34, and 52. Best is to look at FIG. 34, which shows the embodiment in 3D. It makes it easier to follow the description. In this Combination 1, the parts of FIG. 31 will be as follows.

a) Part 3111 of FIG. 31, the flapping member, will be an active PE element, made of a material that exhibits the PE Effect. Sometimes, I will refer to it, as the PE or PEE part.

b) Part 3113 and part 3115 will be regular conductive material, say like copper. However, each one of them is really two separate parts, where one of them is hidden behind the other. If we look at FIG. 34, they will appear as parts ATE and BTE at the top and as parts ABE and BBE at the bottom.

c) Part 3112 will also be two different materials sitting between part 3111 and Part 3113, but the way we see them in FIG. 31, is that one part is behind the other and we cannot see it in this view in FIG. 31. One of these 2 parts is a p-doped semi-conductor material and the other part is an n-doped semi-conductor material. We will see these 2 parts in FIGS. 32, 33, and 34. They will be parts D1 and D4.

d) Part 3114 will also be two different materials, like part 3112, but obviously it is located between part 3111 and part 3115. Again, part 3114 is really two different parts, sitting one behind the other, one is p-doped and the other is n-doped. Again, we will see them in FIGS. 32, 33 and 34. They will be parts D2 and D3.

Let's now study FIGS. 32 and 33.

FIGS. 32-A and 33-A are similar to the prior art, shown in many of the previous figures, including FIGS. 2-B, 29 and 30, but they show the current flow as applicable to the present invention.

In FIG. 32-A, I am showing that the PE has generated a (+) charge, and in FIG. 33-A, it has generated a (−) charge. Now let's look at FIG. 32-B. I am showing a cross-sectional end view of the device shown in FIG. 31, say along the cross-section line X-X, in FIG. 31.

Figure 34:
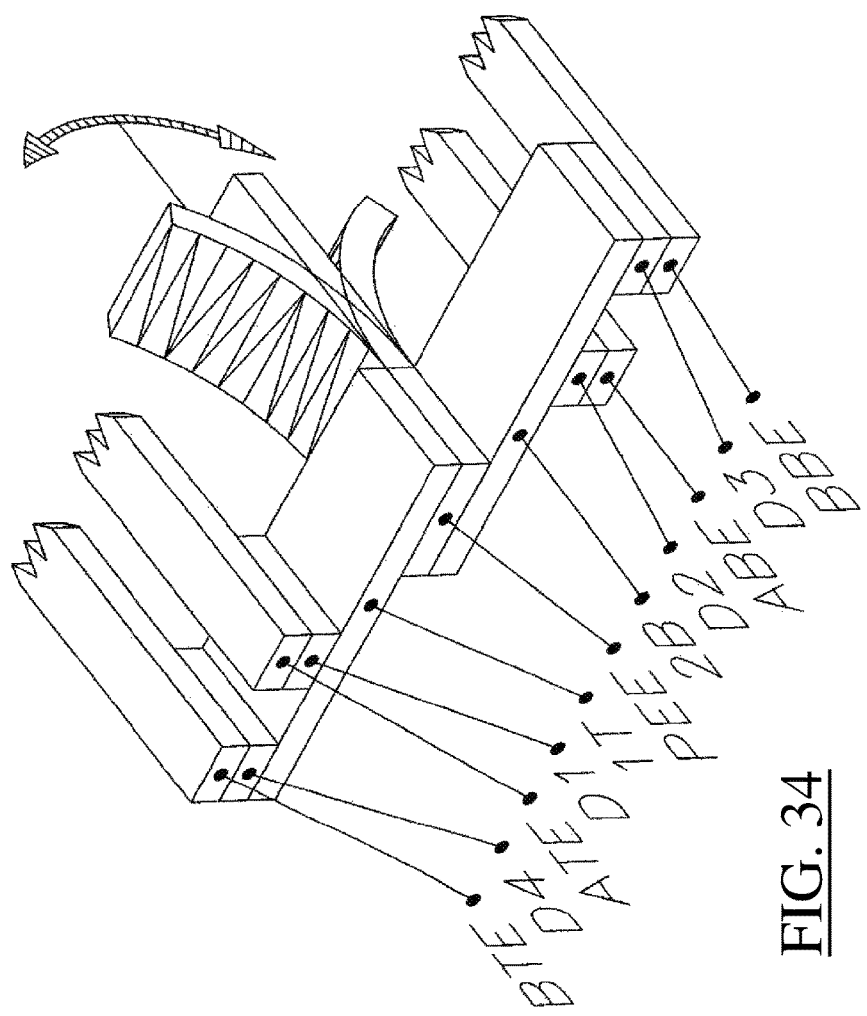

Now, I will describe FIGS. 32-B and 33-B. It may be helpful to the reader, to look at FIG. 34 at the same time, because FIG. 34 shows a 3-D view of a similar embodiment. FIGS. 32-B and 33-B are more concerned about the electrical flows, while FIG. 34 is more concerned about the physical shapes of the components and the interaction between them.

In FIGS. 32-B and 33-B, the central part marked PE is equivalent to part 3111 of FIG. 31. It is marked PEE in FIG. 34. In these figures, it will be referred to as PE or PEE, to mean a similar thing.

Part 3112 of FIG. 31 is now represented in FIGS. 32-B and 33-B by the two parts D1 and D4. Same in FIG. 34. D1 is a semi-conducting material that is (+) doped and forward biased, and D4 is a semi-conducting material that is (−) doped or Reverse Biased.

Part 3113 of FIG. 31 is now represented in FIGS. 32-B and 33-B by the two parts A and B, and in FIG. 34 by the two parts ATE and BTE. They are regular conductive materials, but they are separate form each other, i.e. not connected electrically to each other. I will call item (A) as the (+) upper bus-bar, and item B as the (−) Upper bus bar.

You notice that in FIGS. 32-B and 33-B, there is an item (1) on top of the PE element, underneath items D1 and D4. This is just a regular conductive material item, that I have added to spread the electric charges from the PE element to the other 2 items above it. It is not shown in FIG. 31. It is optional, just to make sure that we would have a good connection between the parts. This is equivalent to part 1T in FIG. 34.

On the lower part of FIGS. 32-B and 33-B and of FIG. 34, we have an almost mirror image of the upper part, with only a few differences.

Part (2) is similar to part (1), being simply a regular conductor to ensure good electrical connections between the parts. This is equivalent to part 2B in FIG. 34.

Below part (2), we see 2 parts, D2 and D3. D2 is a (−) doped semi-conductor, or REVERSE BIASED, and D3 is a (+) doped semi-conductor or FORWARD BIASED. These are equivalent to D2 and D3 in FIG. 34.

Finally, we see another pair of conductors, regular conducting material, e.g. copper, named (A) and (B). They are equivalent to parts ABE and BBE respectively in FIG. 34. (A) is the (+) Lower Bus Bar. (B) is the (−) Lower Bus Bar. (A) and (B) represent part 3115 in FIG. 31; and D2 and D3 represent part 3114 in FIG. 31.

D1, D2, D3 and D4 in FIGS. 32-B and 33-B, represent the DIODES D1, D2, D3 and D4 in FIGS. 32-A and 33-A.

PE in the Lower Figures represents the PE in the upper Figs, and W, the load, in the lower Figs represents W in the Upper FIGS.

Now, let us see what happens when the PE element is activated. Frequently in this discussion, we will refer to this PE as the Source PEE or simply as PEE. Let's look at FIG. 32-A. Say the PE element is activated in a way that it is sending a (+) charge to the system. The (+) charge will move from point (1), which is equivalent to part 1 in FIG. 32-B, at the top of the Source (PEE) to the top of the diode bridge, also called point (1), because it is electrically connected to point (1) at the top of the PEE.

Now the current will try to flow down along the 2 branches of the bridge, trying to get to point A and point B. However, it can really flow ONLY into the right hand side branch (1)-(A), because the Diode D1 is FORWARD BIASED (+) doped purposely so, so as to allow the current to flow. The Diode D4 is biased so that it will not allow the current to flow in the LHS branch.

Now, at point (A), the current cannot flow to point (2), because the DIODE D2 will not allow it. So, the current will flow down to point (A) at the load W.

From there, the current will get out of W at point (B) and go to the Bridge at point (B). The current will then flow to point (2) at the bottom of the bridge and from there to point (2) at the bottom of the PEE, to close the circuit.

Let's now look at FIG. 32-B, the lower figure of FIG. 32. Let's look at the cross-section. Diode D1 is forward biased, as well as diode D3. Diode D2 and diode D4 are reversed biased.

If the PE element is activated to generate a (+) charge/current, as in the top figure, FIG. 32-A, then the current will flow as shown by the arrows. The current will flow from the PEE, to conductor (1), then through diode D1, to conductor A, then through some wiring to point A at the load W. From there, it will go out at point B at the load W, to the conductor B at the cross-section, then through diode D3, and then though conductor (2) back to PEE to close the circuit. This is identical to the flow shown and described for the top figure FIG. 32-A.

Now let's go to FIG. 33

We can follow the flow of the current in this case, where the PEE is activated to generate a (−)ve charge/current.

By following the arrows, as we did for FIG. 32, we can see that the flow through the load is in the same direction as it was in FIG. 32. However, there is a difference.

In this FIG. 33-B, we can see that the current is flowing through D2 and D4, not through D1 and D3. This is because D2 and D4 are reverse biased and would allow this (−) charge/current to flow through them.

So, we can see that this CONSTRUCTION of PEE and its surrounding components, as shown in the cross-sections of FIGS. 32-B and 33-B, and in FIG. 31, accomplishes a number of things.

First, it creates a "SELF-CONTAINED" generator of electric power. It comprises all the elements necessary to control the flow of the electric power in the proper and desired directions, and to help in generating and harvesting the electricity from the PE Element. It contains and comprises all the components required to execute all the functions necessary for its operation. Second, it is designed to facilitate its manufacturing and production and its utilization.

FIG. 34 shows an example of how we can implement the design shown in FIGS. 31, 32 and 33.

We can see all the components, namely the PEE, the Conductor 1T on top of the PEE, above/on top of the PEE; and the conductor 2B below the PEE; and on top of conductor 1T, we can see the diode D1 and the Bus Bar Out ATE and the diode D4 and the Bus Bar IN BTE, Below the conductor 2B, we can see the diode D3 and the Bus Bar (+) BBE, and the diode D2 and the Bus Bar (−) ABE.

The only difference between FIG. 34 and FIGS. 32 and 33, is the location of the components with respect to the PEE itself. In FIG. 34, I have extended the conductors 1T and 2B, so that the diodes and the bus bars will be at the sides of the PEEP LEAF. This way, we can have a number of such PEEP LEAVES IN SERIES, while the bus bars will stretch along the 2 sides of the leaves.

Figure 50:
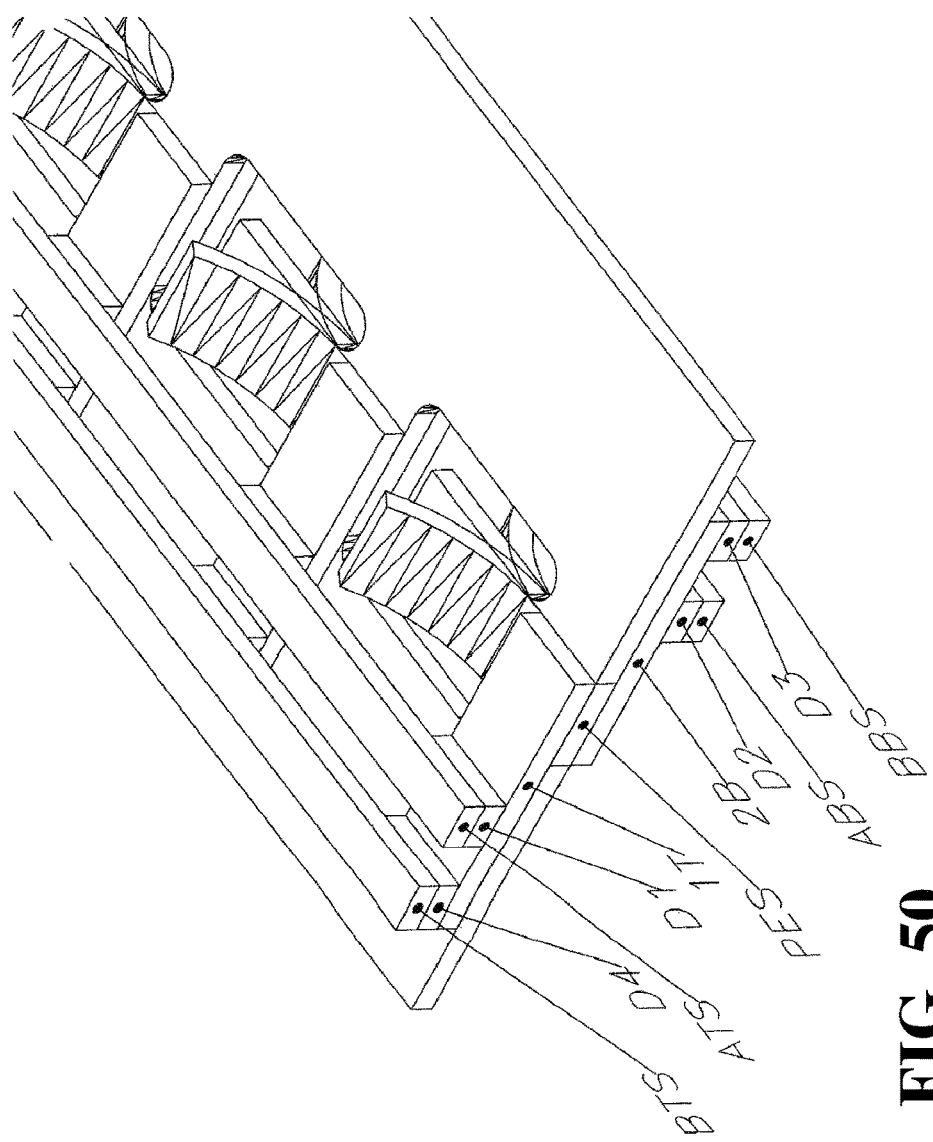
Figure 51:
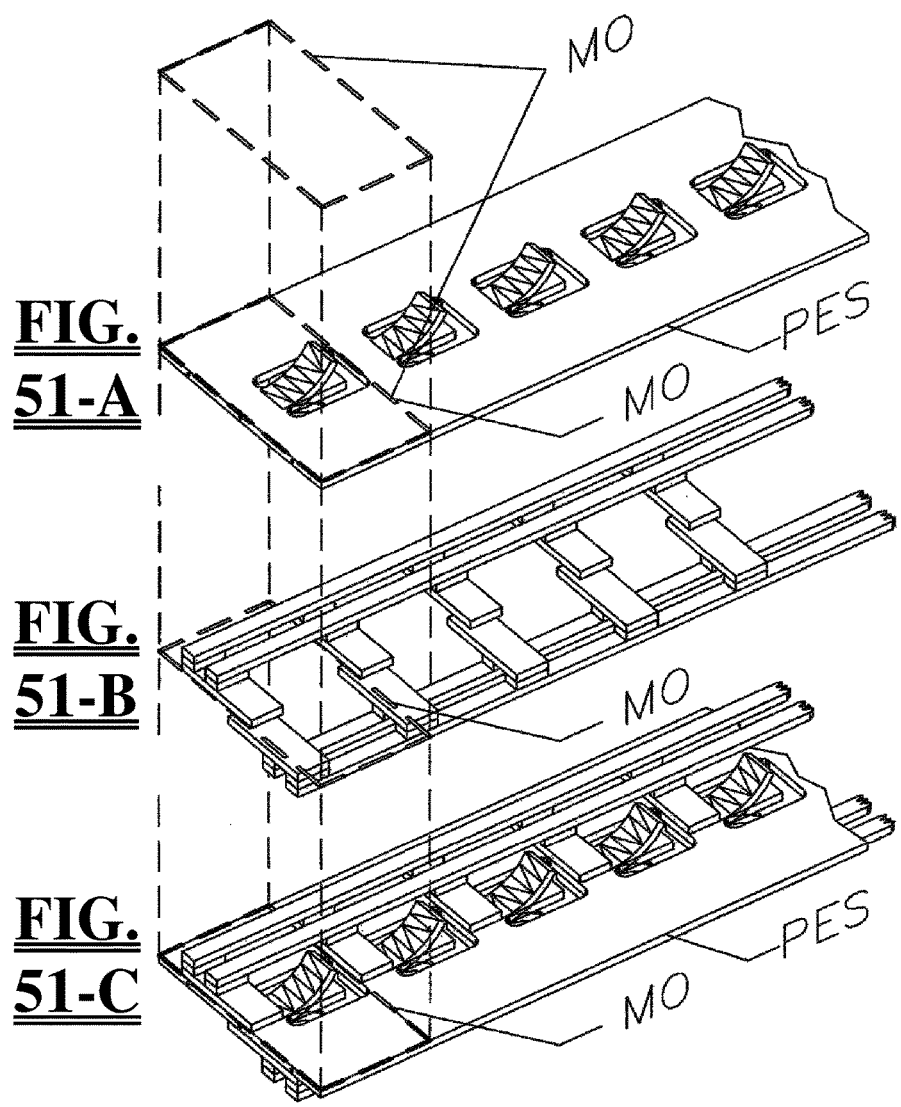

This will be more appreciated, when we will look at FIGS. 50 and 51-A, 51-B and 51-C.

The Peep Tree

FIGS. 35 through 42 give an example of a PEEP TREE.

Figure 35:
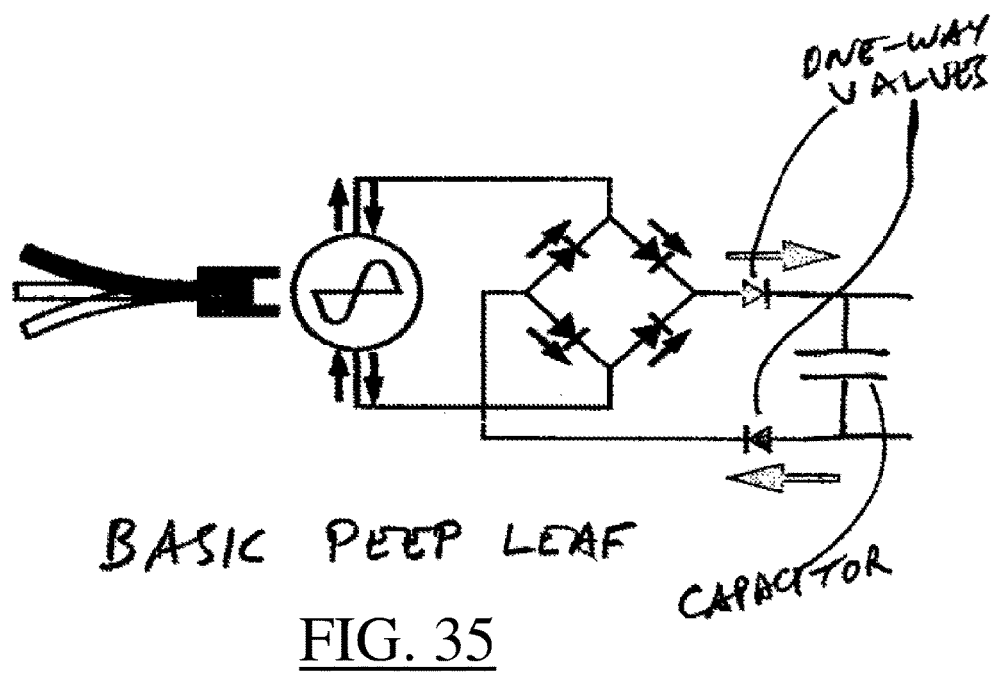

FIG. 35 is the basic module. It is built similar to the device shown in FIGS. 31 through 34 and subsequent embodiment and of the basic module. Here, I am showing the PEE together with its 4 diode bridge rectifier, i.e. all what is shown in FIGS. 31 through 34, but without the load W, which was shown in FIGS. 32 and 33.

PS: Later, I will show in FIGS. 43 through 48-C other embodiments of Leaves, equivalent to the one shown here in FIG. 35, but they can still be incorporated in the shape of the trees shown in these FIGS. 35 through 42.

Figure 36:
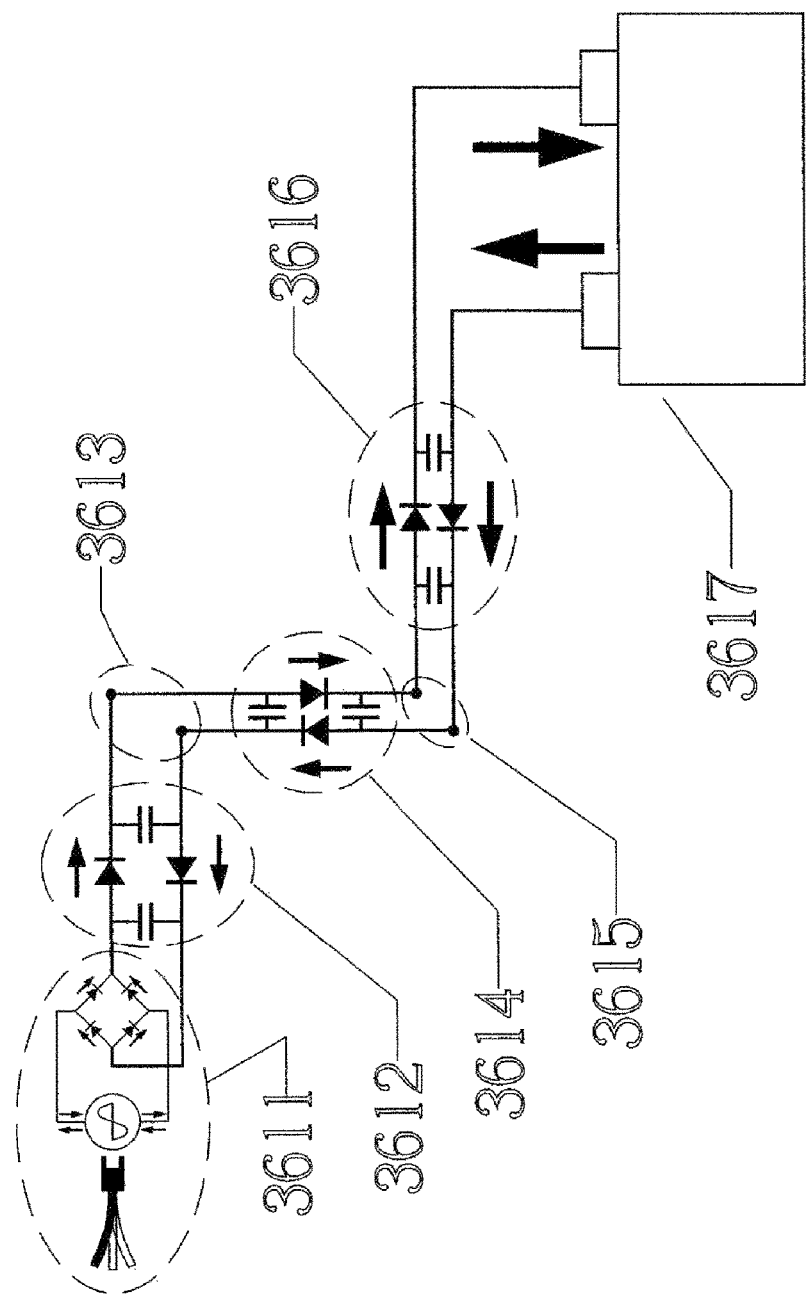

FIG. 36 shows the same basic module as the one shown in FIG. 35, together with a few other supporting components.

First, we see a Storage Device 3617.

Second, we see a number of conducting wiring or cables, starting at the basic module, going to a First Level Junction Point 3613, then going to a second level junction point 3613, then to a third one and so on, until it reaches the storage device. We also see a number of diodes 3612, 3614, and 3616 along the conducting wiring, which I call "ONE-WAY VALVES".

We can also see a number of capacitors, to balance the circuit. These can be selected and designed by any person skilled in the art.

The next figures will explain the functions of these components and expand.

Figure 37:
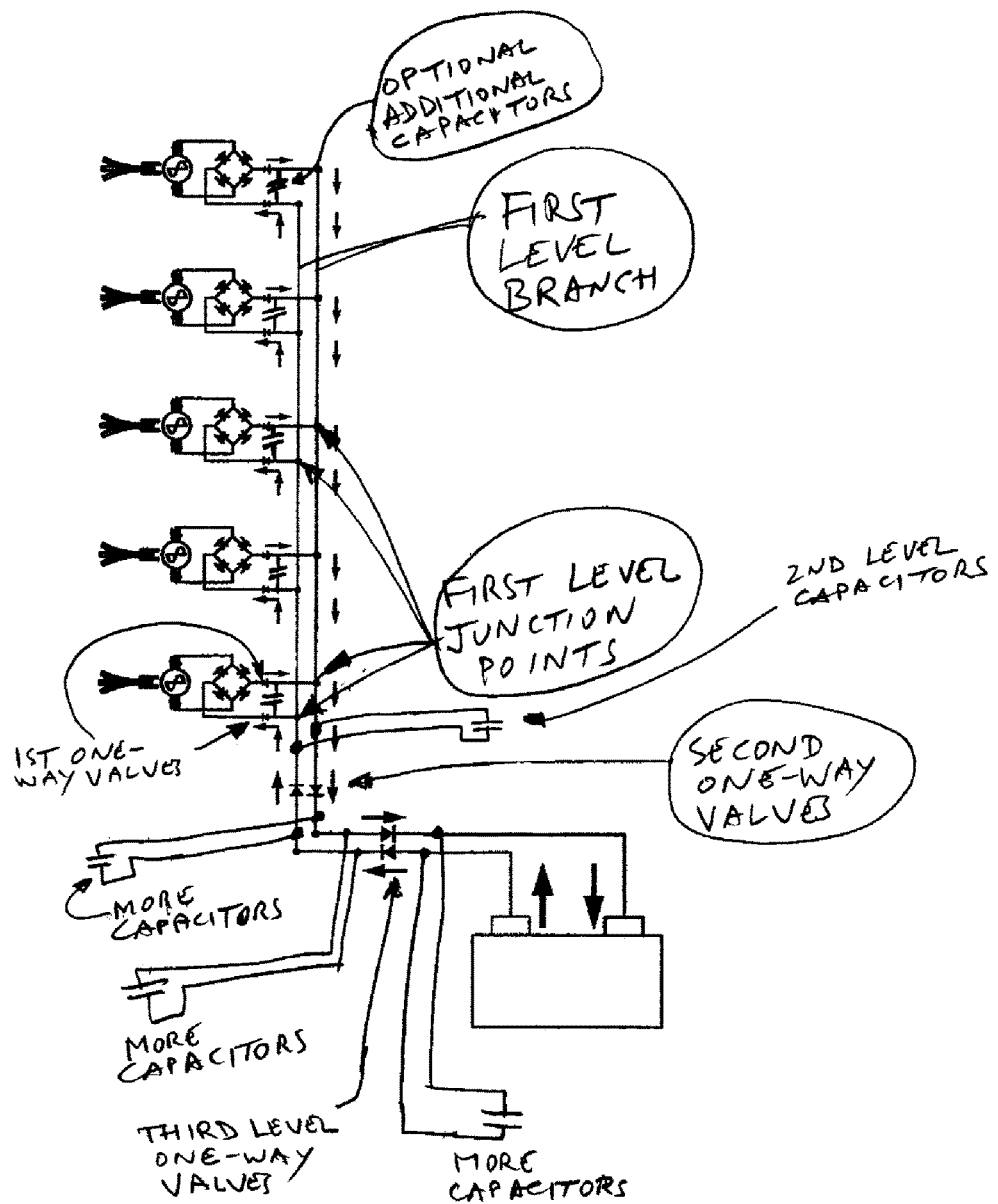

FIG. 37 shows what I call the First Level Branch. And it is a top first Level branch. It shows a number of basic modules working together, along what I call a first level branch. The branch acts as a conduit, or a Trunk-Line, if you will, connecting these basic modules, which I called the PEEP LEAVES. The branch collects the outputs of the individual PEEP leaves and conducts these outputs ultimately to the storage device.

We cannot expect that all the different PEEP LEAVES will vibrate in synch. Rather, we can expect that some leaves will generate Positive charges at a certain instants of time, while some other leaves will generate Negative charges at those exact same instants of time. We do not want these different charges to cancel each others out. So, we put in line what I call "ONE-WAY VALVES", as shown. In this case, I call them the FIRST LEVEL ONE-WAY VALVES or simply the first one-way valves. They are disposed between the basic PEEP Leaves Modules and the 1st Level Branch, between the basic modules and the First Level Junction Points. They are shown more clearly in FIGS. 35 and 36.

Figure 38:
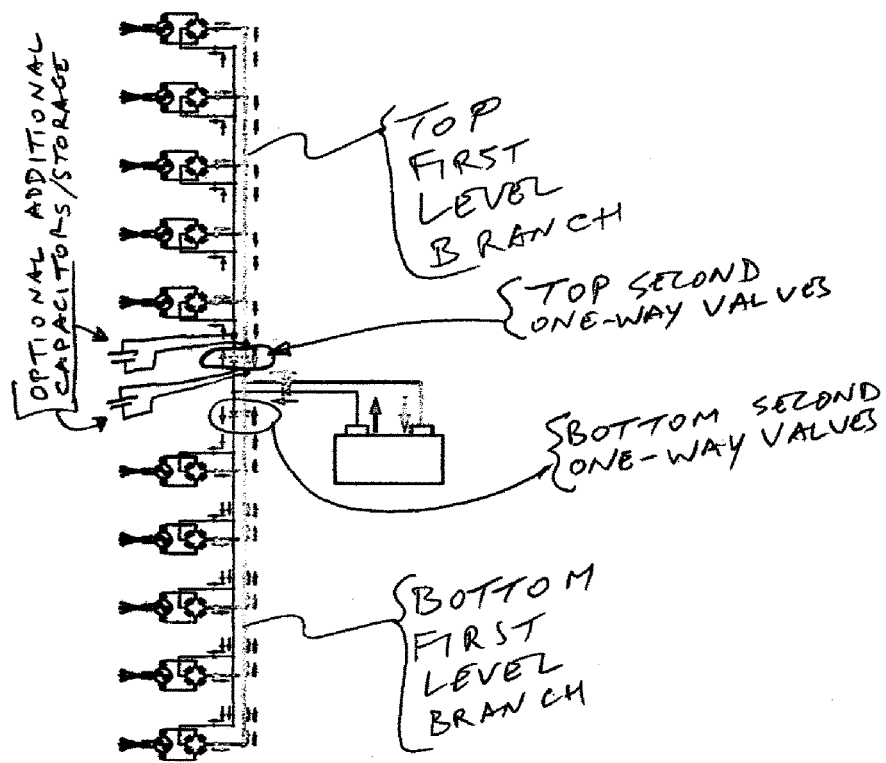

FIG. 38 shows two First Level Branches, one top first level branch and one bottom first level branch. The top branch is similar to the one shown in FIG. 37, and the bottom branch is a mirror image of the top one, with respect to the line going to the Storage Device.

We can see that we have 2 sets of one-way valves, each one located at the mouth of each branch, where it joins the next level branch, in this case, the branch going to the storage device.

Figure 39:
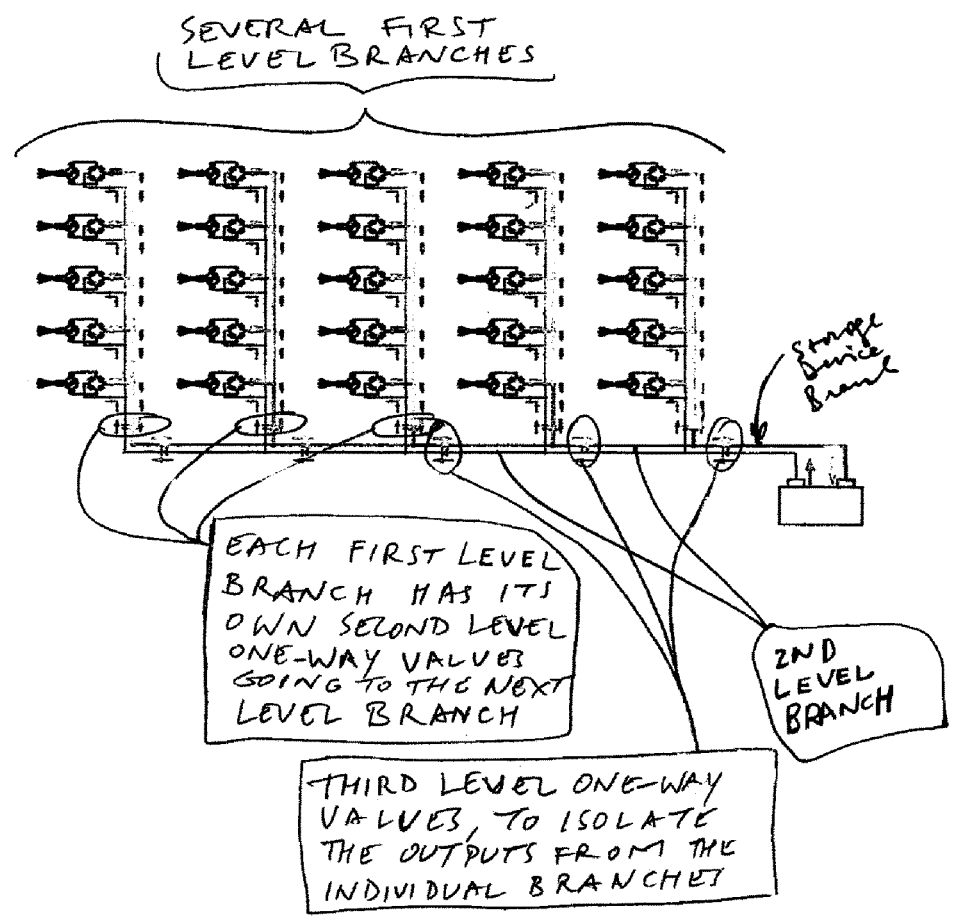

FIG. 39 shows several first level branches, five in this case, hooking up to the second level branch, which goes to the storage device. We can see that each first level branch has its own second level one-way valves at its mouth, i.e. the junction from the first LB to the second LB, and just before it connects to the second level branch.

Definition: LB=Level Branch.

It is preferred to do the following as well.

We can see that I have placed additional one-way valves on the storage device branch, between each mouth of each first level branch. This is to ensure that there is no conflict in the charges, being generated by any of the branches dumping their output in the higher level branch. In other words, we want to isolate the outputs coming from the individual branches, so that they would not cancel each other out.

Please notice another thing.

In FIG. 36, I have included some capacitors in the circuits. I believe that such capacitors would enhance the performance of the whole system. I would leave it to the experts in the field, such as engineers dealing with Electric Power Controls, to figure out what is best to do, i.e. the size and ratings etc of the capacitors, in order to make sure that we extract the most possible output out of the system, and with the most efficient ways.

Figure 40:
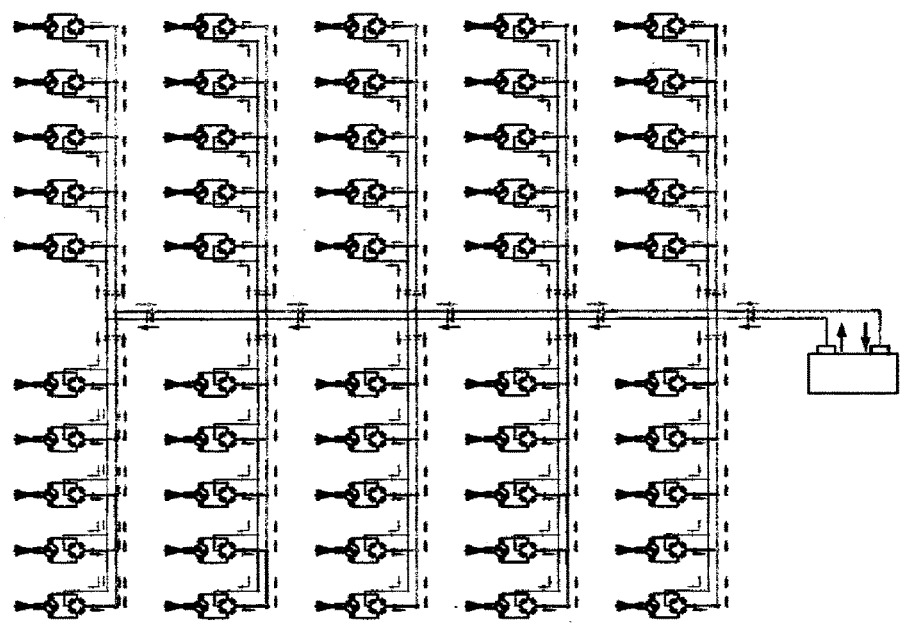
Figure 41:
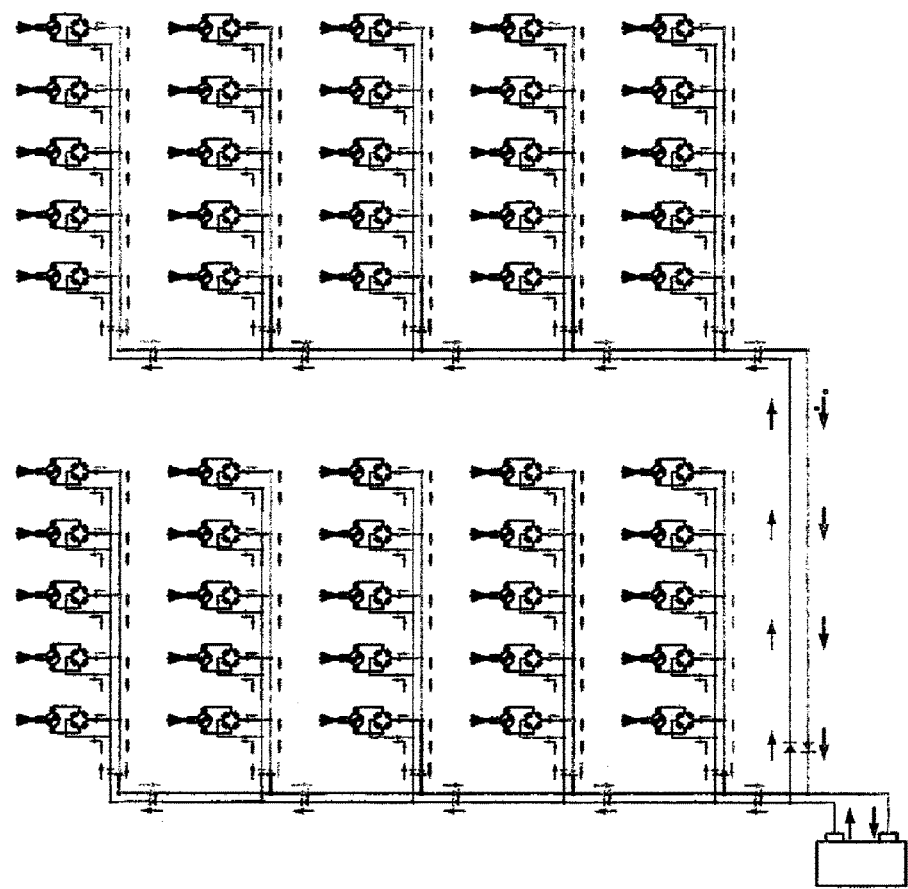
Figure 42:
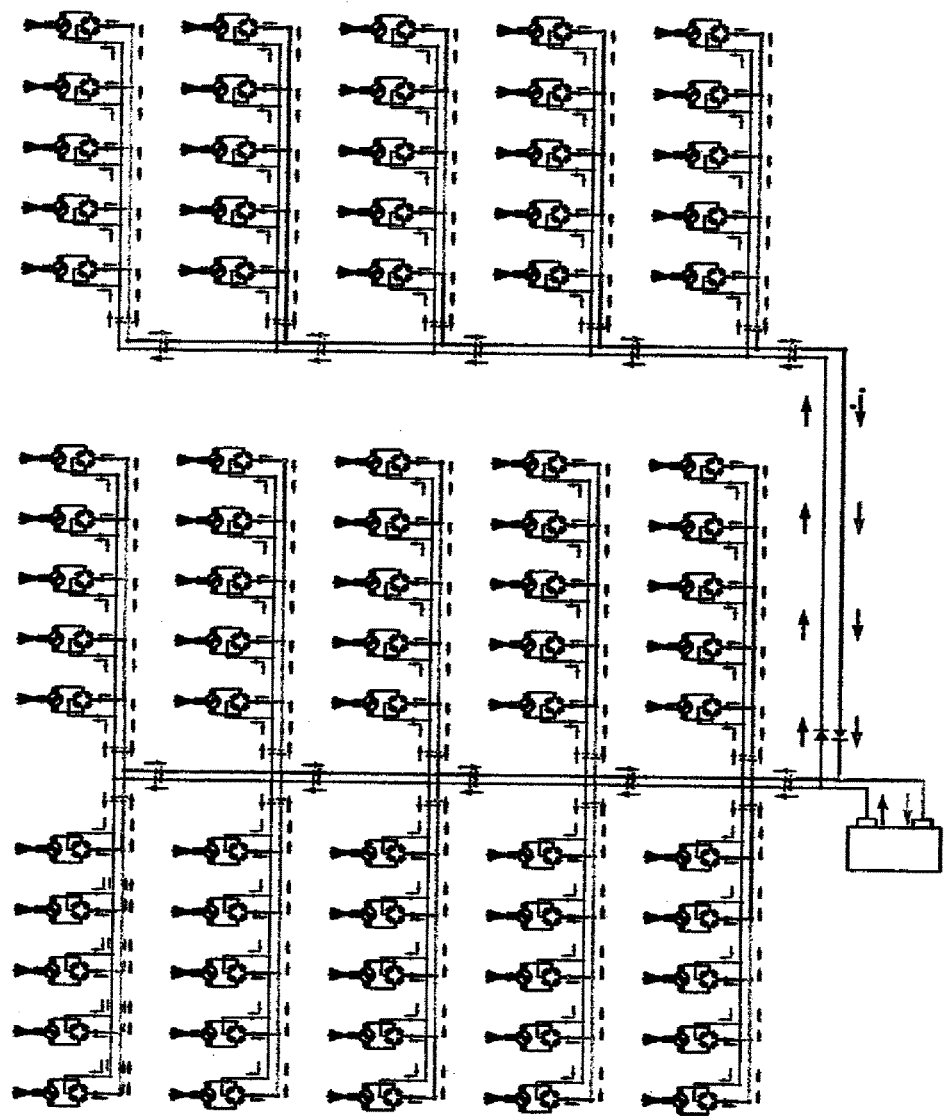

FIGS. 40, 41, and 42 show more variations and expansion of the PEEP LEAVES and branches. We can call them as being in series or in parallel, and as being duplicating each other, etc.

FIG. 40 shows 5 1st LB on top of the 2nd LB and 5 1st LB below the 2nd LB, and it shows that the 2nd LB is dumping the EP into the storage battery. We can say that all the branches here are connected in Parallel.

Definition: EP=Electric Power.

FIG. 41 shows a similar arrangement, where all the 1st LBs are above the 2nd LBs. This picture could be misleading. Electrically, in this FIG. 41, the branches are still connected in parallel as well, and they will function in a similar fashion as in FIG. 40.

FIG. 42 shows yet another physical arrangement. The branches look like those in FIGS. 40 and 41. But electrically, they are all connected in parallel as well.

FIG. 42 could be called a FULL PEEP TREE. Notice the one-way valves at each junction. I believe that it is advisable to place such one-way valve before and even after each junction, and between any two junctions that are in series, as well.

Combination 2—Passive Flag

Figure 43:
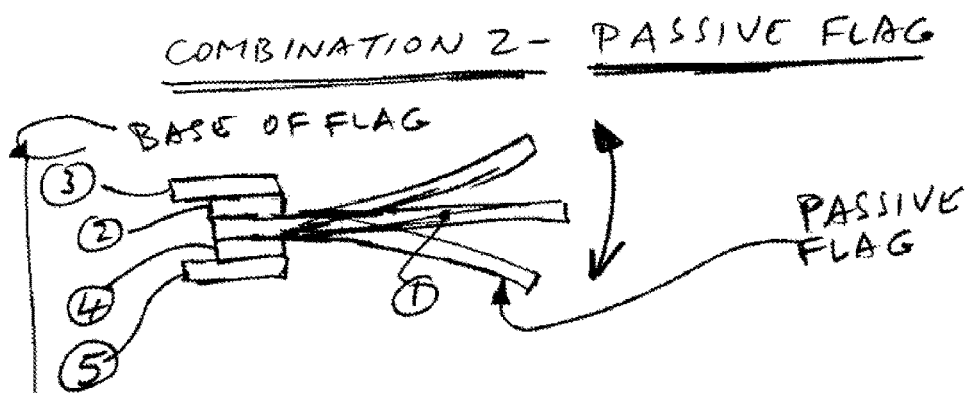

FIG. 43 shows a PASSIVE PEEP LEAF basic module. Outwardly, this one looks very similar to the one shown in FIG. 31, but it comprises some very important differences.

First of all, the FLAPPING FLAG itself here is made of a passive material, i.e. a material that does not exhibit any Piezo Electric Effect (PEE) [DEF]. It can be made of any semi-flexible material, such as thick plastic sheets. Actually, it may even be more effective, if it is made out of solid rigid material, e.g. rigid plastic or even metal. It can be shaped, so that it can flap in the wind, but it needs to be strong or stiff enough to transfer the effect of its flapping motion to the base of the flag.

Second, the base of the flag, in this case, will contain the PEE Elements (PEEE). The PEEE will sense the motion of the flapping flag and utilize this motion to generate the electric power.

Now we can break down the action at the base of the flag into at least two sub-combinations as follows: Combinations 2-A and 2-B.

FIG. 44 shows these two combinations.

Combination 2-A is where the base of the flag is maintained in a rigid position by some appropriate clamps and supports, not shown, and Combination 2-B is where the base of the flag itself is allowed to flex and to swing in the direction of the movement of the flag or flapper.

In both cases, but especially in Combination 2-B, the flag itself should be more stiff or rigid, so that when it swings up and down, or right and left, with the wind movement, then the base of the flag will follow the motion of the flag and will swing up and down, or right and left, with the flag itself.

Combination 2-A

FIGS. 45-A through 45-F illustrate the proposed Combination 2-A. All the figures show the main essential components of the Combination 2-A, but do not show how the resulting electrical currents are connected to the outside world, nor the required clamps, supports, insulations, etc.

These are common knowledge in the Prior Art.

FIG. 45-A shows the general configuration. FIG. 45-B shows the resulting output, when the flapper is in the upper position, and FIG. 45-C when the flapper is in the lower position.

FIG. 45-D shows an exploded view of the device and shows the nomenclature used.

FIG. 45-E shows the internal forces generated by the flapper, when it is in the upper position and how these forces are acting on the PE elements TPE and BPE.

FIG. 45-F shows the same things as in FIG. 45-E, but when the flapper is in the down position.

Definitions

TPE=Top Piezo-Electric Element
BPE=Bottom Piezo-Electric Element

We can have only one PEEE, if we want, but with two, we would basically almost double the output.

We can see that TPE is instrumented to have diodes positioned on top of it. With the proper manufacturing technique, we can duplicate here, something similar to what we have accomplished in FIGS. 32, 33, and 34. We can also duplicate this at the lower PE2.

Now.

Notice that FIGS. 45-A and 45-F show the flapper bent at a point near its base and the rest of the flapper body as a straight line, in contrast to the flag in the previous figures. This is just to highlight the fact that the flag in this embodiment can be more stiff.

FIGS. 45-B and 45-E show what happens when the flapping flag or flapper swings upwards. Because of the relative stiffness of the flag body/material, we will have a normal compressive force C, pushing on the front, (right side in the figure), edges of the upper PEEE, TPE.

Since this front part of the TPE will be under compression, it will generate a potential in a certain direction. The diodes TD1 and TD2 will each react according to its doping and to the direction of the potential and the resulting current. In this FIG. 45-E, I will assume that TD2 will allow the current to flow through it in the direction of the arrow E2R (Energy to the Right). TD1 will not allow any flow based on its reverse doping and on the current direction.

Now, the back (left side of the figure) end of the PEEE, TPE, will not see a compression force on it, but will sense a release of any compressive forces that were acting on it, due to the clamps and supports. It will be as if there is a tensile force acting. Actually, if the TPE is glued to the flapper, then the TPE will sense an actual pull. The result if this will be the opposite of what happens at the front side of the TPE. This will result in that TD3 will allow the current to flow and TD4 will not allow any current to flow.

Actually, even if there are no changes in the forces and stresses on this back end of the TPE, the diodes TD3 and TD4 will respond in the same way, just because of the potential generated at the front end of TPE.

The end result of all this will be that both TD3 and TD2 will allow the current to flow through them as shown by the arrow E2R, and the two other diodes, TD1 and TD4 will not fire, will not allow any current to flow through them.

Now looking at the lower components below PEE, we can follow the effects of the flapper moving upwards and we can see how diodes BD1 and BD4 will allow any resulting current to flow through them in the direction of arrow E2L (Energy to the Left), while diodes BD2 and BD3 will not.

So, FIG. 45-E shows the details of what happens internally, while FIG. 45-B shows the external resulting end effect.

FIGS. 45-C and 45-F show similar things, for when the flapper moves downwards. At the top, the current will flow to the left in the direction of arrow E2L, and at the bottom, in the direction of arrow E2R, but through the respective diodes, as shown.

In all the above, the lower BPE will be stressed in the opposite way from TPE and will create an electric current flowing in the opposite direction of the current generated by TPE.

FIGS. 45-C and 45-F show what happens when the flag moves downwards. The current will flow in the opposite direction of the one in FIG. 45-B, i.e. to the left, as generated by PE1.

Here in FIGS. 45-A through 45-F, I am showing that the flag body is as wide as the TPE and BPE bodies. All the body of the flag will be applying the forces and stresses on the width of the PE Elements. Hence, all the PE elements width will see the forces applied on it, along the whole of its width.

Of course, I am saying that all these components are kept in place by certain appropriate clamps, supports, electrical connections to the outside world, insulations, etc. (not shown), which are all known to any person skilled in the art. Combination 2-B.

FIGS. 46-A through 46-H and FIGS. 47-A through 47-C and FIGS. 48-A through 48-C illustrate this Comb 2-B.

FIGS. 46-A through 46-E show orthogonal views of the Comb. 2-B device. The Bifurcated flag 4614 corresponds to part 3111 in FIG. 31, but it is not made out of a PEE material. The PEEE 4612 and 4613 correspond to parts 3112 or 3114 in FIG. 31, and the support bracket corresponds to part 3115 in FIG. 31.

I am not showing a component that corresponds to part 3113 of FIG. 31, just for clarity. And in fact, it can be optional. The PEEs can be glued to the supporting bracket 4611, instead of being clamped down.

FIGS. 46-A through 46-H, FIGS. 47-A through 47-C and FIGS. 48-A through 48-C show more details of the PEE element. I have named the different points of the Piezo Electric Effect Element, [PEEE], A, B, C, D, E, F, simply to be able to explain what happens to the PEEE, at different time during its actuation.

The portion AB of the PEEE 4613 is held or glued fixed in position by the bracket 4611, equivalent to part 3115 of FIG. 31. So is the portion EF of the PEEE 4612. The portion CD of the PEEE is fixed, glued or the like, to the base of the flag 4614, as shown. Now, there are two portions of the PEEE that are "FLOATING" between the glued portions AB and EF, and the portion CD that is attached to the base of the flag. These two portions are BC and DE. FIGS. 46-D and 46-G show a cross-sectional view X-X and a 3-D view, respectively, at a moment when the flag is horizontal. The PEEE portion shown in this view of FIG. 46-D represents the portion BC of the PEEE. This BC portion in this case is not stressed as it is in-line with the other portions AB and EF of the PEEE and is in its natural (relaxed) shape and position. Let's look now at FIGS. 46-E and 46-H.

Here the flag has been moved, say by the wind, or by any other moving force or external action applied to the flag, to a lower position as shown. Portion CD of the PEEE has been moved to follow the position of the flag, again as shown. The portion BC of the PEEE is now twisted between the end B, near the bracket, and between the end C, near the flag. This is the portion that will be under STRAIN, and which will generate some electrical charge, voltage, current, if the material of the PEEE is such that it can respond and be activated by such a strain.

Now, we can experiment with various materials and select the ones that do respond to such a strain, and then design an electrical scheme, similar in many ways to those described earlier in this specification, and end up having some electrical power being generated from such a COMBINATION 2-B Device.

FIGS. 46-C and 46-F show the situation, where the flag has been moved upwards. The same thing will happen to the portion BC of the PEEE, except it will be in the reverse polarity. Again, by using similar schemes as described earlier, we can rectify the current and end up with more usable electric power.

The portion DE of the PEEE will behave in a similar fashion as the portion BC, but in a mirror image way. Again, we can capture the electric power generated form it and collect it in a similar fashion, but in the reverse direction, as fits best.

FIGS. 47-A through 47-C and FIGS. 48-A through 48-C simply try to illustrate what happens to the PEEE during the twisting of the PEEE, due to the movement of the flag. I have used the same names of the different points of PEEE for clarity.

I would like to expand my description of the CD portion of the PEEE. In FIG. 46-B, FIGS. 47-A through 47-C and FIGS. 48-A through 48-C.

I have outlined the portion CD as being split in the middle, so as to isolate the two halves electrically from each other. This may be an overkill. I did this to show that we could isolate the 2 halves if we wanted to. But I feel that after a proper amount of experimenting, we may find that doing so does not buy us or add any special benefits. So, in that case, we may opt to keep the two halves together as one unit, i.e. without the split in the middle.

Figure 49:
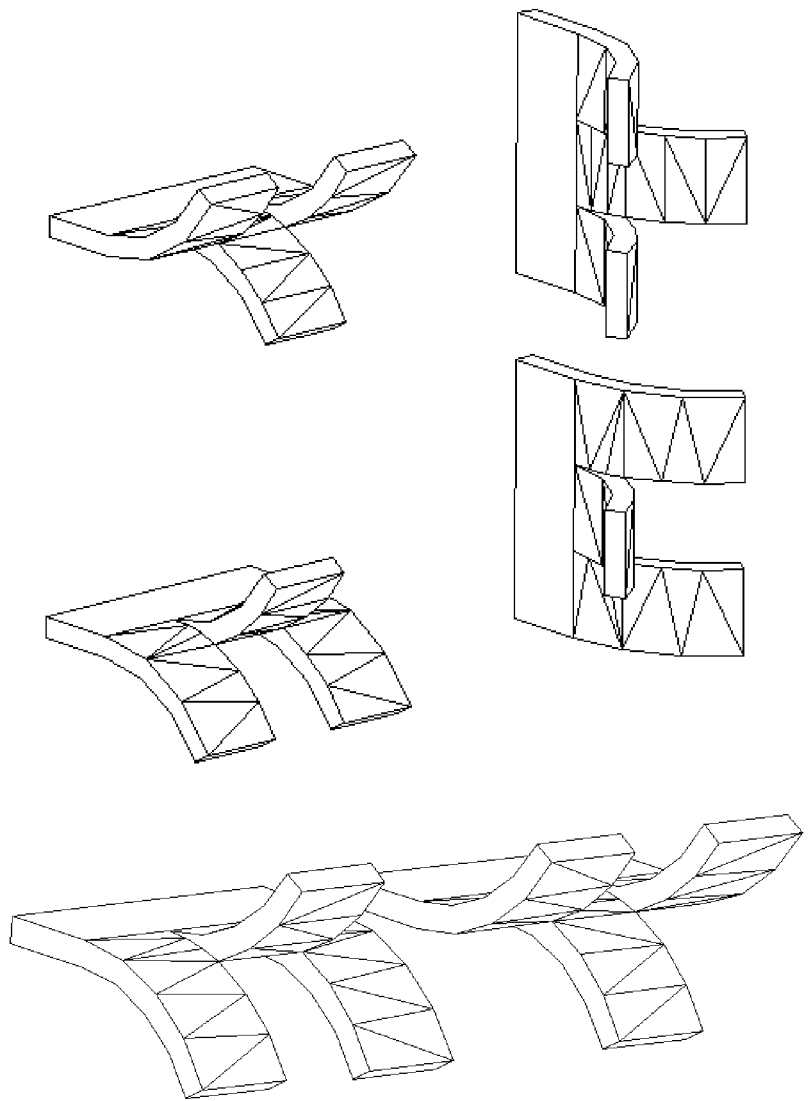

FIG. 49 shows several views of an example of a bifurcated flag, to increase the turbulence and thus to increase the fluttering of the flag and thus to increase the generated electric power. FIGS. 50 and 51-A, 51-B and 51-C show a take-off on or expansion of the device shown in FIG. 34. They show how we can create a number of PEEE LEAVES out of a large sheet of PEE material. The row of PEEP LEAVES in the middle of the figure illustrates two or more P-Leaves in a row, created by cutting out at least 3 sides or grooves around the main body of the leaf, leaving at least one part of one side attached to the rest of the sheet.

The rails above and below the leaves represent the other main components, which are the semi-conductor D1 and the Bus Bar ATS directly adjacent to and on top of the leaves, then semi-conductor D4 and the bus bar BTS next on top of that. Then semi-conductor D2 and the bus bar ABS below the leaves and finally semi-conductor D3 and the bus bar BBS below those.

Let me explain it another way.

Please look at FIG. 34 and consider it as if it is the 3D end view or a cross section of the view in FIGS. 50 and 51-A through 51-C.

I used two figures, FIG. 50 and FIGS. 51-A through 51-C, so that we can more easily visualize the construction of the proposed embodiment. FIG. 50 shows the "assembled" embodiment, while FIG. 51-A through 51-C shows a quasi exploded view. FIG. 51-A shows the central PE Sheet, PES, and the flappers, which are formed on it by the cutouts around some of three sides. FIG. 51-B shows the top and bottom components that will be added on to the central PE sheet (PES), so that when they are all assembled together, they will look as shown in FIG. 51-C.

The outlined area, designated as "MO", which stands for "Module Outline", is just that. It is the outline of the basic module, shown in FIG. 34, and which gets repeated as shown in FIG. 50 and FIGS. 51-A through 51-C So, let's visualize that all the components that are shown in the figure are physically above the Peep Leaf (PL), i.e. are actually above the surface of the PEE sheet. They are similar to the components shown at the top area of FIG. 34 and are physically above the PEE.

I gave the components the same names and reference letters and numbers in both FIG. 34 as in FIGS. 50 and 51-A through 51-C, except that PEE (PE element) in FIG. 34, became PES (PE Sheet) in FIGS. 50 and 51-A through 51-C.

Figure 52:
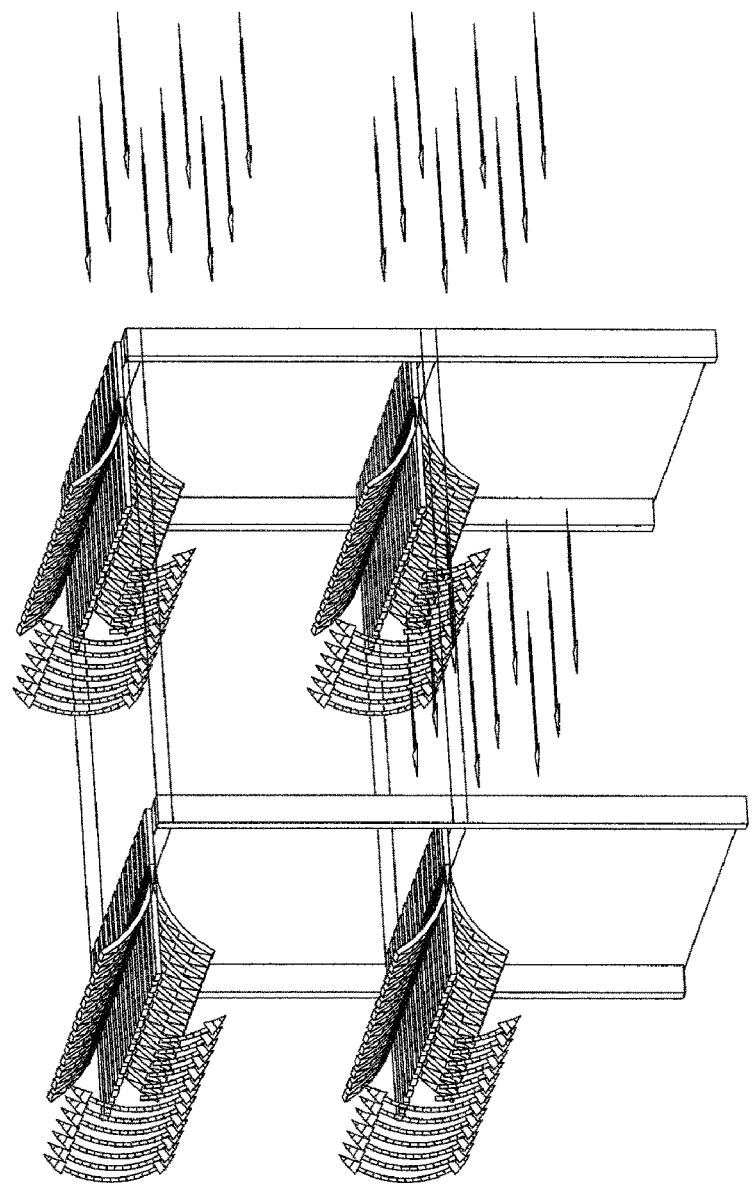

Similarly, the components in the area of the figure below the PES in FIG. 52, are physically below the surface of the PEE Sheet, and are similar to the components shown at the bottom area of FIG. 34, and are physically below the PEE. Again, same names, same ref numbers and names. The reason it maybe a bit difficult to visualize the components in FIGS. 34, 50 and 51-A through 51-C, is because they are laid one on top of the other. For example, The conductor 1T is on top of the surface of the PEE in FIG. 34 or of the PES in FIGS. 50 and 51-A through 51 sheet material, then on top of this conductor 1T, we have the Semiconductor D1 in the area designated D1, and then on top of this D1, we have the Bus Bar ATE in FIG. 34 or ATS in FIG. NEW-50. This gets repeated from left to right in the figures. FIG. 50 shows the module repeated 2½ times, and FIGS. 51-A through 51-C show it repeated 5 times.

We can also see D4 on top of conductor (1T) and on top of this D4, we have the Bus bar BTE in FIG. 34 or BTS in FIG. 50. Again, in this FIG. 50, this D4 is shown repeated 5 times in this one row.

The same arrangement is repeated below the PE Sheet (PES) in the drawing, as well as physically.

The conductor (2B) in FIG. 34 is below the surface of the PEE sheet material. Below this conductor (2B), we have the Semiconductor D2, and then below D2, we have the bus bars ABE. Then again, we have the Semiconductor D3, also below the conductor (2B), and then below that, we have the bus bar BBE.

This way, we can manufacture such PEE Elements in a continuous fashion and end up with a less expensive product. The semi-conductor components, as well as the conductive bus bars can be printed on, or can be laminated on and then etched to create the desired traces etc, similar to the way many flexible circuits are made in the industry.

Embodiment

Figure 53:
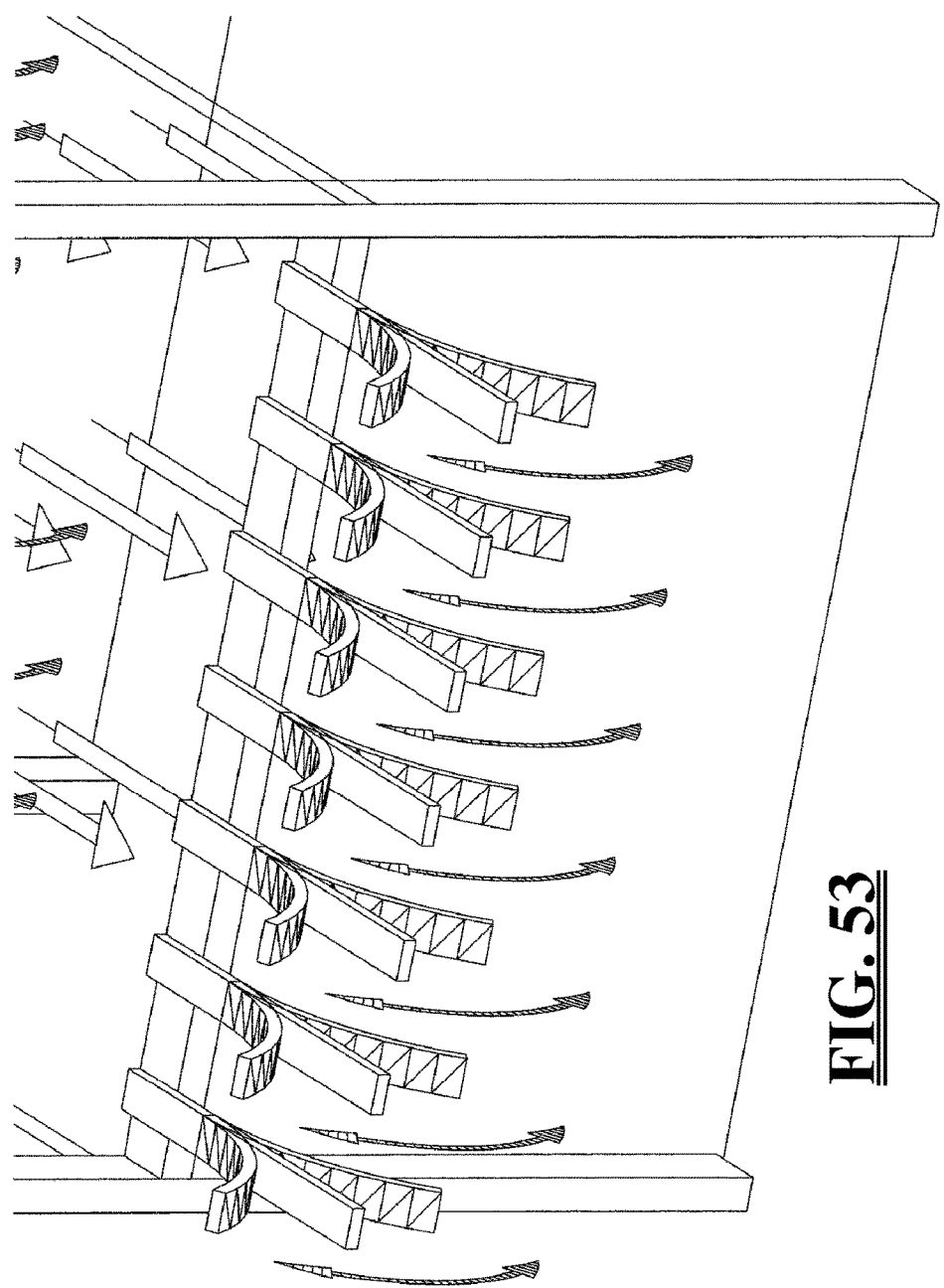

FIGS. 52 and 53 show a PEEP LEAF TOWER, instead of a PEEP TREE. It is very similar to a tree, using similar components and circuitry, but arranged on a different structure. The electrical components and the wiring should be very similar to those shown with the TREE, and The same results are to be expected as with the TREE, as well.

Embodiment

FIGS. 54-A and 54-B illustrate a way to create a cable with a number of P- and N-doped strands together with the appropriate PEE Elements, to generate electric power out of a body that looks like a cable.

The same technique can be used with a flat sheet of PEE material, as in FIG. 54-A, where the P- and N-doped strands are laid out, say criss-cross over each other, to end up with yet again another similar device to generate electric power.

This can be considered like cables or strands, woven into a cloth.

Another possible EMBODIMENT: the P- and N-doped fibers or strands can be printed on the fabric. They can be printed as dots, and/or lines or stripes.

Applying the Semi-Conducting Material

Print the pnp or pn semiconducting material on the respective surfaces.

Printing can utilize the nano-technologies being developed continuously nowadays.

The doped materials, that constitute the p or the n elements can be either printed on, or deposited on, the respective surfaces, by any of the available methods known in the prior art. These could be also stenciled on, or done using chemical deposition, vapor deposition, plating, whether electro-plating or electro-less, or by anodizing, etc.

They can also first be applied to the whole surface at once and then selectively removed, from certain areas, to create any of the desirable shapes, like traces, islands, etc.

I claim:

1. A module, for piezoelectric energy harvesting,
    a) said module comprising two elements, a base and a group of diodes
    b) said base being made of a flexible piezoelectric material and in the form of a generally thin flat horizontal rectangular sheet of piezoelectric material, having a top surface and a bottom surface, wherein,
    c) when viewed in a 3-dimensional isometric view, said base will be seen to have four edges, a front edge, a back edge, a left edge and a right edge, and four corners, a front left corner, a front right corner, a back left corner and a back right corner, and
    d) said base being the source of electric charges and energy, whenever said base is stressed mechanically, and
    e) said group of diodes being made of at least a first and a second top patch of thin flat layers of semiconductor material, each top patch having a top surface and a bottom surface, wherein
    f) said patches of thin flat layers of semiconductor material are applied directly onto the top surface of the base, making direct physical and electrical contact between the bottom surface of the respective top patches and the top surface of the base, without the need of any additional interconnecting wiring between the semiconductor material and the base, wherein the bottom surface of each top diode is proximate to the top surface of the base, and the top surface of each one of said first and second top diode is distant from the base, and wherein
    g) each one of said first and second top patches is doped to allow electric charges to pass through the respective top patch, from one surface of said one top patch to the other surface of said same one top patch, only in one direction, so that each one of said first and second top patches acts as a first top diode and a second top diode, wherein
    h) said first top diode is electrically oriented, so as to allow electric charges to flow through it, only in one direction through said first top diode, and wherein
    i) said second top diode is electrically oriented, so as to allow electric charges to flow through it, only in the opposite direction to the direction of flow of electric charges through the first top diode, wherein
    j) the two top diode, being attached to the base as described, will act as a self-contained one leg of a top two diode half-bridge rectifier.

2. A module as in claim 1, wherein
    said module further comprises a flag, in the form of an extension to the general area of the base, wherein
    said flag is allowed to move in an up and down direction and in a clockwise and counter clockwise direction with respect to the base, so as to generate mechanical stresses in the base, thus generating electric charges in the base.

3. A module as in claim 1, wherein
    said module further comprises
    at least a first and second bottom diodes, similar to the first and second top diodes, and located in a mirror image position to the top diodes, with respect to the base, and attached to the base, wherein
    the bottom patches of thin flat layers of semiconductor material are applied directly onto the bottom surface of the base, making direct physical and electrical contact between the proximate surface of the respective bottom patches and the bottom surface of the base, without the need of any additional interconnecting wiring between the semiconductor material and the base, wherein the proximate surface of each bottom diode is proximate to the bottom surface of the base, and the distant surface of each one of said first and second bottom diode is distant from the base, and wherein the first bottom diode is electrically oriented so as to allow electric charges to flow through it, only in one direction through this first bottom diode, and the second bottom diode is electrically oriented so as to allow electric charges to flow through it, only in the opposite direction to the direction of flow of electric charges through the first bottom diode.

4. A module as in claim 3, wherein said module further comprises at least two additional top diodes, and at least two additional bottom diodes, wherein each one of said four diodes is attached directly to the respective surface of piezoelectric sheet, wherein the top diodes making direct physical and electrical contact between their respective proximate surfaces and the top surface of the base, and the bottom diodes making direct physical and electrical contact between their respective proximate surfaces and the bottom surface of the base, and wherein the doping and electrical orientation of each one of said four top diodes are arranged, so that the end result is that the four top diodes together create a top four-diode, full wave rectifier, while the doping and electrical orientation of each one of said four bottom diodes are arranged, so that the end result is that the four bottom diodes together create a bottom four-diode, full wave rectifier.

5. A module as in claim 1, wherein said diodes are provided onto the piezoelectric sheet by any one of the following group of manufacturing methods, which comprises printing, vapor deposition, extrusion, lamination, etching, and any other manufacturing methods and technologies presently available in the industry.

6. A module, for piezoelectric energy harvesting, as in claim 1, wherein a) said top semiconducting material is in the form of only one top patch.

7. A piezoelectric energy harvester with a passive actuator, said harvester comprising a set of first top components, said set comprising four components, first, a passive actuator, second, a top piezoelectric energy harvesting module, third, one set of first top bus bars, and fourth, a clamping device, all acting together as a harvester with one top two-diode, half-bridge rectifier, a. said passive actuator, being made of a passive non-piezoelectric material, b. said passive actuator, when viewed in a three-dimensional isometric view, is seen as being in the form of an elongated piece of stiff material, having two ends, an actuator flag at the right end and an actuator base at the left end, and having an upper surface and a lower surface, and c. said actuator base itself is seen as having at least four regions, a front right region and back right region, adjacent to said actuator flag, and a front left region and a back left region, at the farther end away from said actuator flag d. wherein e. said module comprises a flexible compressible piezoelectric module base and a set of two first top diodes, a first top diode and a second top diode, mounted on said base, so that the module acts as a self-contained one leg of a top two diode half-bridge rectifier, f. said one set of first top bus bars comprising at least one first top bus bar being attached to the distant surface of each respective one of the two first top diodes of said top piezoelectric energy harvesting module, and g. said clamping device, having at least one lower clamping jaw and one upper clamping jaw, to hold all the four above mentioned components, under pressure, within said two clamping jaws, wherein h. the four components are stacked and assembled between said two clamping jaws, and are disposed in the following order, i. first, the actuator base of the passive actuator is disposed on top of the lower clamping jaw, then j. said top piezoelectric energy harvesting module is disposed on top of the actuator base, with the bottom surface of the module resting on top of the upper surface of the actuator base, then k. the one set of first top bus bars, wherein each one of the top bus bars l. is attached to the distant surface of each of the two first top diodes, then m. the top clamping jaw holds all the above mentioned components in place, and under pressure, against the bottom clamping jaw, wherein n. the actuator flag remains outside the clamping jaws and is allowed to have free movements, wherein it is allowed to move upwards and downwards and to twist clockwise and anticlockwise, with respect to the clamped components, and especially with respect to the top piezoelectric energy harvesting module, and wherein o. when the actuator flag moves, the flag movement affects the pressure distribution between said actuator base and said top module base, changing the amount of compression applied onto the different regions of the top module base, thus generating certain electric charges, wherein p. these electric charges will flow through the two first top diodes and their respective first top bus bars, depending on the doping direction and the orientation of these two first top diodes and on the polarity of the generated electric charges, thus q. the harvester will capture some of the electric charges, and the bus bars will conduct these electric charges to an external electric load, thus r. the harvester will perform as a power generator with one top two-diode, half-bridge rectifier.

8. A piezoelectric energy harvester with a passive actuator, as in claim 7, said harvester further comprising two additional components, namely, first, at least two additional top diodes, and second, at least two additional top bus bars, to convert said harvester to act as a harvester with one top four-diode, full-bridge rectifier, a) said at least two additional top diodes comprise a third and a fourth top diodes, added to the top piezoelectric energy harvesting module and attached to the module base, b) and said at least two additional top bus bars comprise at least a third and a fourth top bus bars, wherein each one of these additional top bus bars is attached to the distant surface of their respective said third and fourth top diodes, and wherein c) these two second top diodes, together with their respective second top bus bars, are included as part of the stack of components, disposed, under pressure, between the top and bottom clamping jaws, and will capture certain electric charges, in addition to the electric charges captured by the two first top diodes, thus d) the harvester will perform as having one top four-diode, full-bridge rectifier, thus enhancing the effectiveness of the total harvester.

9. A piezoelectric energy harvester with a passive actuator, as in claim 7, said harvester further comprising two additional bottom components, to be added to the stack of components that are clamped between the lower clamping jaw and the upper clamping jaw of the clamping device, first, a bottom piezoelectric energy harvesting module and second, a set of first bottom bus bars, so that the harvester will be acting as a harvester with two individual power harvesting sets, each set comprising one piezoelectric energy harvesting module and one two-diode, half-bridge rectifier, wherein one individual power harvesting set being above the actuator base and the other set being below the actuator base, wherein a)

b) said bottom piezoelectric energy harvesting module is a mirror image of the module positioned above the actuator base, and wherein this bottom module is positioned below the actuator base, and wherein c) said module comprises a flexible compressible piezoelectric module base and a set of two first bottom diodes, a first bottom diode and a second bottom diode, mounted on said actuator base, so that this lower module acts as a self-contained one-leg of a bottom two diode half-bridge rectifier, and wherein d) said one set of first bottom bus bars is a mirror image of the set of first top bus bars, wherein said one set of first bottom bus bars comprises at least a first and a second bottom bus bars, each one being attached to the distant surface of each respective one of the two first bottom diodes of said bottom piezoelectric energy harvesting module, and e) the bottom set arranged between the actuator base and the lower clamping jaw, in a mirror image to their respective components above the actuator base, so that all of them together are disposed, under pressure, between the top and bottom clamping jaws, and f) wherein g) all these new components are part of the new stack, and are held in place, under pressure, between the lower and upper clamping jaws, and wherein h) the actuator flag remains outside the clamping jaws and is allowed to have free movements, wherein it is allowed to move upwards and downwards and to twist clockwise and anticlockwise, with respect to the clamped components, and especially with respect to the bottom piezoelectric energy harvesting module, and wherein i) when the actuator flag moves, the flag movement affects the pressure distribution between said actuator base and said bottom module base, similar to its effect on the top module base, thus changing the amount of compression applied onto the different regions of the bottom module base, thus generating certain electric charges, wherein j) these electric charges will flow through the two bottom diodes and their respective bottom bus bars, depending on the doping direction and the orientation of these two first bottom diodes and on the polarity of the electric charges generated by the bottom module base, thus k) said bottom set of components will act as a power generator with a two-diode, half bridge rectifier, capturing the electric charges generated by the bottom module base, thus l) the total harvester will perform as a power generator with two individual sets, one set being the top active pad with one top two-diode, half-bridge rectifier above the actuator base, plus another set being the bottom active pad with one bottom two-diode, half-bridge rectifier below the actuator base.

10. A piezoelectric energy harvester with a passive actuator, as in claim 8, said harvester further comprising an additional set of first and second bottom components, basically similar to, but as a mirror image of, the corresponding set of first and second top components, wherein all the components together will act as a harvester with two individual sets, each set comprising one piezoelectric energy harvesting module, having one four-diode, full-bridge rectifier, wherein one set is above the actuator base and the other set is below the actuator base, a) wherein b) all these above mentioned additional set of components of the bottom set are added to the stack of components disposed between the lower jaw and the upper jaw of the clamping device, so that all of them together are disposed, under pressure, between the lower and upper clamping jaws c) wherein d) the actuator flag remains outside the clamping jaws and is allowed to have free movements, wherein it is allowed to move upwards and downwards and to twist clockwise and anticlockwise, with respect to the clamped components, and especially with respect to the top piezoelectric energy harvesting module.

11. A first piezoelectric energy harvester with a passive actuator, as in claim 10, wherein said first harvester is electrically connected to an external electric load, and wherein a least one second harvester is electrically connected to said first harvester and to the same external electric load, and wherein said first and second harvesters are electrically configured in a way to ensure that the generated electric charges of opposite polarities do not cancel each other, wherein for both the first and second harvesters, the top electrical harvesting circuit includes the four top diodes and the four top bus bars, and the bottom electrical harvesting circuit includes the four bottom diodes and four bottom bus bars, such that eight diodes of each of both the first and second harvesters all feed the generated electric charges to and from the external electric load, and wherein for both the first and second harvesters, the following settings are incorporated, wherein 1) said first top diode is forward-biased and its distant surface is connected to said first top bus bar, which is then connected to a first external diode, which itself is forward-biased as well, and said first external diode is then connected to a first terminal of the external electric load, so that said first top diode is sending the forward electric charges to said first terminal of the external electric load, and 2) said second top diode is reverse-biased and its distant surface is connected to said second top bus bar, which is then connected to a second external diode, which itself is reverse-biased as well and said second external diode is then connected to a second terminal of the external electric load, so that said second top diode is sending the reverse electric charges to said second terminal of the external electric load, and 3) said third top diode is forward-biased and its distant surface is connected to said third top bus bar, which is then connected to a third external diode, which itself is forward-biased as well, and said first external diode is then connected to the same first terminal of the external electric load, so that said third top diode is sending the forward electric charges to said first terminal of the external electric load, and 4) said fourth top diode is reverse-biased and its distant surface is connected to said fourth top bus bar, which is then connected to a fourth external diode, which itself is reverse-biased as well and said fourth external diode is then connected to the same second terminal of the external electric load, so that said fourth top diode is sending the reverse electric charges to said second terminal of the external electric load, and wherein four electrical settings as described above are incorporated in the bottom electrical harvesting circuit of each one of the first and the second harvesters, which comprises the four bottom diodes and four bottom bus bars, so that we end up with new four bottom external diodes for the bottom electrical harvesting circuit of each one of said first and second harvesters.

12. A piezoelectric energy harvester with a passive flapper, as in claim 7,
wherein
the free end of the flapper is shaped to have features, which can promote the flapper to move under the influence of wind, including having a bifurcated end of the flapper.

13. A piezoelectric energy harvesting leaf with an active flapper, said energy harvesting leaf comprising an active strip and a top electric harvesting circuit, a) said active strip being made of a piezoelectric material, in the form of a flexible, generally flat horizontal elongated sheet, having a top surface and a bottom surface, and when viewed in a three-dimensional isometric view, said active strip will be seen to be b) comprising at least three portions, c) first, an active flapper, at the right end of the elongated active strip, second, a base, at the left end of the elongated active strip, and third, a transition portion, between the active flapper and the base, wherein d) the base is affixed in a permanent position, and prevented from moving, and when viewed in a three-dimensional isometric view, said base will be seen to be having four edges, a front edge, a back edge, a left edge and a right edge, wherein said right edge is proximate to the transition portion, and said base will also further be seen to be having four corners, a front left corner, a back left corner, a front right corner, and a back right corner, wherein said front right corner and said back right corner are proximate to the transition portion, and wherein e) the active flapper is allowed to have free movements, wherein it is allowed to flap upwards and downwards and to twist clockwise and anticlockwise, with respect to the base, thus generating certain electric charges, which will be transmitted to the base via the transition portion, and wherein f) the transition portion is situated between the base and the active flapper and transmits to the base the electric charges generated by the active flapper and by the transition portion itself, whenever said active flapper and the transition portion are stressed mechanically, and wherein g) said base receives the electric charges and energy generated by the active flapper and by the transition portion, whenever said active flapper and transition portion are stressed mechanically, and wherein h) the top electric harvesting circuit comprises at least a first and a second top diodes and wherein i) each one of said at least first and second top diode is made of a thin flat patch of semiconductor material, applied directly onto the top surface of the base, making direct physical and electric contact between the bottom surface of the respective top patches and the top surface of the base, without the need of any additional interconnecting wiring between the semiconductor material and the base, and with no insulations between the patches and the base, wherein j) the bottom surface of each one of said first and second top diodes is proximate to the top surface of the base, and the top surface of each one of said first and second top diodes is distant from the base, and wherein k) said first top diode is electrically oriented, so as to allow electric charges to flow through it, only in one specific direction through said first top diode, and wherein l) said second top diode is electrically oriented, so as to allow electric charges to flow through it, only in a direction, which is opposite to the direction of flow of electric charges through the first top diode.

14. A piezoelectric energy harvesting leaf with an active flapper, as in claim 13, wherein said top electric harvesting circuit further comprises at least a first and a second top bus bars, each top bus bar having a first and a second end, wherein m) each one of said at least first and second top bus bars is attached at its first end to the distant surface of each one of said first and second top diodes, to connect the top diodes to an external electric load, wherein n) the first end of said first top bus bar is attached to the distant surface of said first top diode, to connect said first top diode to a first terminal of the external electric load, o) the first end of said second top bus bar is attached to the distant surface of said second top diode, to connect said second top diode to a second terminal of the external electric load, wherein p) the electric charges are conducted from the base to the individual diodes, and wherein q) the first top bus bar, attached to the first top diode, conducts the electric charges in one direction, from the first top diode to the external electric load, while r) the second top bus bar, attached to the second top diode, conducts the electric charges in the opposite direction, from the external electric load back to the second top diode.

15. A piezoelectric energy harvesting leaf with an active flapper, as in claim 13,
wherein
a second similar harvesting leaf is disposed, in a way, so that the two harvesting leaves are facing each other, so that their bases are distant apart, and the ends of the active flappers are close to each other, and
wherein
an external actuator holds the free ends of the two active flappers and moves these two free ends to generate electric power.

16. A piezoelectric energy harvesting leaf with an active flapper, as in claim 15,
wherein
the free end of the external actuator is shaped to have features, which can promote the external actuator to move under the influence of wind.

17. A piezoelectric energy harvesting leaf with an active flapper, as in claim 14, wherein said harvesting leaf further comprises a bottom electric harvesting circuit, which comprises at least a first and a second bottom diodes and said harvesting leaf further comprises at least a first and a second bottom bus bars to connect the bottom electric harvesting circuit to an external electric load, wherein
 a) said at least a first and a second bottom diodes are made of a thin flat patch of semiconductor material, and applied directly onto the bottom surface of the base, making direct physical and electric contact between the proximate surface of the respective bottom patches and the bottom surface of the base, without the need of any additional interconnecting wiring between the semiconductor material and the base, and with no insulations between the patches and the base, wherein
 b) the proximate surface of each one of said two bottom diodes is proximate to the bottom surface of the base, and
 c) the distant surface of each one of said two bottom diodes is distant from the base, and wherein,
 d) the first bottom diode is electrically oriented so as to allow electric charges to flow through it, only in one direction through this first bottom diode, and
 e) the second bottom diode is electrically oriented so as to allow electric charges to flow through it, only in the opposite direction, which is opposite to the direction of flow of electric charges through the first bottom diode,
 f) and said at least first and second bottom bus bars are attached to the distant surface of each one of said first and second bottom diode, to connect the bottom diodes to an external electric load, wherein
 g) when the active flapper goes through its free movements and generates electric charges, then said at least first and second bottom bus bars will conduct these electric charges to their external electric load, in the same manner that the top bus bars conduct the electric charges to their respective external electric load.

18. A piezoelectric energy harvesting leaf with an active flapper, as in claim 17, wherein said harvesting leaf further comprises a top and a bottom conducting extensions, each one of these conducting extensions having a first and a second end, wherein
 a) said top conducting extension has its first end attached to the top surface of the base, and the second end extending in a direction, away from the space, which the active flapper can occupy during its free movements, and wherein
 b) the proximate surfaces of the first and second top diodes are attached to said second end of the top conducting extension, and wherein accordingly,
 c) the two top diodes, together with their corresponding top bus bars, are thus also positioned away from the space, which the active flapper can occupy during its free movements,
 d) and wherein
 e) said bottom conducting extension,
 f) has its first end attached to the bottom surface of the base, and the second end extending in a direction, away from the space, which the active flapper can occupy during its free movements, and wherein
 g) the proximate surfaces of the first and second bottom diodes are attached to said second end of the bottom conducting extension, and wherein accordingly,
 h) the two bottom diodes, together with their corresponding bottom bus bars, are thus also positioned away from the space, which the active flapper can occupy during its free movements, wherein
 i) the purpose of these top and bottom conducting extensions is to ensure that the active flapper can still freely go through its free movements, wherein it is allowed to flap upwards and downwards and to twist clockwise and anticlockwise, with respect to the base, without being encumbered by any of the diodes or by any of the bus bars.

19. A piezoelectric energy harvesting leaf with an active flapper, as in claim 18, wherein
 a) said harvesting leaf is created, such that its active strip is a portion of a mother piezoelectric sheet, wherein
 b) this mother piezoelectric sheet comprises at least a first and a second such harvesting leaves, and wherein
 c) said at least first and second such harvesting leaves are electrically connected with each other via their respective bus bars, wherein
 d) the first top bus bar of the first harvesting leaf is electrically connected with the first top bus bar of the second harvesting leaf and are conducting the electric charges, in one direction, from their respective top diodes to the external electric load, and wherein
 e) the second top bus bar of the first harvesting leaf is electrically connected with the second top bus bar of the second harvesting leaf and are conducting the electric charges, in the opposite direction, from to the external electric load back to their respective top diodes,
 f) and wherein
 g) similarly the first bottom bus bar of the first harvesting leaf is electrically connected with the first bottom bus bar of the second harvesting leaf and are conducting the electric charges, in one direction, from their respective bottom diodes to the external electric load, and wherein
 h) the second bottom bus bar of the first harvesting leaf is electrically connected with the second bottom bus bar of the second harvesting leaf and are conducting the electric charges, in the opposite direction, from to the external electric load back to their respective bottom diodes,
 i) and wherein
 j) all these electrical connections are made in this way, so as to ensure that
 k) each one of the respective active flappers of said first and second harvesting leaves can go through its respective individual free movements freely, without being encumbered by any of the diodes or by any of the bus bars electrical connections, and independently from any other active flappers.

20. A piezoelectric energy harvesting leaf with an active flapper, as in claim 14,
wherein
at least one additional similar harvesting leaf is disposed adjacent to the first harvesting leaf, on a support,
wherein
the energy generated by each one of said harvesting leaves is conducted to an external electric load.

21. A piezoelectric energy harvester with an active flapper, as in claim 14, wherein said harvester comprises a second harvester, identical to the first harvester, wherein the second harvester is placed opposite the first harvester, wherein the tips of the flapper portions of the two individual harvesters are disposed close to each other, and the two base portions of the two individual harvesters are disposed farthest from each other, and wherein the harvester further comprises an additional actuator, attached to the tips of the two opposing flapper portions of the two individual harvesters, and wherein the additional actuator is capable of imparting a twisting movement to the two flapper portions of the two individual harvesters, so that certain torsion stresses will be induced in the piezoelectric sheet of both individual harvesters, thus the two individual harvesters can generate electric power.

* * * * *